(12) United States Patent
Ding et al.

(10) Patent No.: US 12,315,856 B2
(45) Date of Patent: May 27, 2025

(54) LIGHT-EMITTING PANEL AND DISPLAY DEVICE

(71) Applicants: Chengdu Tianma Micro-Electronics Co., Ltd., Chengdu (CN); Shanghai Tianma Micro-Electronics Co., Ltd., Shanghai (CN)

(72) Inventors: Yimiao Ding, Shanghai (CN); Yang Nan, Shanghai (CN); Xuefei Qin, Shanghai (CN); Lihua Wang, Shanghai (CN)

(73) Assignees: Chengdu Tianma Micro-Electronics Co., Ltd., Chengdu (CN); Shanghai Tianma Micro-Electronics Co., Ltd., Shanghai (CN)

( * ) Notice: Subject to any disclaimer, the term of this patent is extended or adjusted under 35 U.S.C. 154(b) by 637 days.

(21) Appl. No.: 17/704,991

(22) Filed: Mar. 25, 2022

(65) Prior Publication Data

US 2023/0215850 A1 Jul. 6, 2023

(30) Foreign Application Priority Data

Dec. 31, 2021 (CN) .......................... 202111664718.7

(51) Int. Cl.
*H01L 25/16* (2023.01)
*G09G 3/20* (2006.01)
*G09G 3/32* (2016.01)

(52) U.S. Cl.
CPC ......... *H01L 25/167* (2013.01); *G09G 3/2007* (2013.01); *G09G 3/32* (2013.01); *G09G 2300/0809* (2013.01); *G09G 2310/08* (2013.01); *G09G 2320/0233* (2013.01); *G09G 2320/066* (2013.01)

(58) Field of Classification Search
None
See application file for complete search history.

(56) References Cited

U.S. PATENT DOCUMENTS

| | | | |
|---|---|---|---|
| 2021/0118366 A1* | 4/2021 | Xuan | G09G 3/3266 |
| 2022/0199000 A1* | 6/2022 | Kao | G09G 3/32 |
| 2024/0248360 A1* | 7/2024 | Fan | G02F 1/136209 |

FOREIGN PATENT DOCUMENTS

| | | |
|---|---|---|
| CN | 101354510 A | 1/2009 |
| CN | 107203079 A | 9/2017 |
| CN | 211858095 U | 11/2020 |

* cited by examiner

*Primary Examiner* — Evren Seven
(74) *Attorney, Agent, or Firm* — Anova Law Group, PLLC

(57) ABSTRACT

A light-emitting panel and a display device are provided. The light-emitting panel includes a base substrate, and a plurality of driving transistors and a plurality of light-emitting elements. One driving transistor is electrically connected to at least one light-emitting element. The plurality of light-emitting elements are arranged in an array to form one or more light-emitting element rows along a first direction and to form one or more light-emitting element columns along a second direction. In a direction parallel to a plane of the base substrate, the first direction intersects the second direction. In the direction parallel to the plane of the base substrate, a quantity of driving transistors adjacent to one light-emitting element is A, where A<2 and A is an integer.

26 Claims, 39 Drawing Sheets

LIGHT-EMITTING PANEL AND DISPLAY DEVICE

CROSS-REFERENCE TO RELATED APPLICATION

This application claims the priority of Chinese patent application No. 202111664718.7, filed on Dec. 31, 2021, the entirety of which is incorporated herein by reference.

FIELD

The present disclosure generally relates to the field of display technology and, more particularly, relates to a light-emitting panel and a display device.

BACKGROUND

With the advent of the era of ultra-high-definition display, higher requirements for display quality and resolution have been put forward. Light-emitting diode (LED) display technology has better performance than liquid crystal display (LCD) technology and organic light-emitting diode (OLED) display technology. Therefore, Mini/Micro LED display is the most promising new display technology in the display field.

A plurality of light-emitting elements and signal lines connected to the light-emitting elements are often disposed in the Mini/Micro LED display device, and the light-emitting elements receive signals through the signal lines to perform the light-emitting display. The light-emitting element includes a switching device connected to the corresponding light-emitting element as a switch. By outputting different pulse width modulation (PWM) signals to signal line, the on-time period of the switching device is controlled to adjust the luminous brightness of each light-emitting element.

However, the conventional switching device, such as a MOS transistor, often has a large size and black color. After the panel is lit, the switching device will absorb and block the light emitted by the light-emitting element, thereby causing low brightness in a local region and a lamp shadow problem, and affecting the light-emitting effect.

Therefore, how to provide a light-emitting panel and a display device that are capable of avoiding the lamp shadow problem caused by the low brightness in the local region, reducing the influence of the switching device on the light path, and improving the light-emitting effect is an urgent technical problem that needs to be solved.

SUMMARY

One aspect of the present disclosure provides a light-emitting panel. The light-emitting panel includes a base substrate, and a plurality of driving transistors and a plurality of light-emitting elements disposed over the base substrate. One driving transistor of the plurality of driving transistors is electrically connected to at least one light-emitting element of the plurality of light-emitting elements. The plurality of light-emitting elements are arranged in an array over the base substrate. The plurality of light-emitting elements are arranged to form one or more light-emitting element rows along a first direction and to form one or more light-emitting element columns along a second direction. In a direction parallel to a plane of the base substrate, the first direction intersects the second direction. In the direction parallel to the plane of the base substrate, a quantity of driving transistors adjacent to one light-emitting element is A, where A<2 and A is an integer.

Another aspect of the present disclosure provides a display device. The display device includes a light-emitting panel. The light-emitting panel includes a base substrate, and a plurality of driving transistors and a plurality of light-emitting elements disposed over the base substrate. One driving transistor of the plurality of driving transistors is electrically connected to at least one light-emitting element of the plurality of light-emitting elements. The plurality of light-emitting elements are arranged in an array over the base substrate. The plurality of light-emitting elements are arranged to form one or more light-emitting element rows along a first direction and to form one or more light-emitting element columns along a second direction. In a direction parallel to a plane of the base substrate, the first direction intersects the second direction. In the direction parallel to the plane of the base substrate, a quantity of driving transistors adjacent to one light-emitting element is A, where A<2 and A is an integer.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
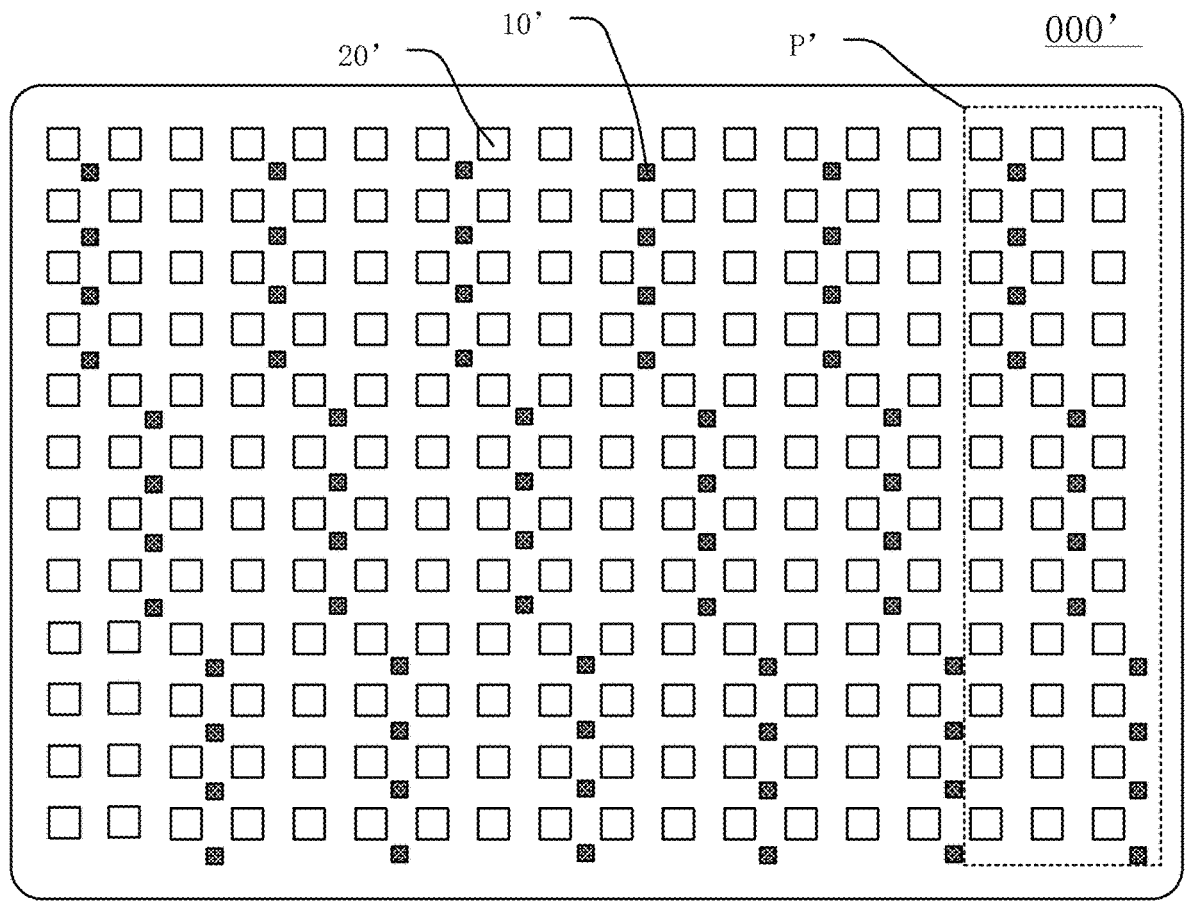
FIG. 1 illustrates a schematic plane view of a light-emitting panel.
Figure 2:
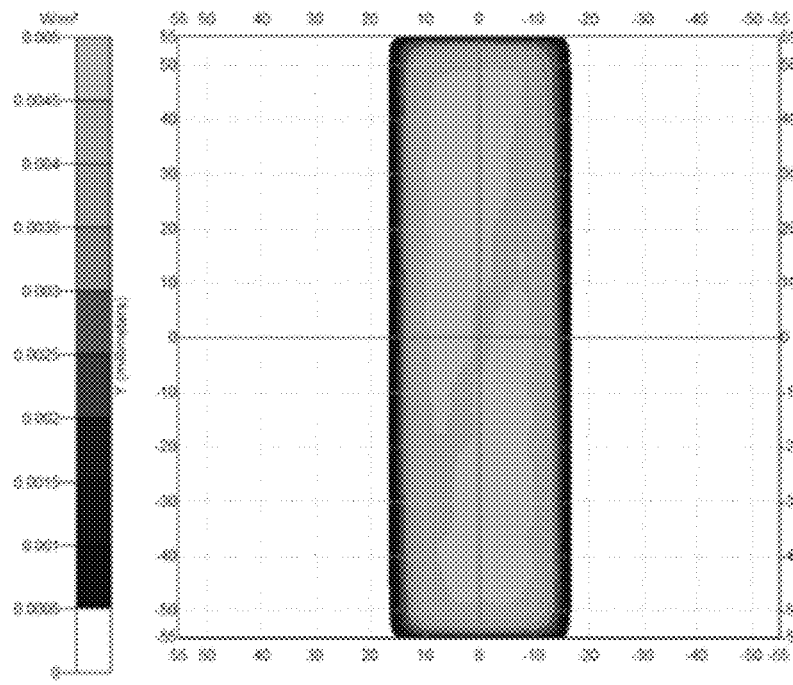
FIG. 2 illustrates a schematic diagram of an optical simulation structure after a P' region in FIG. 1 is lit.

FIG. 1 illustrates a schematic plane view of a light-emitting panel; and FIG. 2 illustrates a schematic diagram of an optical simulation structure after a P region in FIG. 1 is lit. Referring to FIG. 1, a light-emitting panel 000' often includes a plurality of light-emitting elements 20' and signal lines (not shown in FIG. 1) connected to the light-emitting elements 20'. The light-emitting elements 20' receive signals through corresponding signal lines and perform light-emitting display. The light-emitting element 20' includes a switching device 10' connected to the corresponding light-emitting element 20' as a switch. After the switching device 10' is turned on, by outputting different pulse width modulation signals to the signal line, the on-time period of the switching device 10' is controlled to adjust the luminous brightness of the corresponding light-emitting element 20'. FIG. 1 merely illustrates the arrangement structure of the light-emitting elements 20' and the switching devices 10' in the panel, and does not represent the electrical connection relationship. However, most of the conventional switching devices 10' have a large size and black color. If the arrangement structure in FIG. 1 is adopted, a quantity of switching devices 10' around the light-emitting element 20' is substantially large. After the panel is lit, the switching devices 10' will absorb and block the light emitted by the light-emitting element 20', thereby causing a low brightness in a local region. Referring to FIG. 2, a portion of the P' region of the panel has low brightness, thereby causing a lamp shadow problem and affecting the light-emitting effect.

Figure 3:
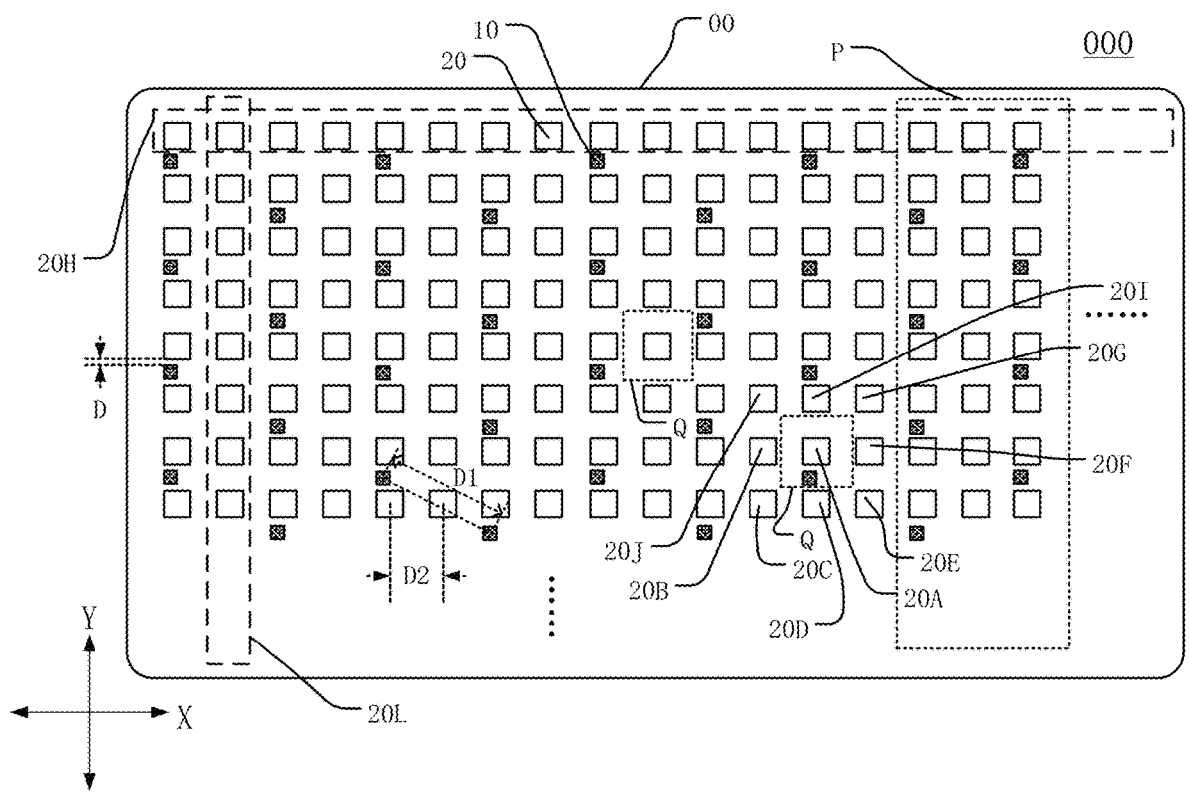
FIG. 3 illustrates a schematic plane view of an exemplary light-emitting panel consistent with disclosed embodiments of the present disclosure.
Figure 4:
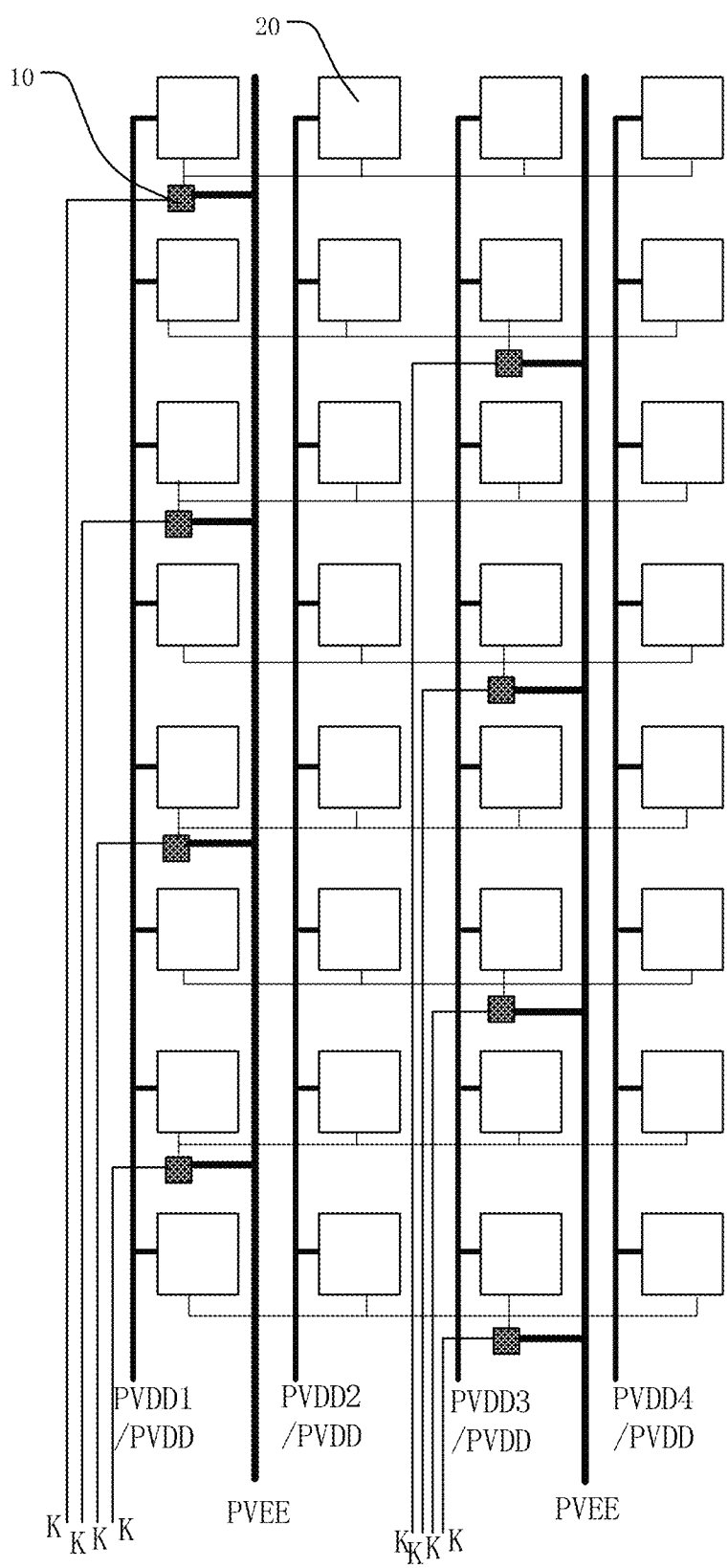
FIG. 4 illustrates a schematic diagram of an electrical connection between light-emitting elements and driving transistors in a local region of an exemplary light-emitting panel in FIG. 3 consistent with disclosed embodiments of the present disclosure.
Figure 5:
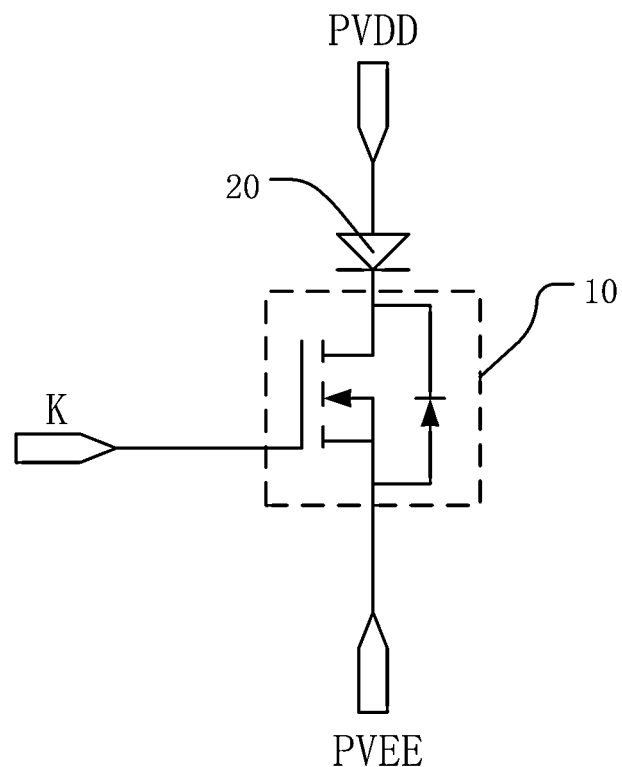
FIG. 5 illustrates a schematic diagram of an equivalent circuit connection between the driving transistor and the light-emitting element in FIG. 4 consistent with disclosed embodiments of the present disclosure.

The present disclosure provides a light-emitting panel and a display device. FIG. 3 illustrates a schematic plane view of a light-emitting panel consistent with disclosed embodiments of the present disclosure; FIG. 4 illustrates a schematic diagram of an electrical connection between light-emitting elements and driving transistors in a local region of the light-emitting panel in FIG. 3; and FIG. 5 illustrates a schematic diagram of an equivalent circuit connection between the driving transistors and the light-emitting elements in FIG. 4. FIG. 3 may merely illustrate the arrangement structure of the light-emitting elements and the driving transistors in the light-emitting panel, and may not represent the electrical connection relationship. A light-emitting panel 000 may include a base substrate 00, and a plurality of driving transistors 10 and a plurality of light-emitting elements 20 (not filled in the Figure) disposed on the base substrate 00. A driving transistor 10 may be electrically connected to at least one light-emitting element 20.

The plurality of light-emitting elements 20 may be arranged in an array on the base substrate 00. The plurality of light-emitting elements 20 may be arranged to form one or more light-emitting element rows 20H along a first direction X, and to form one or more light-emitting element columns 20L along a second direction Y. In a direction parallel to the plane of the base substrate 00, the first direction X may intersect the second direction Y. In one embodiment, in the direction parallel to the plane of the base substrate 00, the first direction X and the second direction Y may be perpendicular to each other as an example.

In the direction parallel to the plane of the base substrate 00, a quantity of the driving transistors 10 adjacent to one light-emitting element 20 is A, where A<2, and A may be an integer.

In one embodiment, the light-emitting panel 000 in the present disclosure may include a sub-millimeter light-emitting diode (Mini LED) light-emitting panel or a micro light-emitting diode (Micro LED) light-emitting panel. The light-emitting panel 000 may include the base substrate 00, and the plurality of driving transistors 10 and the plurality of light-emitting elements 20 disposed on the base substrate 00. The light-emitting element 20 may include one of Micro LED and Mini LED. One driving transistor 10 may be electrically connected to at least one light-emitting element 20. An array with high-density micro-sized light-emitting elements 20 as display pixels may be integrated on the base substrate 00 to realize image display. In one embodiment, each display pixel may be addressed and individually driven to be lit. In the light-emitting panel 000, the pixel distance may be reduced from millimeter to micrometer, and the light-emitting panel 000 may be a type of self-luminous display, and may be featured with advantages such as desired material stability, substantially long service life, and no image burn-in.

In one embodiment, the light-emitting panel 000 may further include the driving transistor 10. The driving transistor 10 may be used as a switch element to control the turn-on and turn-off of the light-emitting element 20. Referring to FIG. 5, a gate of the driving transistor 10 may be electrically connected to a driving signal line K. The driving signal line K may provide a pulse width modulation (PWM) driving signal for the gate of each driving transistor 10. In other words, the driving signal line K may provide the PWM signal through a driving chip (not shown in the Figure). The different gray scale of the light-emitting element 20 may be achieved by adjusting the different pulse width (duty cycle) of the PWM driving signal inputted by the driving chip. The larger the duty cycle, the greater the brightness.

It should be understood that in one embodiment, the light-emitting panel 000 may include a plurality of light-emitting units, and each light-emitting unit may include one driving transistor 10 and at least one light-emitting element 20. In another embodiment, each light-emitting unit may include one driving transistor 10 and multiple light-emitting elements 20. The gate of the driving transistor 10 in each light-emitting unit may be electrically connected to one driving signal line K. In other words, each light-emitting unit may independently lead out one driving signal line K, and each driving signal line K may independently input a driving signal to the gate of the driving transistor 10 for controlling the brightness of the multiple light-emitting elements 20 in the light-emitting unit.

Referring to FIG. 4 and FIG. 5, the light-emitting panel 000 may further include a plurality of other signal lines, such as a first voltage signal line PVDD and a second voltage signal line PVEE. A first electrode of the driving transistor 10 may be electrically connected to the negative electrode of the light-emitting element 20, a second electrode of the driving transistor 10 may be electrically connected to the second voltage signal line PVEE, and the positive electrode of the light-emitting element 20 may be electrically connected to the first voltage signal line PVDD. The first voltage signal line PVDD may be configured to input the PVDD voltage signal for the light-emitting panel, and the second voltage signal line PVEE may be configured to input the PVEE voltage signal for the light-emitting panel. The PVDD voltage signal and the PVEE voltage signal may be provided by an external power supply. The brightness (gray scale) of the light-emitting element 20 may be controlled by the length of the power-on period of the light-emitting element 20.

In one embodiment, an input voltage of the second voltage signal line PVEE may be a fixed voltage. Optionally, the input voltage of the second voltage signal line PVEE may be zero, and an input voltage of the first voltage signal line PVDD may be greater than or equal to a threshold voltage of the light-emitting element 20. In the light-emitting element 20 driven by the PWM signal, because the value of the PVDD voltage signal is dependent on the threshold voltage of the light-emitting element 20, the input voltage of the first voltage signal line PVDD may need to be greater than or equal to the threshold voltage of the light-emitting element 20, and the value of the PVEE voltage signal may often be zero, thus the input voltage of the second voltage signal line PVEE may be zero.

Figure 6:
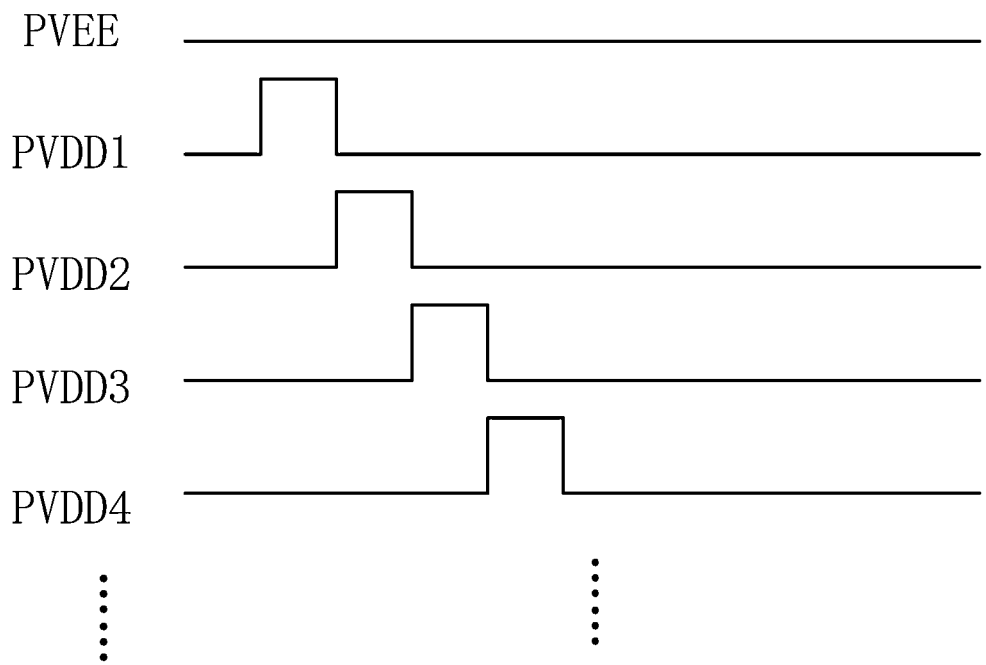
FIG. 6 illustrates a driving timing diagram of the light-emitting panel in FIG. 4 consistent with disclosed embodiments of the present disclosure.

FIG. 6 illustrates a driving timing diagram of the light-emitting panel in FIG. 4. In one embodiment, referring to FIG. 4 and FIG. 6, each of the PVDD voltage signal and the PVEE voltage signal may be a constant voltage. During the driving process, each first voltage signal line PVDD may input voltage in a time-sharing mode, as shown in FIG. 6. In another embodiment, each first voltage signal line PVDD may be simultaneously inputted with a PVDD voltage signal (not shown in the Figure), and each second voltage signal line PVEE of the light-emitting panel 000 may be simultaneously inputted with a PVEE voltage signal. The way of inputting the PVDD voltage signal may not be limited by the present disclosure, and may be determined according to practical applications.

In one embodiment, the different grayscale of the light-emitting element 20 may be realized by adjusting the different pulse width (duty cycle) of the PWM driving signal inputted by the driving chip. The larger the duty cycle, the greater the brightness. Each driving transistor 10 may be individually controlled without scanning driving control, such that the control may be simple and flexible, and may have desired dynamic response, which may facilitate to improve contrast.

In one embodiment, the quantity of driving transistors 10 adjacent to one light-emitting element 20 in the direction parallel to the plane of the base substrate 00 may be A, where A<2. The position range adjacent to one light-emitting element 20 may refer to a region including the position of the light-emitting element 20 and a region from a boundary of the light-emitting element 20 to the nearest boundary of any another light-emitting element 20 adjacent to the light-emitting element 20.

Referring to FIG. 3, other multiple light-emitting elements 20 adjacent to a light-emitting element 20A may include a light-emitting element 20B, a light-emitting element 20C, a light-emitting element 20D, a light-emitting element 20E, a light-emitting element 20F, a light-emitting element 20G, a light-emitting element 201, and a light-emitting element 20J, respectively. Referring to FIG. 3, a position range including the position of the light-emitting element 20A and from the boundary of the light-emitting element 20A to the nearest boundary of any light-emitting element 20 adjacent to the light-emitting element 20A may be marked as a region Q. In the range of the region Q, the quantity of driving transistors 10 may be less than two. In other words, the quantity of the driving transistors 10 in the region Q may be zero or one, such that the arrangement structure of the driving transistors 10 on the light-emitting panel may satisfy that the quantity of driving transistors 10 adjacent to one light-emitting element 20 may be less than two. It should be understood that the position range adjacent to one light-emitting element 20 shown in FIG. 3 may be merely a schematic diagram, which may not be limited by the present disclosure.

In one embodiment, the driving transistors 10 may be dispersedly arranged on the base substrate 00 of the light-emitting panel 000. By improving the relative position of the driving transistor 10 and the light-emitting element 20, the driving transistors 10 may be prevented from being clustered in a local region. While avoiding the existence of multiple driving transistors 10 around one light-emitting element 20 to block light, the driving transistor 10 on the base substrate 00 may absorb light substantially uniformly, which may reduce the influence of the driving transistor 10 on the light path of the light-emitting element 20. Further, the quantity of driving transistors 10 around the light-emitting element 20 in a certain region may be prevented from being substantially large, and the phenomenon of serious light absorption in the certain region when the panel is lit may be prevented, which may prevent the lamp shadow problem caused by the low brightness in a local region of the light-emitting panel 000, and may facilitate to improve the light-emitting uniformity of the light-emitting panel and to improve the light-emitting quality.

By improving the relative position of the driving transistor 10 and the light-emitting element 20, the driving transistors 10 may be prevented from being clustered in a local region, and the quantity of driving signal lines K connected to the driving transistors 10 arranged in the same local region may also be prevented from being too large, thereby reducing the risk of short circuit and corrosion between different driving signal lines K, which may facilitate to ensure product yields.

Figure 7:
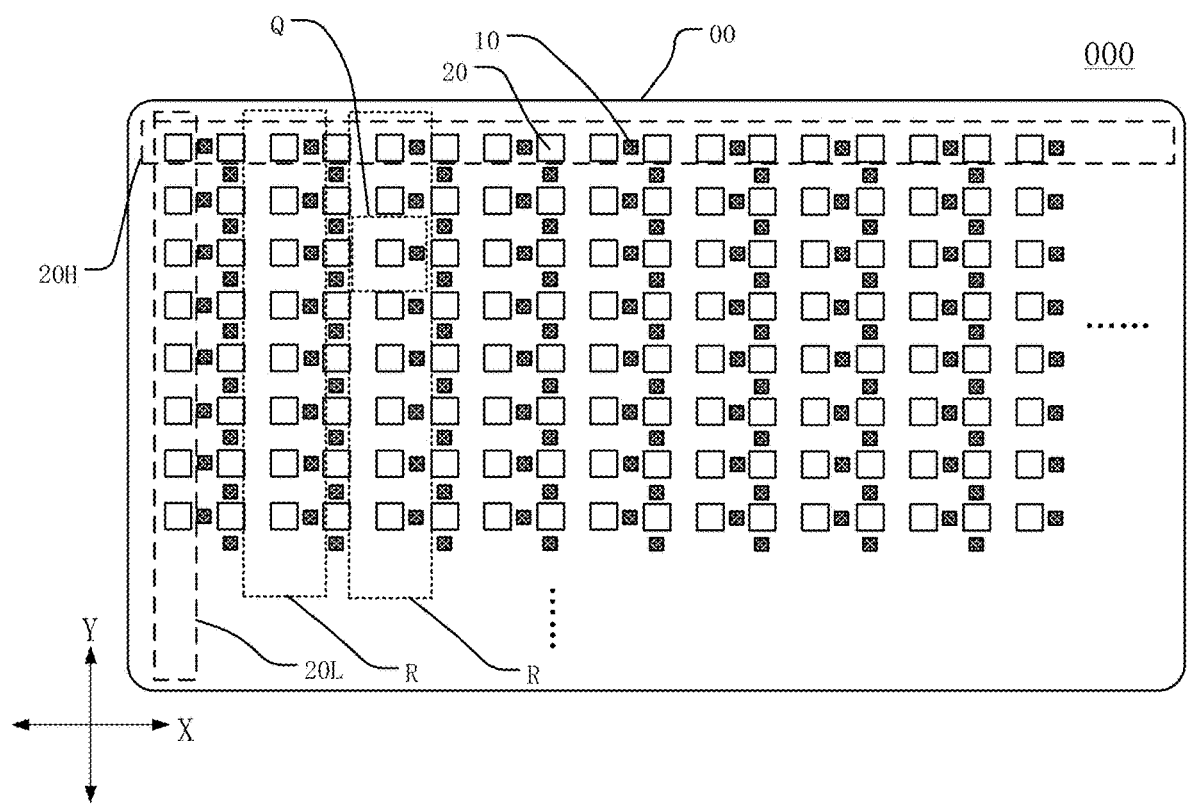
FIG. 7 illustrates a schematic plane view of another exemplary light-emitting panel consistent with disclosed embodiments of the present disclosure.

It should be understood that FIG. 3 illustrates an arrangement method in which when the quantity of driving transistors 10 in the light-emitting panel is smaller than the quantity of light-emitting elements 20, in the direction parallel to the plane of the base substrate 00, the quantity of driving transistors 10 adjacent to one light-emitting element 20 may be less than two. FIG. 7 illustrates a schematic plane view of another light-emitting panel consistent with disclosed embodiments of the present disclosure. FIG. 7 may merely illustrate the arrangement structure of the light-emitting elements and the driving transistors in the light-emitting panel, and may not represent the electrical connection relationship. In one embodiment, referring to FIG. 7, one light-emitting element 20 may correspond to one driving transistor 10. In other words, in some light-emitting panels, when the quantity of light-emitting elements 20 is the same as the quantity of driving transistors 10, in the direction parallel to the plane of the base substrate 00, the quantity of driving transistors 10 adjacent to one light-emitting element 20 may be less than two. In view of this, the quantity of the driving transistors 10 adjacent to the light-emitting element 20 in certain position of the light-emitting panel 000 may be less than two, as shown in the range indicated by the region R in FIG. 7. The quantity of driving transistors 10 adjacent to one light-emitting element 20 may be one, which may satisfy the requirement that the quantity of driving transistors 10 adjacent to one light-emitting element 20 in the region R is less than two, thereby improving the lamp shadow problem in the range of the region R. In other words, the lamp shadow problem occurred in the local region of the light-emitting panel 000 may be prevented. In one embodiment, in the light-emitting panel, the quantity of driving transistors 10 adjacent to one light-emitting element 20 in the local region may be less than two, or the quantity of driving transistors 10 adjacent to one light-emitting element 20 in the entire region may be less than two, which may be determined according to practical applications.

Figure 8:
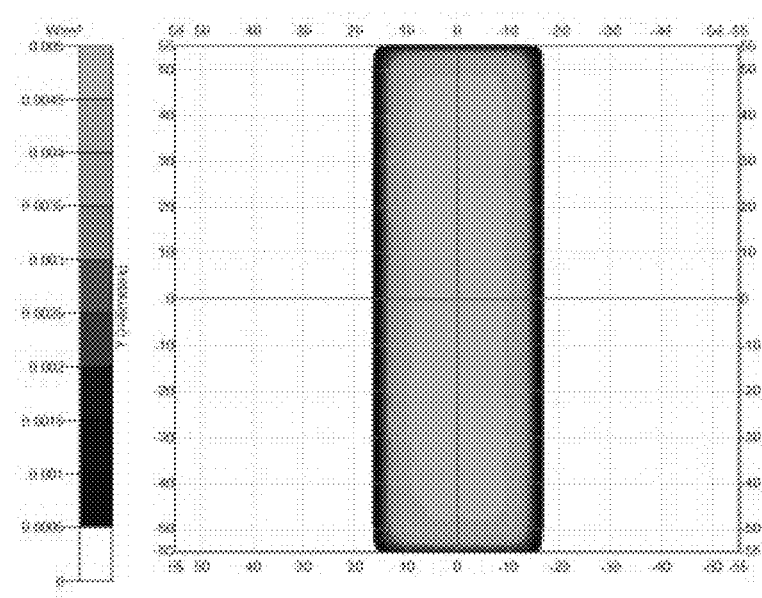
FIG. 8 illustrates a schematic diagram of an optical simulation structure after a P region in FIG. 3 is lit consistent with disclosed embodiments of the present disclosure.

FIG. 8 illustrates a schematic diagram of an optical simulation structure after a P region in FIG. 3 is lit. Referring to FIG. 2 and FIG. 8, in the direction parallel to the plane of the base substrate 00, the quantity of driving transistors 10 adjacent to one light-emitting element 20 may be less than two, the brightness uniformity may be desired, the lamp shadow problem may be effectively prevented, and the light-emitting effect may be improved.

It should be understood that FIG. 3 illustrates an arrangement method in which in the direction parallel to the plane of the base substrate 00, the quantity of driving transistors 10 adjacent to one light-emitting element 20 may be less than two. In specific implementation, the arrangement method may also include any other arrangement manner that is capable of preventing the lamp shadow problem, which may not be limited by the present disclosure.

It should be understood that the present disclosure may merely illustrate a wiring method of the plurality of first voltage signal lines PVDD, the plurality of second voltage signal lines PVEE, and the plurality of driving signal lines K on the light-emitting panel 000. In one embodiment, referring to FIG. 4, the plurality of first voltage signal lines PVDD and the plurality of second voltage signal lines PVEE may be extended along a same direction. A plurality of conductive pads may be disposed in a bonding region of the light-emitting panel. The bonding region may be a region configured to be electrically connected and bonded with an external driving chip or a flexible circuit board. Each first voltage signal line PVDD may be electrically connected to one conductive pad, or multiple first voltage signal lines PVDD may be electrically connected to one conductive pad in the binding region after being connected to each other through a jumper wire, to achieve the transmission of the PVDD voltage signal. The plurality of second voltage signal lines PVEE in the light-emitting panel may be connected to one conductive pad in the binding region after being connected to each other through a jumper wire, to achieve the transmission of the PVEE voltage signal.

In one embodiment, an extension direction of the driving signal line K may be the same as or different from the extension direction of the first voltage signal line PVDD and the second voltage signal line PVEE. The plurality of driving signal lines K may be connected to different conductive pads in the binding region, and may be configured to provide driving signals for the driving transistors 10. In specific implementation, the wiring method of various signal lines on the light-emitting panel may include but may not be limited to the method shown in FIG. 4. As long as the gate of the driving transistor 10 is connected to the driving signal line K, the first electrode of the driving transistor 10 is electrically connected to the negative electrode of the light-emitting element 20, the second electrode of the driving transistor 10 is electrically connected to the second voltage signal line PVEE, and the positive electrode of the light-emitting element 20 is electrically connected to the first voltage signal line PVDD, the wiring method may not be repeated herein.

In one embodiment, the driving transistor 10 may be a thin-film transistor, and the thin-film transistor may include the dual characteristics of "active" as a transistor and "thin" as a "thin film". The thin-film transistor is one of the types of field-effect transistors. The thin-film transistor may often be formed by depositing various thin films, such as a semiconductor active layer, a dielectric layer and a metal electrode layer, on the substrate. The thin-film transistor may greatly affect the operating performance of the display device.

In one embodiment, the driving transistor 10 may include a metal-oxide-semiconductor field-effect transistor. The metal-oxide-semiconductor field-effect transistor (MOSFET) may be a type of field effect transistors that are widely applied in analog circuit and digital circuit. The MOSFET may be divided into N-channel type with electrons being the majority carriers and P-channel type with holes being the majority carriers according to the polarity of the channel, which may often be referred to N-type metal-oxide-semiconductor field-effect transistor (NMOSFET) and P-type metal-oxide-semiconductor field-effect transistor (PMOSFET), respectively. In the present disclosure, whether the driving transistor 10 is an N-channel type or a P-channel type may not be limited. The driving transistor 10 may be used as a switch element, and the metal-oxide-semiconductor field-effect transistor may be a voltage-controlled device, which may facilitate to save power consumption.

It should be noted that the drawings in the present disclosure may merely illustrate the structure of the light-emitting panel. In specific implementation, the structure of the light-emitting panel may include but may not be limited to such structure, and may further include any other structure that is capable of realizing the display function. The structure of the light-emitting panel may refer to the structure of the Mini LED or Micro LED light-emitting panel in the related art for understanding, which may not be repeated herein.

It should be further noted that the shape and size of the light-emitting element 20 and the driving transistor 10 in the Figures of the present disclosure may merely be used for illustration. In specific implementation, the actual size of the driving transistor 10 may be larger than the actual size of the light-emitting element 20, the actual size of the driving transistor 10 may be equal to the actual size of the light-emitting element 20, or the actual size of the driving transistor 10 may be smaller than the actual size of the light-emitting element 20. The shape of the light-emitting element 20 may be the same as or different from the shape of the driving transistor 10, or the light-emitting element 20 and the driving transistor 10 may have any other shape, which may not be limited by the present disclosure.

In one embodiment, the light-emitting panel 000 may be directly used as a display panel, thereby facilitating to improve display uniformity and display effect. In another embodiment, the light-emitting panel in the present disclosure may be used as a backlight of the liquid crystal display panel, which may facilitate to improve the light-emitting uniformity of the light-emitting panel by preventing the lamp shadow problem, thereby providing a uniform backlight for the liquid crystal display panel and improving the display effect. The application of the light-emitting panel 000 may not be limited by the present disclosure, and may be determined according to practical applications.

In certain embodiments, referring to FIG. 3 and FIG. 4, in a direction parallel to the plane of the base substrate, the driving transistor 10 may be located between adjacent two light-emitting elements 20.

In the present disclosure, in the direction parallel to the plane of the base substrate 00, the quantity of driving transistors 10 adjacent to one light-emitting element 20 may be less than two. In other words, when the quantity of driving transistors 10 adjacent to one light-emitting element 20 is one, the one driving transistor 10 may be located between adjacent two light-emitting elements 20 in the direction parallel to the plane of the base substrate, to achieve a short length of the electrical connection line between the driving transistor 10 and the light-emitting element 20 closest to driving transistor 10, which may facilitate to reduce the impedance of the electrical connection line and improve the transmission performance.

Figure 9:
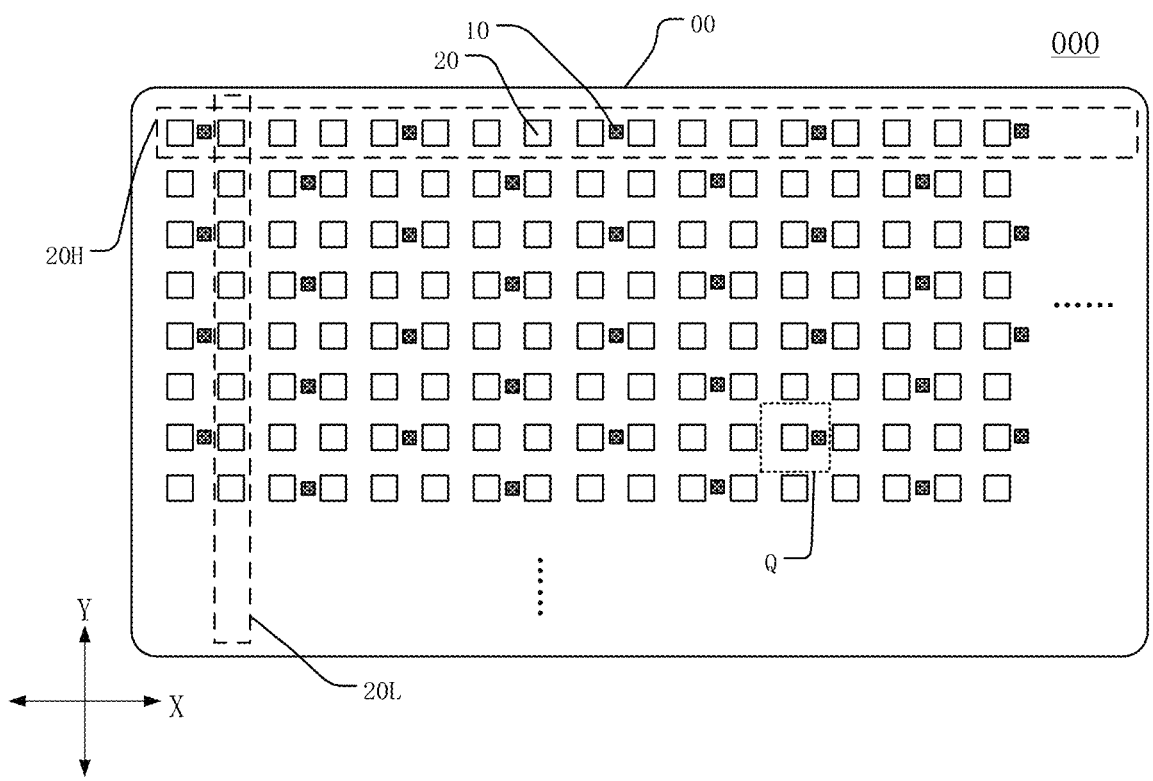
FIG. 9 illustrates a schematic plane view of another exemplary light-emitting panel consistent with disclosed embodiments of the present disclosure.

FIG. 9 illustrates a schematic plane view of another light-emitting panel consistent with disclosed embodiments of the present disclosure. FIG. 9 may merely illustrate the arrangement of the light-emitting elements and the driving transistors in the light-emitting panel, and may not represent the electrical connection relationship. In one embodiment, referring to FIG. 3 and FIG. 9, in the direction parallel to the plane of the base substrate, the driving transistor 10 may be located between adjacent two light-emitting elements 20 in the light-emitting element row 20H (as shown in FIG. 9). In another embodiment, the driving transistor 10 may be located between adjacent two light-emitting elements 20 in the light-emitting element column 20L (as shown in FIG. 3).

The present disclosure may explain that when the quantity of driving transistors 10 adjacent to one light-emitting element 20 is one, the one driving transistor 10 may be located between adjacent two light-emitting elements 20 in the direction parallel to the plane of the base substrate. In one embodiment, referring to FIG. 9, the driving transistor 10 may be located between adjacent two light-emitting elements 20 in the light-emitting element row 20H. In another embodiment, referring to FIG. 3, the driving transistor 10 may be located between adjacent two light-emitting elements 20 in the light-emitting element column 20L. Therefore, the length of the electrical connection line between the driving transistor 10 and the light-emitting element 20 closest to driving transistor 10 may be substantially short, which may facilitate to reduce the impedance of the electrical connection line and improve the transmission performance.

Figure 10:
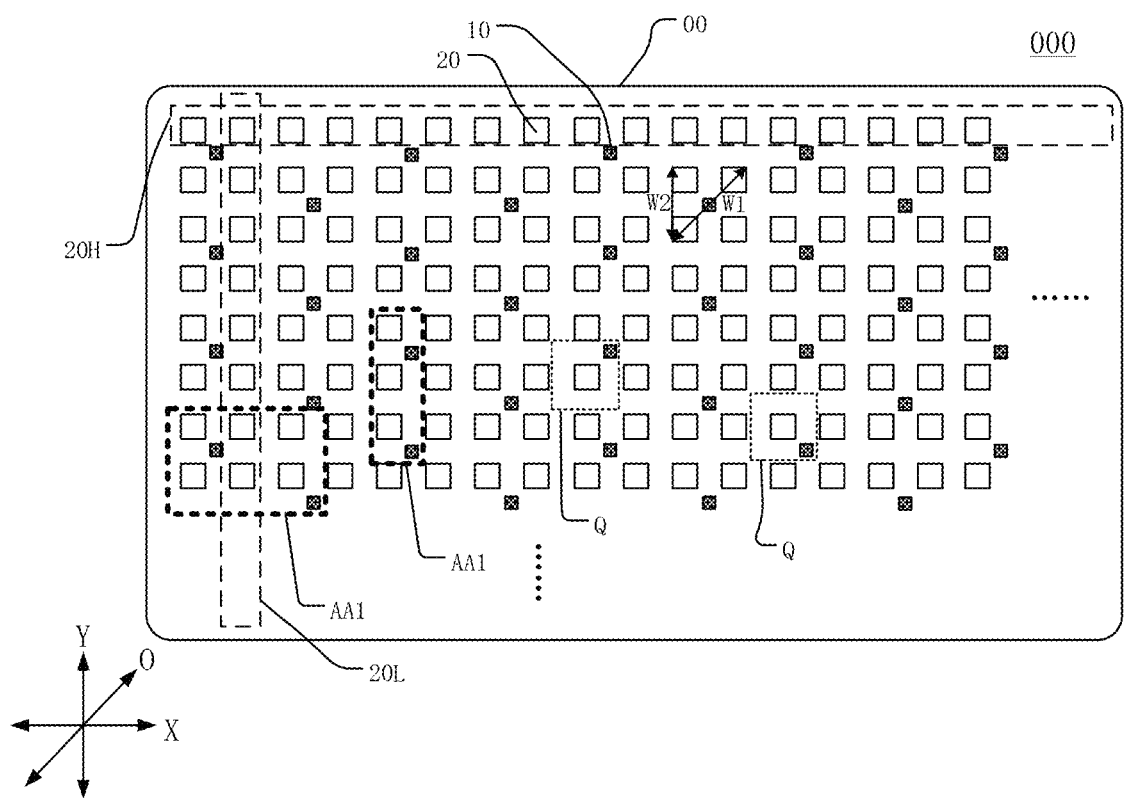
FIG. 10 illustrates a schematic plane view of another exemplary light-emitting panel consistent with disclosed embodiments of the present disclosure.

FIG. 10 illustrates a schematic plane view of another light-emitting panel consistent with disclosed embodiments of the present disclosure. In one embodiment, referring to FIG. 10, along a third direction O, the driving transistor 10 may be located between adjacent two light-emitting elements 20. Further, in the direction parallel to the plane of the base substrate 00, an angle between the third direction O and the first direction X may be an acute angle, and an angle between the third direction O and the second direction Y may be an acute angle.

The present disclosure may explain that in the direction parallel to the plane of the base substrate 00, the quantity of driving transistors 10 adjacent to one light-emitting element 20 may be less than two. In other words, the quantity of driving transistors 10 adjacent to one light-emitting element 20 may be one. In the third direction O, the one driving transistor 10 may be located between adjacent two light-emitting elements 20. In other words, referring to FIG. 10, one driving transistor 10 may be located in a middle of the quadrangular space formed by the four light-emitting elements 20, which may facilitate to improve the light-emitting effect and may provide space between adjacent two light-emitting elements 20 in each of the light-emitting element row 20H and the light-emitting element column 20L, to avoid blocking light. Because the distance W1 between the adjacent two light-emitting elements 20 in the third direction O is greater than the distance W2 between the adjacent two light-emitting elements 20 in the light-emitting element row 20H, and the distance between the adjacent two light-emitting elements 20 in the third direction O is greater than the distance between adjacent two light-emitting elements 20 in the light-emitting element column 20L, even if the one driving transistor 10 is disposed between adjacent two light-emitting elements 20 in the third direction O, due to the large distance, the influence on the light-shielding and light-absorbing of the light-emitting element 20 may be substantially small, which may facilitate to further improve the light-emitting effect.

Figure 11:
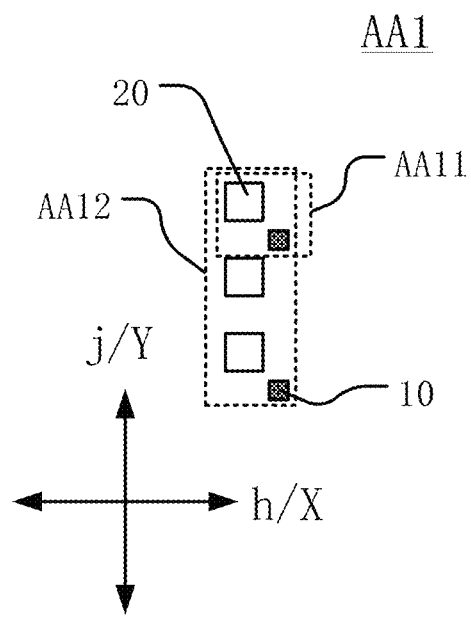
FIG. 11 illustrates a schematic plane view of a partition in an exemplary light-emitting panel in FIG. 10 consistent with disclosed embodiments of the present disclosure.
Figure 12:
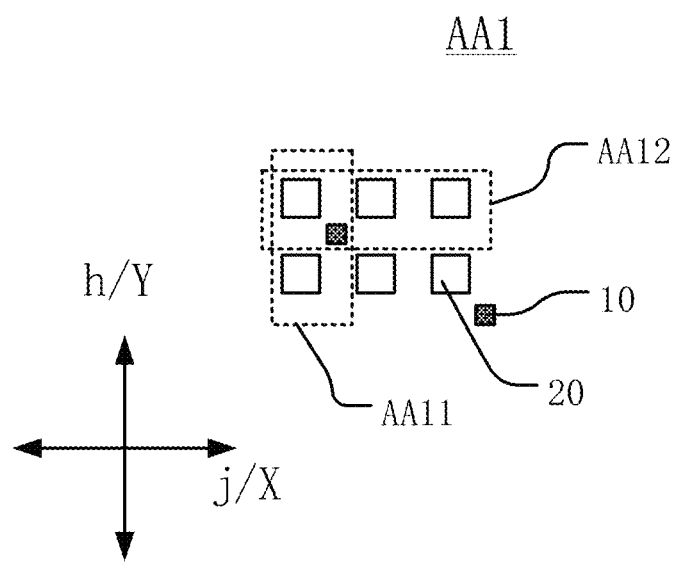
FIG. 12 illustrates a schematic plane view of another partition in an exemplary light-emitting panel in FIG. 10 consistent with disclosed embodiments of the present disclosure.

FIG. 11 illustrates a schematic plane view of a partition in the light-emitting panel in FIG. 10; and FIG. 12 illustrates a schematic plane view of another partition in the light-emitting panel in FIG. 10. FIG. 11 and FIG. 12 may merely illustrate the arrangement structure of the light-emitting elements and the driving transistors in a partition of the light-emitting panel, and may not represent the electrical connection relationship. In certain embodiments, referring to FIGS. 3-6 and FIGS. 10-12, the light-emitting panel 000 may include at least one partition AA1.

In the partition AA1, the light-emitting elements 20 may be arranged along a fourth direction h to form a first sub-partition AA11, and the light-emitting elements 20 may be arranged along a fifth direction j to form a second sub-partition AA12. In one embodiment, the fourth direction h may be the same as the first direction X, and the fifth direction j may be the same as the second direction Y. In another embodiment, the fourth direction h may be the same as the second direction Y, and the fifth direction j may be the same as the first direction X.

In the partition AA1, the quantity of light-emitting elements 20 may be greater than or equal to 3B, and the quantity of driving transistors 10 may be two, where 1≤B≤4.

In one embodiment, in the light-emitting panel 000, in the direction parallel to the plane of the base substrate 00, the quantity of driving transistors 10 adjacent to one light-emitting element 20 may be less than two. In other words, the quantity of driving transistors 10 adjacent to one light-emitting element 20 may be one or zero. In any partition AA1 of the light-emitting panel 000, the light-emitting elements 20 may be arranged along the fourth direction h to form the first sub-partition AA11, and the light-emitting elements 20 may be arranged along the fifth direction j to form the second sub-partition AA12.

If there is only one light-emitting element 20 in the fourth direction h in the partition AA1, the region where the one light-emitting element 20 is located may form the first sub-partition AA11. If there are multiple light-emitting elements 20 in the fourth direction h in the partition AA1, the region where the multiple light-emitting elements 20 are located in the fourth direction h may form the first sub-partition AA11. If there is only one light-emitting element 20 in the fifth direction j in the partition AA1, the region where the one light-emitting element 20 is located may form the second sub-partition AA12. If there are multiple light-emitting elements 20 in the fifth direction j in the partition AA1, the region where the multiple light-emitting elements 20 are located in the fifth direction j may form the second sub-partition AA12.

In one embodiment, the light-emitting panel 000 in FIG. 10 may include one or more partitions AA1 in FIG. 11. Referring to FIG. 10 and FIG. 11, in the partition AA1, the light-emitting elements 20 may be arranged along the fourth direction h to form the first sub-partition AA11, and the light-emitting elements 20 may be arranged along the fifth direction j to form the second sub-partition AA12. In one embodiment, the fourth direction h may be the same as the first direction X, and the fifth direction j may be the same as the second direction Y.

In another embodiment, the light-emitting panel 000 in FIG. 10 may include one or more partitions AA1 in FIG. 12. Referring to FIG. 10 and FIG. 12, in the partition AA1, the light-emitting elements 20 may be arranged along the fourth direction h to form the first sub-partition AA11, and the light-emitting elements 20 may be arranged along the fifth direction j to form the second sub-partition AA12. In one embodiment, the fourth direction h may be the same as the second direction Y, and the fifth direction j may be the same as the first direction X.

It should be understood that the partition AA1 shown in each of FIG. 11 and FIG. 12 may be exemplified by an example where the quantity of light-emitting elements 20 in one partition AA1 may be equal to three or six. In certain embodiments, the light-emitting panel 000 may include one or more partitions AA1, and the quantity of light-emitting elements 20 may be greater than or equal to 3B, where 1≤B≤4 and B may be an integer. In such arrangement of the partition AA1, in the direction parallel to the plane of the base substrate 00, the quantity of driving transistors 10 adjacent to one light-emitting element 20 in the light-emitting panel 000 may be less than two, which may prevent the lamp shadow problem and improve the light-emitting effect.

Figure 13:
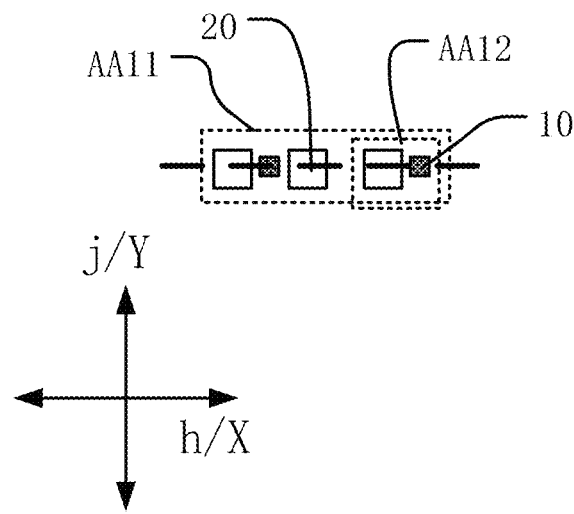
FIG. 13 illustrates a schematic plane view of an arrangement structure of a first partition in an exemplary light-emitting panel consistent with disclosed embodiments of the present disclosure.
Figure 14:
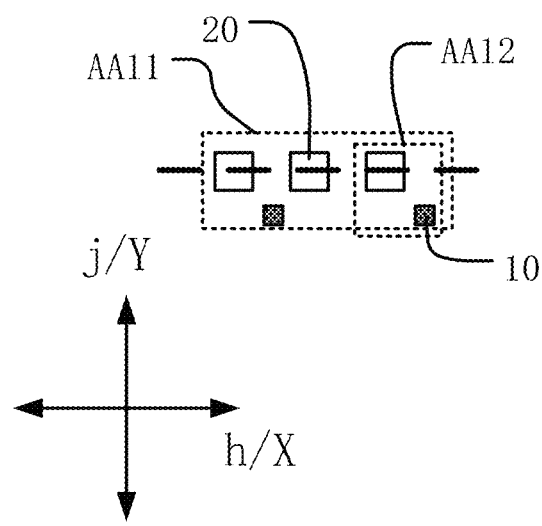
FIG. 14 illustrates a schematic plane view of another arrangement structure of a first partition in an exemplary light-emitting panel consistent with disclosed embodiments of the present disclosure.

FIG. 13 illustrates a schematic plane view of an arrangement structure of a first partition in the light-emitting panel consistent with disclosed embodiments of the present disclosure; and FIG. 14 illustrates a schematic plane view of another arrangement structure of a first partition in the light-emitting panel consistent with disclosed embodiments of the present disclosure. In one embodiment, referring to FIG. 13 and FIG. 14, the partition AA1 of the light-emitting panel 000 may include a first partition AA1a. The arrangement structure of the first partition AA1a may include three light-emitting elements 20 and two driving transistors 10. The three light-emitting elements 20 may be arranged along the fourth direction h to form a first sub-partition AA11. Along the fifth direction j, one light-emitting element 20 may form a second sub-partition AA12. Along the fifth direction j, the two driving transistors 10 may be located in the same first sub-partition AA11.

Along the fourth direction h, the two driving transistors 10 may be located in two non-adjacent second sub-partitions AA12, respectively. The two non-adjacent second sub-partitions AA12 may refer to that along the fourth direction h, any other second sub-partition AA12 may be located between the two non-adjacent second sub-partitions AA12, and the two non-adjacent second sub-partitions AA12 may be spaced apart by any other second sub-partition AA12.

The present disclosure may explain that the partition AA1 may include the arrangement structure of the first partition AA1a. In one partition AA1, in other words, in one first partition AA1a, the quantity of light-emitting elements 20 may be three, and the quantity of driving transistors 10 may be two. In one embodiment, referring to FIG. 13, in the first sub-partition AA11, one driving transistor 10 may be located between adjacent two light-emitting elements 20, and the driving transistor 10 may be located on the connection line of the three light-emitting elements 20 in the first sub-partition AA11. In view of this, the electrical connection line between the driving transistor 10 and the light-emitting element 20 may be set substantially short, to achieve electrical connection.

In another embodiment, referring to FIG. 14, one driving transistor 10 may be located between adjacent two light-emitting elements 20, and the driving transistor 10 may not be located on the connection line of the three light-emitting elements 20 in the first sub-partition AA11. In view of this, the driving transistor 10 may be prevented from blocking the light emitted from the three light-emitting elements 20 in the same first sub-partition AA11. In the present disclosure, the arrangement structure of the first partition AA1*a* in FIG. 13 and FIG. 14 may satisfy that the first partition AA1*a* may include two driving transistors 10, and when the light-emitting panel 000 includes the first partition AA1*a* with such arrangement structure, the quantity of driving transistors 10 adjacent to one light-emitting element 20 may be less than two, which may prevent the lamp shadow problem and improve the light-emitting effect.

It should be understood that in one embodiment, the fourth direction h of the first partition AA1*a* may be the same as the first direction X in the light-emitting panel 000, and the fifth direction j may be the same as the second direction Y in the light-emitting panel 000, as shown in FIG. 13 and FIG. 14. In another embodiment, the fourth direction h of the first partition AA1*a* may be the same as the second direction Y, and the fifth direction j of the first partition AA1*a* may be the same as the first direction X (not shown in the drawings). In specific implementation, the setting may be determined according to the layout requirements of the light-emitting panel, as long as the quantity of driving transistors 10 adjacent to one light-emitting element 20 is less than two, which may not be specifically limited by the present disclosure.

Figure 15:
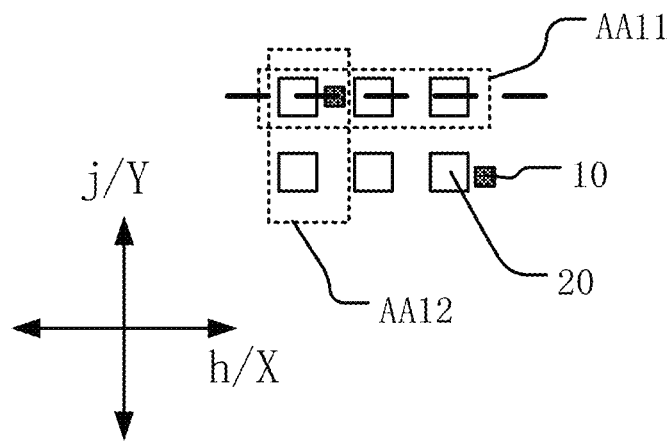
FIG. 15 illustrates a schematic plane view of an arrangement structure of a second partition in an exemplary light-emitting panel consistent with disclosed embodiments of the present disclosure.
Figure 16:
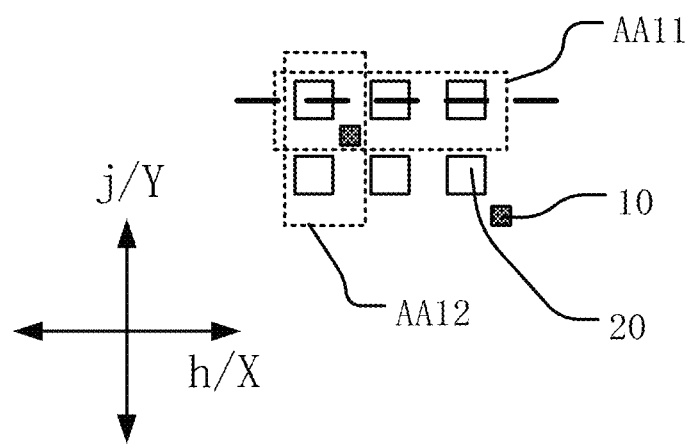
FIG. 16 illustrates a schematic plane view of another arrangement structure of a second partition in an exemplary light-emitting panel consistent with disclosed embodiments of the present disclosure.

FIG. 15 illustrates a schematic plane view of an arrangement structure of a second partition in a light-emitting panel consistent with disclosed embodiments of the present disclosure; and FIG. 16 illustrates a schematic plane view of another arrangement structure of a second partition in a light-emitting panel consistent with disclosed embodiments of the present disclosure. In one embodiment, referring to FIG. 15 and FIG. 16, the partition AA1 of the light-emitting panel 000 may include a second partition AA1*b*, and one second partition AA1*b* may include six light-emitting elements 20 and two driving transistors 10. Three light-emitting elements 20 may be arranged along the fourth direction h to form a first sub-partition AA11, and two light-emitting elements 20 may be arranged along the fifth direction j to form a second sub-partition AA12. Along the fifth direction j, the two driving transistors 10 may be located in two adjacent first sub-partitions AA11, respectively. Along the fourth direction h, the two driving transistors 10 may be located in two non-adjacent second sub-partitions AA12, respectively. The two non-adjacent second sub-partitions AA12 may refer to that along the fourth direction h, any other second sub-partition AA12 may be located between the two non-adjacent second sub-partitions AA12, and the two non-adjacent second sub-partitions AA12 may be spaced apart by any other second sub-partition AA12.

The present disclosure may explain that the partition AA1 may include the arrangement structure of the second partition AA1*b*. In one partition AA1, in other words, in one second partition AA1*b*, the quantity of light-emitting elements 20 may be six, and the quantity of driving transistors 10 may be two. In one embodiment, referring to FIG. 15, in the first sub-partition AA11, one driving transistor 10 may be located between adjacent two light-emitting elements 20, and the driving transistor 10 may be located on the connection line of the three light-emitting elements 20 in the first sub-partition AA11. In view of this, the electrical connection line between the driving transistor 10 and the light-emitting element 20 may be set substantially short, to achieve electrical connection.

In another embodiment, referring to FIG. 16, one driving transistor 10 may be located between adjacent two light-emitting elements 20, and the driving transistor 10 may not be located on the connection line of the three light-emitting elements 20 in the first sub-partition AA11. In view of this, the driving transistor 10 may be prevented from blocking the light emitted from the three light-emitting elements 20 in the same first sub-partition AA11. In the present disclosure, the arrangement structure of the second partition AA1*b* in FIG. 15 and FIG. 16 may satisfy that the second partition AA1*b* may include two driving transistors 10, and when the light-emitting panel 000 includes the second partition AA1*b* with such arrangement structure, the quantity of driving transistors 10 adjacent to one light-emitting element 20 may be less than two, which may prevent the lamp shadow problem and improve the light-emitting effect.

It should be understood that in one embodiment, the fourth direction h of the second partition AA1*b* may be the same as the first direction X in the light-emitting panel 000, and the fifth direction j may be the same as the second direction Y in the light-emitting panel 000, as shown in FIG. 15 and FIG. 16. In another embodiment, the fourth direction h of the second partition AA1*b* may be the same as the second direction Y, and the fifth direction j of the second partition AA1*b* may be the same as the first direction X (not shown in the drawings). In specific implementation, the setting may be determined according to the layout requirements of the light-emitting panel, as long as the quantity of driving transistors 10 adjacent to one light-emitting element 20 is less than two, which may not be specifically limited by the present disclosure.

Figure 17:
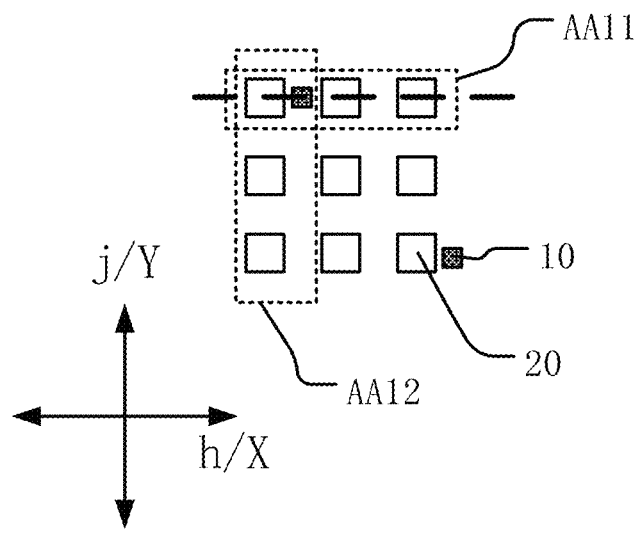
FIG. 17 illustrates a schematic plane view of an arrangement structure of a third partition in an exemplary light-emitting panel consistent with disclosed embodiments of the present disclosure.
Figure 18:
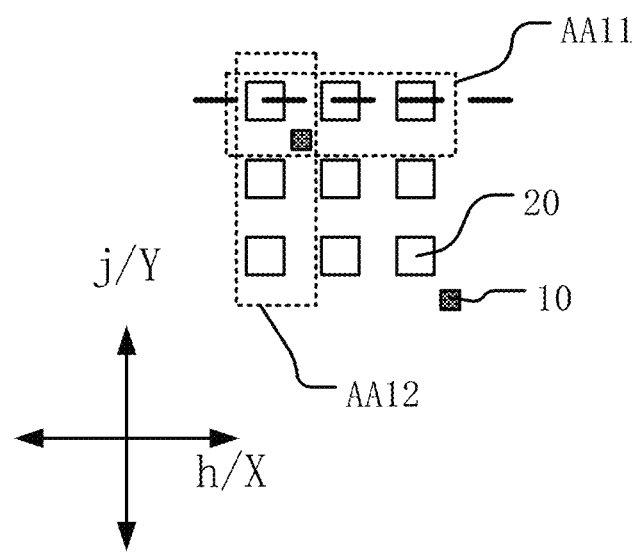
FIG. 18 illustrates a schematic plane view of another arrangement structure of a third partition in an exemplary light-emitting panel consistent with disclosed embodiments of the present disclosure.

FIG. 17 illustrates a schematic plane view of an arrangement structure of a third partition in a light-emitting panel consistent with disclosed embodiments of the present disclosure; and FIG. 18 illustrates a schematic plane view of another arrangement structure of a third partition in a light-emitting panel consistent with disclosed embodiments of the present disclosure. In one embodiment, referring to FIG. 17 and FIG. 18, the partition AA1 of the light-emitting panel 000 may include a third partition AA1*c*, and one third partition AA1*c* may include nine light-emitting elements 20 and two driving transistors 10. Three light-emitting elements 20 may be arranged along the fourth direction h to form a first sub-partition AA11, and three light-emitting elements 20 may be arranged along the fifth direction j to form a second sub-partition AA12.

Along the fifth direction j, the two driving transistors 10 may be located in non-adjacent two first sub-partitions AA11, respectively. The two non-adjacent first sub-partitions AA11 may refer to that along the fifth direction j, any other first sub-partition AA11 may be located between the two non-adjacent first sub-partitions AA11, and the two non-adjacent first sub-partitions AA11 may be spaced apart by any other first sub-partition AA11. Along the fourth direction h, the two driving transistors 10 may be located in two non-adjacent second sub-partitions AA12, respectively. The two non-adjacent second sub-partitions AA12 may refer to that along the fourth direction h, any other second sub-partition AA12 may be located between the two non-adjacent second sub-partitions AA12, and the two non-adjacent second sub-partitions AA12 may be spaced apart by any other second sub-partition AA12.

The present disclosure may explain that the partition AA1 may include the arrangement structure of the third partition AA1c. In one partition AA1, in other words, in one third partition AA1c, the quantity of light-emitting elements 20 may be nine, and the quantity of driving transistors 10 may be two. In one embodiment, referring to FIG. 17, in the first sub-partition AA11, one driving transistor 10 may be located between adjacent two light-emitting elements 20, and the driving transistor 10 may be located on the connection line of the three light-emitting elements 20 in the first sub-partition AA11. In view of this, the electrical connection line between the driving transistor 10 and the light-emitting element 20 may be set substantially short, to achieve electrical connection.

In another embodiment, referring to FIG. 18, one driving transistor 10 may be located between adjacent two light-emitting elements 20, and the driving transistor 10 may not be located on the connection line of the three light-emitting elements 20 in the first sub-partition AA11. In view of this, the driving transistor 10 may be prevented from blocking the light emitted from the three light-emitting elements 20 in the same first sub-partition AA11. In the present disclosure, the arrangement structure of the third partition AA1c in FIG. 17 and FIG. 18 may satisfy that the third partition AA1c may include two driving transistors 10, and when the light-emitting panel 000 includes the third partition AA1c with such arrangement structure, the quantity of driving transistors 10 adjacent to one light-emitting element 20 may be less than two, which may prevent the lamp shadow problem and improve the light-emitting effect.

It should be understood that in one embodiment, the fourth direction h of the third partition AA1c may be the same as the first direction X in the light-emitting panel 000, and the fifth direction j may be the same as the second direction Y in the light-emitting panel 000, as shown in FIG. 17 and FIG. 18. In another embodiment, the fourth direction h of the third partition AA1c may be the same as the second direction Y, and the fifth direction j of the third partition AA1c may be the same as the first direction X (not shown in the drawings). In specific implementation, the setting may be determined according to the layout requirements of the light-emitting panel, as long as the quantity of driving transistors 10 adjacent to one light-emitting element 20 is less than two, which may not be specifically limited by the present disclosure.

Figure 19:
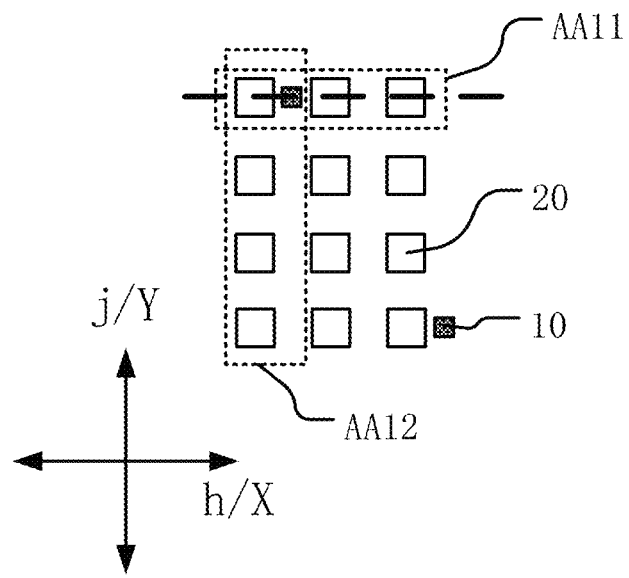
FIG. 19 illustrates a schematic plane view of an arrangement structure of a fourth partition in an exemplary light-emitting panel consistent with disclosed embodiments of the present disclosure.
Figure 20:
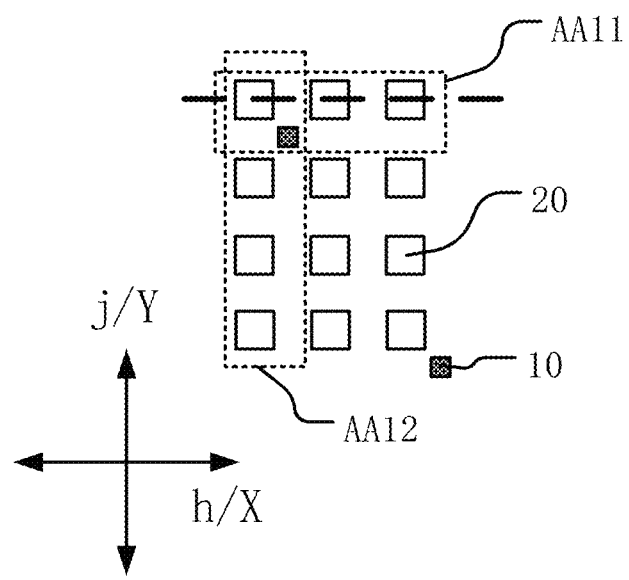
FIG. 20 illustrates a schematic plane view of another arrangement structure of a fourth partition in an exemplary light-emitting panel consistent with disclosed embodiments of the present disclosure.

FIG. 19 illustrates a schematic plane view of an arrangement structure of a fourth partition in a light-emitting panel consistent with disclosed embodiments of the present disclosure; and FIG. 20 illustrates a schematic plane view of another arrangement structure of a fourth partition in a light-emitting panel consistent with disclosed embodiments of the present disclosure. In one embodiment, referring to FIG. 19 and FIG. 20, the partition AA1 of the light-emitting panel 000 may include a fourth partition AA1d, and one fourth partition AA1d may include twelve light-emitting elements 20 and two driving transistors 10. Three light-emitting elements 20 may be arranged along the fourth direction h to form a first sub-partition AA11, and four light-emitting elements 20 may be arranged along the fifth direction j to form a second sub-partition AA12.

Along the fifth direction j, the two driving transistors 10 may be spaced apart by two first sub-partitions AA11. Along the fourth direction h, the two driving transistors 10 may be located in two non-adjacent second sub-partitions AA12, respectively. The two non-adjacent second sub-partitions AA12 may refer to that along the fourth direction h, any other second sub-partition AA12 may be located between the two non-adjacent second sub-partitions AA12, and the two non-adjacent second sub-partitions AA12 may be spaced apart by any other second sub-partition AA12.

The present disclosure may explain that the partition AA1 may include the arrangement structure of the fourth partition AA1d. In one partition AA1, in other words, in one fourth partition AA1d, the quantity of light-emitting elements 20 may be twelve, and the quantity of driving transistors 10 may be two. In one embodiment, referring to FIG. 19, in the first sub-partition AA11, one driving transistor 10 may be located between adjacent two light-emitting elements 20, and the driving transistor 10 may be located on the connection line of the three light-emitting elements 20 in the first sub-partition AA11. In view of this, the electrical connection line between the driving transistor 10 and the light-emitting element 20 may be set substantially short, to achieve electrical connection.

In another embodiment, referring to FIG. 20, one driving transistor 10 may be located between adjacent two light-emitting elements 20, and the driving transistor 10 may not be located on the connection line of the three light-emitting elements 20 in the first sub-partition AA11. In view of this, the driving transistor 10 may be prevented from blocking the light emitted from the three light-emitting elements 20 in the same first sub-partition AA11. In the present disclosure, the arrangement structure of the fourth partition AA1d in FIG. 19 and FIG. 20 may satisfy that the fourth partition AA1d may include two driving transistors 10, and when the light-emitting panel 000 includes the fourth partition AA1d with such arrangement structure, the quantity of driving transistors 10 adjacent to one light-emitting element 20 may be less than two, which may prevent the lamp shadow problem and improve the light-emitting effect.

It should be understood that in one embodiment, the fourth direction h of the fourth partition AA1d may be the same as the first direction X in the light-emitting panel 000, and the fifth direction j may be the same as the second direction Y in the light-emitting panel 000, as shown in FIG. 19 and FIG. 20. In another embodiment, the fourth direction h of the fourth partition AA1d may be the same as the second direction Y, and the fifth direction j of the fourth partition AA1d may be the same as the first direction X (not shown in the drawings). In specific implementation, the setting may be determined according to the layout requirements of the light-emitting panel, as long as the quantity of driving transistors 10 adjacent to one light-emitting element 20 is less than two, which may not be specifically limited by the present disclosure.

In one embodiment, the partition AA1 in the light-emitting panel 000 may include merely one of the first partition AA1a, the second partition AA1b, the third partition AA1c, and the fourth partition AA1d. In another embodiment, the partition AA1 in the light-emitting panel 000 may include a combination of any two or three or four of the above-mentioned four partitions (AA1a, AA1b, AA1c and AA1d). For example, the arrangement structure of the plurality of light-emitting elements 20 and the plurality of driving transistors 10 in the light-emitting panel 000 may include the first partition AA1a, the second partition AA1b, the third partition AA1c, and the fourth partition AA1d, as long as the quantity of driving transistors 10 adjacent to one light-emitting element 20 is less than two, which may not be limited by the present disclosure.

In one embodiment, the partition AA1 in the light-emitting panel 000 may include at least two or more of the first partition AA1a, the second partition AA1b, the third partition AA1c, and the fourth partition AA1d, such that the arrangement positions of the driving transistors 10 in the entire light-emitting panel 000 may be substantially dispersed, which may facilitate to effectively prevent the lamp shadow problem.

Figure 21:
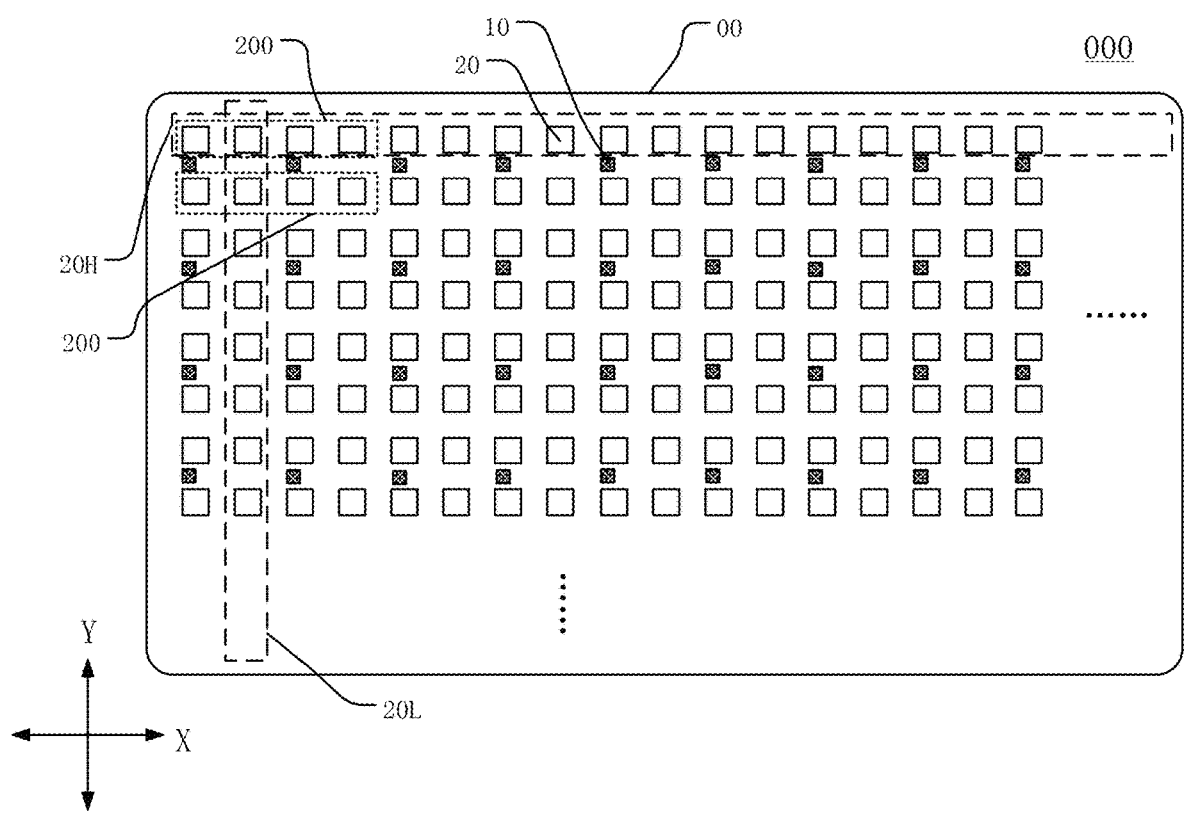
FIG. 21 illustrates a schematic plane view of another exemplary light-emitting panel consistent with disclosed embodiments of the present disclosure.
Figure 22:
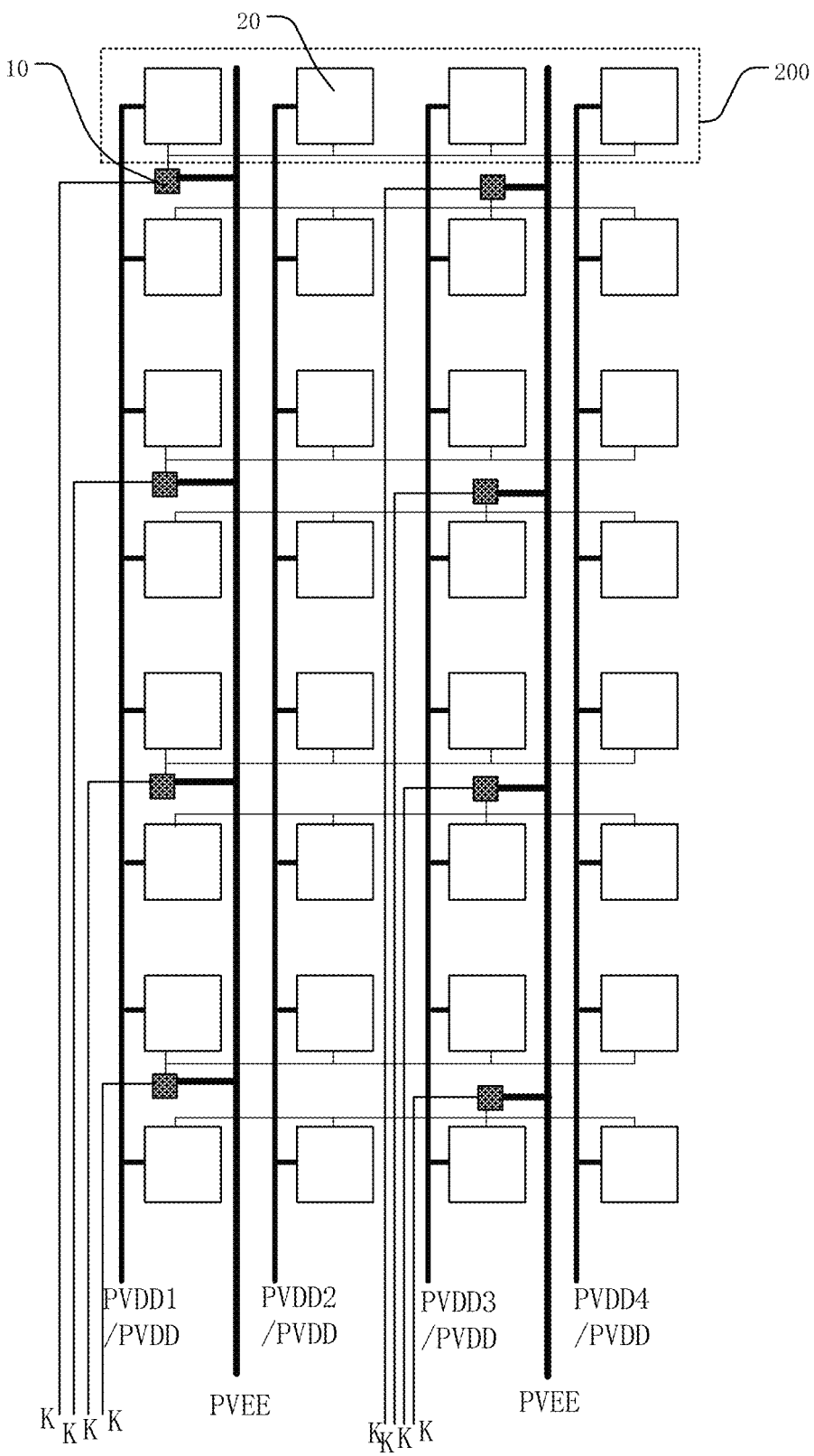
FIG. 22 illustrates a schematic diagram of an electrical connection between light-emitting elements and driving transistors in a local region of an exemplary light-emitting panel in FIG. 21 consistent with disclosed embodiments of the present disclosure.

FIG. 21 illustrates a schematic plane view of another light-emitting panel consistent with disclosed embodiments of the present disclosure; and FIG. 22 illustrates a schematic diagram of an electrical connection between light-emitting elements and driving transistors in a local region of the light-emitting panel in FIG. 21. FIG. 21 may merely illustrate the arrangement structure of the light-emitting elements and the driving transistors in the light-emitting panel, and may not represent the electrical connection relationship. In certain embodiments, referring to FIG. 21, a ratio of the quantity of light-emitting elements 20 over the quantity of the driving transistors 10 may be greater than or equal to 4:1.

The present disclosure may explain that in the entire light-emitting panel 000, the ratio of the quantity of light-emitting elements 20 over the quantity of driving transistors 10 may be greater than or equal to 4:1. Referring to FIG. 21, in the entire light-emitting panel 000, the ratio of the quantity of light-emitting elements 20 over the quantity of driving transistors 10 may be 4:1. In other words, every four light-emitting elements 20 in the light-emitting panel 000 may be used as a light-emitting unit 200, and one light-emitting unit 200 may be controlled by a same one driving transistor 10 to emit light. One PWM driving circuit may drive multiple light-emitting units 200 in a time-sharing manner. In other words, a scanning period of one frame may be divided into four parts, and a same one driving transistor 10 may sequentially control the four light-emitting elements 20 in one light-emitting unit 200 during the one-frame time period. It should be understood that the four light-emitting elements 20 in one light-emitting unit 200 controlled by one driving transistor 10 in FIG. 22 may be the four light-emitting elements 20 circled in FIG. 22, or may be the other four light-emitting elements 20 near the driving transistor 10, which may not be limited by the present disclosure, as long as the four light-emitting elements 20 in one light-emitting unit 200 are controlled by the same one driving transistor 10 to emit light.

When the light-emitting panel includes 2400 light-emitting elements 20, the light-emitting panel may include 600 light-emitting units, and merely 600 driving transistors 10 may need to be provided in the light-emitting panel 000, which may facilitate to reduce the quantity of driving transistors 10 included in the light-emitting panel 000 while realizing that the plurality of light-emitting units 200 in the light-emitting panel 000 can be independently lit and emit light. Through the coordination of the above-disclosed arrangement of the driving transistors 10 and the light-emitting elements 20, the lamp shadow problem may be prevented and the light-emitting effect may be improved.

It should be understood that the present disclosure may merely illustrate the driving method that can be adopted when the ratio of the quantity of light-emitting elements 20 over the quantity of driving transistors 10 is 4:1 in the entire light-emitting panel 000 as an example. In the entire light-emitting panel 000, the ratio of the quantity of light-emitting elements 20 over the quantity of driving transistors 10 may be any other value greater than 4:1, such as 5:1, 6:1, 7:1, 8:1, 9:1, etc. In view of this, the driving principle may refer to the method of the case where the ratio is equal to 4:1, and the difference may merely include that the quantity of light-emitting elements 20 included in one light-emitting unit 200 is different, which may not be repeated herein.

It should be understood that in the present disclosure, FIG. 21 may merely illustrate the position where the driving transistor 10 is located between adjacent two light-emitting elements 20. In specific implementation, the specific setting of the driving transistors 10 may include but may not be limited to such position. Referring to the embodiment associated with FIG. 10, one driving transistor 10 may be located in the middle of the quadrangular space formed by the four light-emitting elements 20, which may not be repeated herein.

Figure 23:
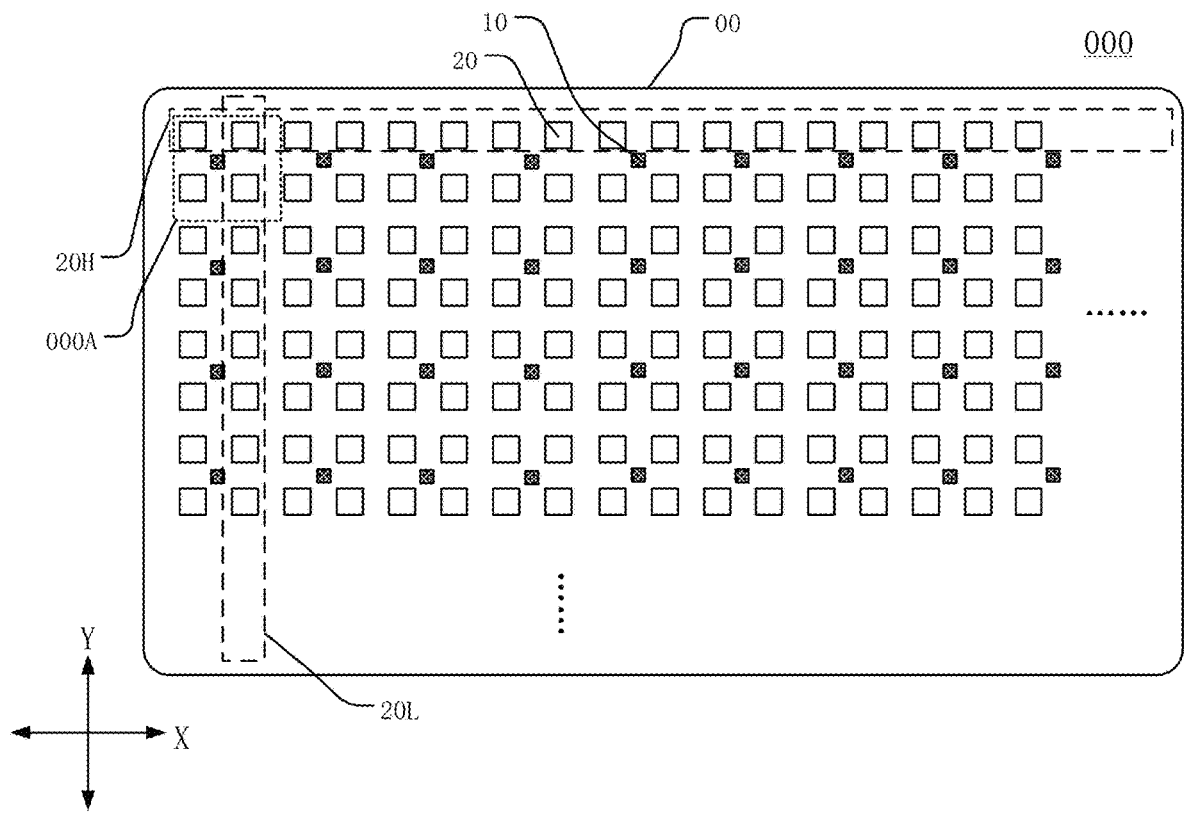
FIG. 23 illustrates a schematic plane view of another exemplary light-emitting panel consistent with disclosed embodiments of the present disclosure.
Figure 24:
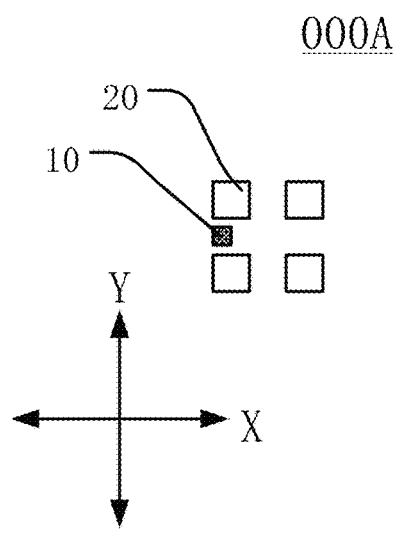
FIG. 24 illustrates a schematic diagram of an arrangement structure of a repeating unit in an exemplary light-emitting panel consistent with disclosed embodiments of the present disclosure.
Figure 25:
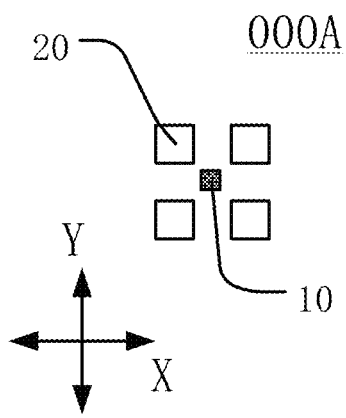
FIG. 25 illustrates a schematic diagram of another arrangement structure of a repeating unit in an exemplary light-emitting panel consistent with disclosed embodiments of the present disclosure.
Figure 26:
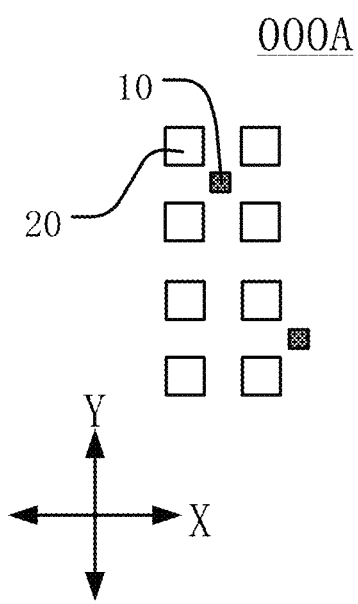
FIG. 26 illustrates a schematic diagram of another arrangement structure of a repeating unit in an exemplary light-emitting panel consistent with disclosed embodiments of the present disclosure.
Figure 27:
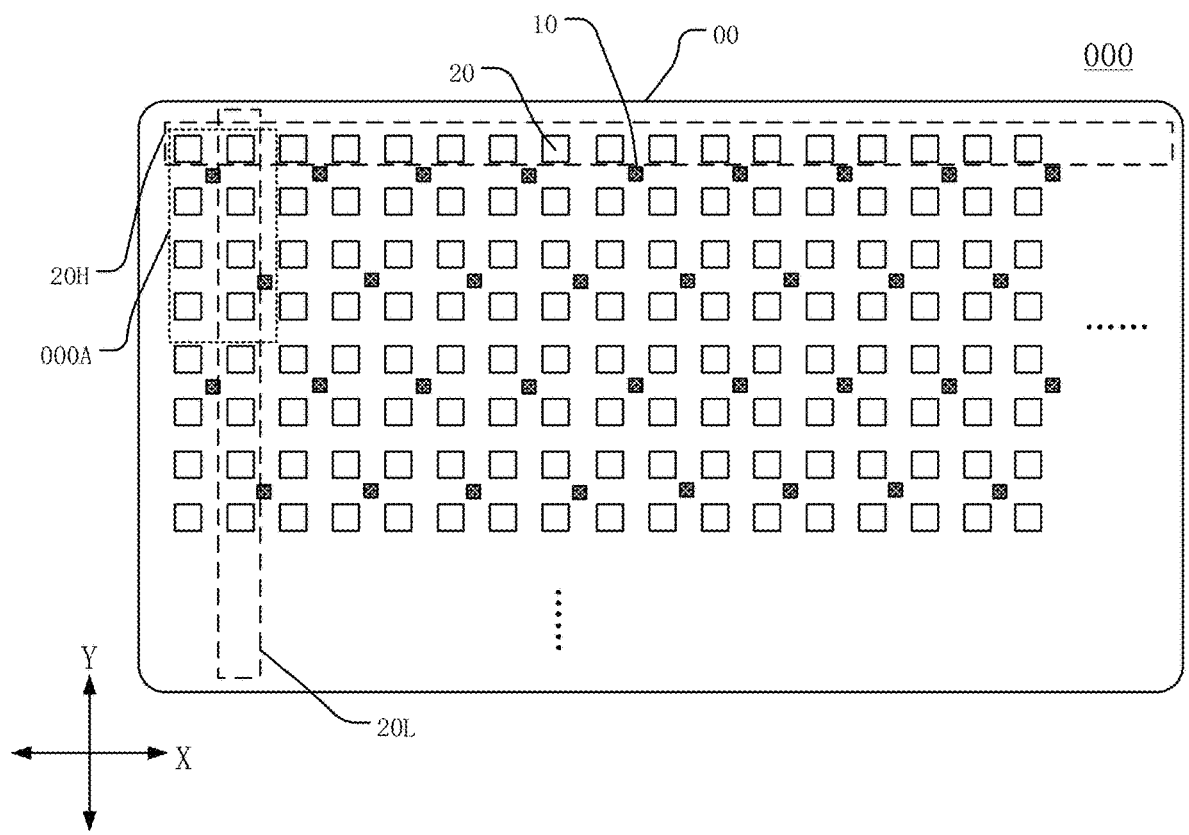
FIG. 27 illustrates a schematic plane view of another exemplary light-emitting panel consistent with disclosed embodiments of the present disclosure.

FIG. 23 illustrates a schematic plane view of another light-emitting panel consistent with disclosed embodiments of the present disclosure; FIG. 24 illustrates a schematic diagram of an arrangement structure of a repeating unit in a light-emitting panel consistent with disclosed embodiments of the present disclosure; FIG. 25 illustrates a schematic diagram of another arrangement structure of a repeating unit in a light-emitting panel consistent with disclosed embodiments of the present disclosure; FIG. 26 illustrates a schematic diagram of another arrangement structure of a repeating unit in a light-emitting panel consistent with disclosed embodiments of the present disclosure; and FIG. 27 illustrates a schematic plane view of another light-emitting panel consistent with disclosed embodiments of the present disclosure. In one embodiment, referring to FIG. 21, FIG. 22, and FIGS. 23-27, the light-emitting panel 000 may include a plurality of repeating units 000A. A repeating unit 000A may include a plurality of light-emitting elements 20 arranged in an array, and a plurality of driving transistors 10. In one repeating unit 000A, the ratio of the quantity of light-emitting elements 20 over the quantity of driving transistors 10 may be greater than or equal to 4:1.

The present disclosure may explain that the arrangement of the light-emitting elements 20 and the driving transistors 10 in the light-emitting panel 000 may include a structure in which the plurality of repeating units 000A are arranged according to a certain rule. The light-emitting panel 000 may include the plurality of repeating units 000A. In one embodiment, the plurality of repeating units 000A may be arranged in a row-column array. In another embodiment, the plurality of repeating units 000A may be arranged in a staggered manner. The plurality of repeating units 000A being arranged in a row-column array may be understood that the plurality of repeating units 000A may be sequentially arranged to form one or more unit rows along a same direction, and to form one or more unit columns along another same direction. The plurality of repeating units 000A being arranged in a staggered manner may be understood that the plurality of repeating units 000A may be arranged in different manners, e.g., may be arranged in two different manners. In view of this, along the row direction, repeating units with two different arrangement manners may be arranged in sequence; and along the column direction, repeating units with two different arrangement manners may be arranged in sequence. For two different unit rows, two repeating units with a same arrangement manner may located in different unit columns, respectively, and may be in a staggered arrangement.

In one embodiment, in one repeating unit 000A, the ratio of the quantity of light-emitting elements 20 over the quantity of driving transistors 10 may be greater than or equal to 4:1. For example, when the ratio of the quantity of light-emitting elements 20 over the quantity of driving transistors 10 in one repeating unit 000A is 4:1, the ratio of the quantity of light-emitting elements 20 over the quantity of driving transistors 10 in the entire light-emitting panel 000 including a plurality of repeating units 000A may be 4:1. For another example, when the ratio of the quantity of light-emitting elements 20 over the quantity of driving transistors 10 in one repeating unit 000A is 8:1, the ratio of the quantity of light-emitting elements 20 over the quantity of driving transistors 10 in the entire light-emitting panel 000 including a plurality of repeating units 000A may be 8:1.

It should be understood that the ratio of the quantity of light-emitting elements 20 over the quantity of driving transistors 10 in one repeating unit 000A may be 4:1 as an example. The repeating unit may include the arrangement structure in FIG. 24, and the light-emitting panel 000 including the plurality of repeating units 000A with such arrangement structure may include the structure in FIG. 21. In another embodiment, the ratio of the quantity of light-emitting elements 20 over the quantity of driving transistors 10 in one repeating unit 000A may be 4:1 as an example. The repeating unit may include the arrangement structure in FIG. 25, and the light-emitting panel 000 including the plurality of repeating units 000A with such arrangement structure may include the structure in FIG. 23.

It should be understood that FIG. 24 and FIG. 25 may merely illustrate that the ratio of the quantity of light-emitting elements 20 over the quantity of driving transistors 10 in one repeating unit 000A may be equal to 4:1 as an example. In specific implementation, the arrangement structure in which the ratio of the quantity of light-emitting elements 20 over the quantity of driving transistors 10 in one repeating unit 000A is equal to 4:1 may also include any other structure. For example, when one repeating unit 000A includes 8 light-emitting elements 20 and 2 driving transistors 10, the repeating unit 000A may include the arrangement structure in FIG. 26, and the light-emitting panel 000 including the plurality of repeating units 000A with such arrangement structure may include the structure in FIG. 27. In specific implementation, the arrangement structure of the repeating unit may also include any other structure, as long as the ratio of the quantity of light-emitting elements 20 over the quantity of driving transistors 10 in one repeating unit 000A is greater than or equal to 4:1, and in the entire light-emitting panel 000, the quantity of driving transistors 10 adjacent to one light-emitting element 20 is less than two, which may not be repeated herein.

Figure 28:
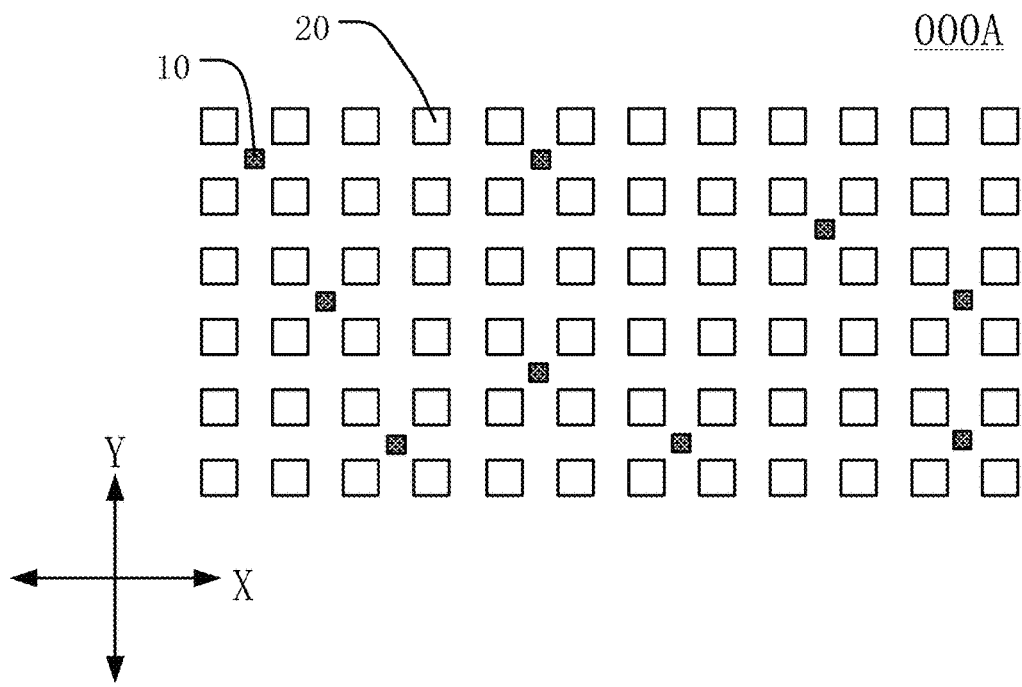
FIG. 28 illustrates a schematic diagram of another arrangement structure of a repeating unit in an exemplary light-emitting panel consistent with disclosed embodiments of the present disclosure.
Figure 29:
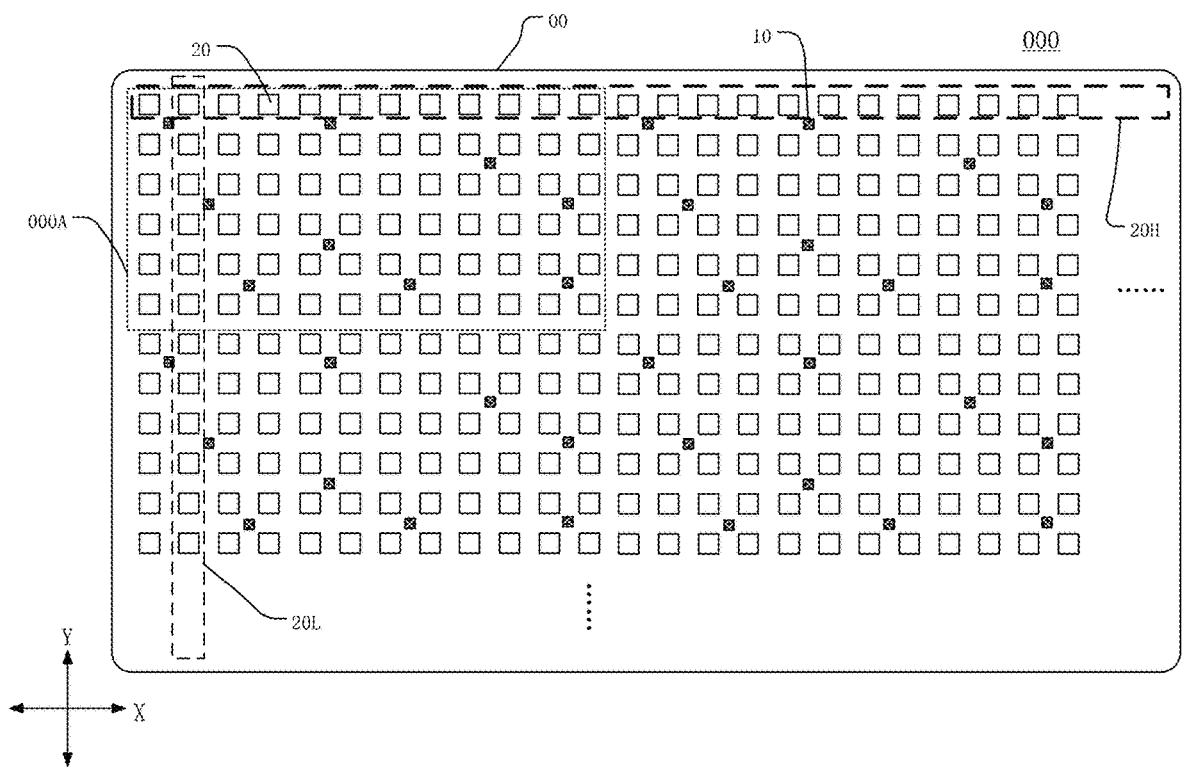
FIG. 29 illustrates a schematic plane view of another exemplary light-emitting panel consistent with disclosed embodiments of the present disclosure.

FIG. 28 illustrates a schematic diagram of another arrangement structure of a repeating unit in a light-emitting panel consistent with disclosed embodiments of the present disclosure; and FIG. 29 illustrates a schematic plane view of the light-emitting panel. In certain embodiments, referring to FIG. 28 and FIG. 29, the ratio of the quantity of light-emitting elements 20 over the quantity of driving transistors 10 in one repeating unit 000A may be equal to 8:1.

The present disclosure may explain that the ratio of the quantity of light-emitting elements 20 over the quantity of driving transistors 10 in one repeating unit 000A of the light-emitting panel 000 may be equal to 8:1, and in the entire light-emitting panel 000 including the plurality of repeating units 000A, the ratio of the quantity of light-emitting elements 20 over the quantity of driving transistors 10 may be equal to 8:1. Referring to FIG. 28, the repeating unit 000A may include 72 light-emitting elements 20, and 9 driving transistors 10. The light-emitting panel 000 including the plurality of repeating units 000A may include the structure in FIG. 29, which may facilitate to further reduce the quantity of driving transistors 10 in the entire light-emitting panel 000, such that more panel space may be used to dispose the driving transistors 10, which may effectively prevent the lamp shadow problem.

It should be understood that the specific arrangement structure of the light-emitting elements 20 and the driving transistors 10 in the repeating unit 000A may include but may not be limited to the structure in FIG. 28. FIG. 28 may merely illustrate one of the arrangement structures, and in specific implementation, the repeating unit 000A may also include any other arrangement structure, as long as the ratio of the quantity of light-emitting elements 20 over the quantity of driving transistors 10 in one repeating unit 000A is equal to 8:1.

It should be understood that FIG. 28 may merely illustrate that in one repeating unit 000A, the quantity of light-emitting elements 20 may be 72, and the quantity of driving transistors may be 9, such that the ratio of the quantity of light-emitting elements 20 over the quantity of driving transistors 10 may be 8:1 as an example. In specific implementation, the quantity of light-emitting elements 20 and the quantity of driving transistors 10 included in one repeating unit 000A may not be limited to such values, and may also include other values. For example, in one repeating unit 000A, the quantity of light-emitting elements 20 may be 64, and the quantity of driving transistors may be 8. Alternatively, in one repeating unit 000A, the quantity of light-emitting elements 20 may be 96, and the quantity of driving transistors may be 12. The present disclosure may not specifically limit the quantities of the light-emitting elements and the driving transistors, as long as the light-emitting panel includes the plurality of repeating units 000A, and the ratio of the quantity of light-emitting elements 20 over the quantity of driving transistors 10 in one repeating unit 000A is 8:1.

Figure 30:
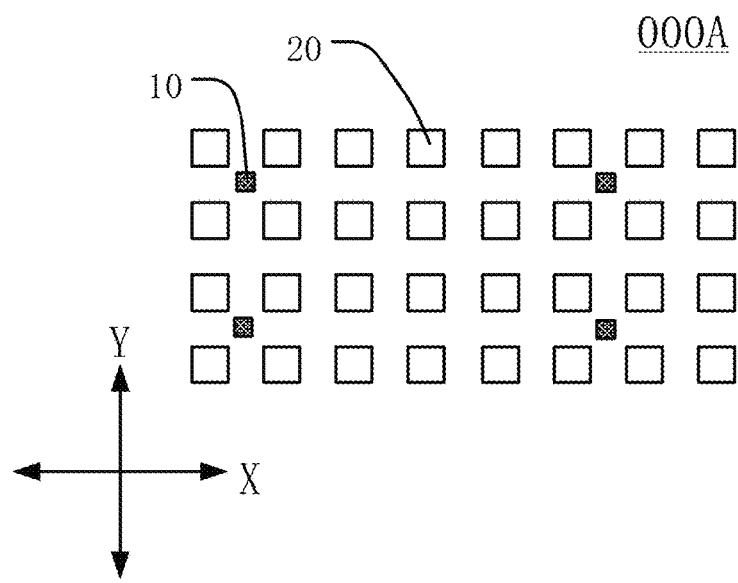
FIG. 30 illustrates a schematic diagram of another arrangement structure of a repeating unit in an exemplary light-emitting panel consistent with disclosed embodiments of the present disclosure.
Figure 31:
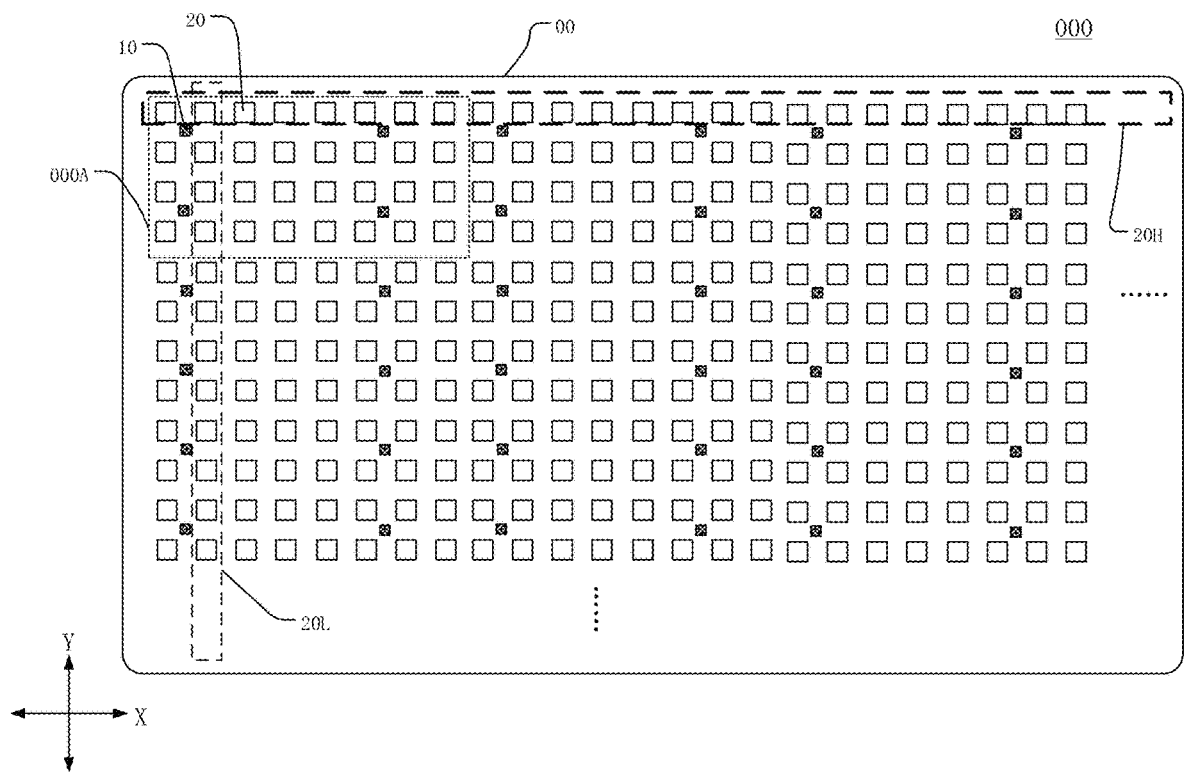
FIG. 31 illustrates a schematic plane view of another exemplary light-emitting panel consistent with disclosed embodiments of the present disclosure.

FIG. 30 illustrates a schematic diagram of another arrangement structure of a repeating unit in a light-emitting panel consistent with disclosed embodiments of the present disclosure; and FIG. 31 illustrates a schematic plane view of the light-emitting panel. In one embodiment, referring to FIGS. 28-31, in one repeating unit 000A, the ratio of the quantity of light-emitting elements 20 over the quantity of driving transistors 10 may be 8:1, and in at least one repeating unit 000A, the quantity of driving transistors 10 corresponding to one light-emitting element row 20H and/or one light-emitting element column 20L may be less than or equal to two. It should be understood that in one embodiment, the quantity of light-emitting elements 20 in one light-emitting element row 20H included in one repeating unit 000A may refer to the quantity of light-emitting elements 20 arranged along the first direction X in one repeating unit 000A, and may not refer to the quantity of the light-emitting elements 20 arranged along the first direction X in the entire light-emitting panel 000. The quantity of light-emitting elements 20 in one light-emitting element column 20L included in one repeating unit 000A may refer to the quantity of light-emitting elements 20 arranged along the second direction Y in one repeating unit 000A, and may not refer to the quantity of light-emitting elements 20 arranged along the second direction Y in the entire light-emitting panel 000.

The present disclosure may explain that in the repeating unit 000A shown in FIG. 28, in at least one repeating unit 000A, the quantity of driving transistors 10 corresponding to one light-emitting element row 20H and/or one light-emitting element column 20L may be less than or equal to two. In other words, the quantity of driving transistors 10 corresponding to one light-emitting element row 20H may be less than or equal to two (not shown in the drawings), or the quantity of driving transistors 10 corresponding to one light-emitting element column 20L may be less than or equal to two (as shown in FIG. 28 and FIG. 29), or both the quantity of driving transistors 10 corresponding to one light-emitting element row 20H and the quantity of driving transistors 10 corresponding to one light-emitting element column 20L may be less than or equal to two (as shown in FIG. 30 and FIG. 31).

Referring to FIG. 28 and FIG. 29, one repeating unit 000A may include 72 light-emitting elements 20 and 9 driving transistors 10. Then the light-emitting panel 000 including a plurality of the repeating units 000A may be shown in FIG. 29, and the ratio of the quantity of light-emitting elements 20 over the quantity of driving transistors 10 may be 8:1. In view of this, in one repeating unit 000A, the quantity of driving transistors 10 corresponding to one light-emitting element column 20L may be two, one, or zero. In other words, the quantity of driving transistors 10 corresponding to one light-emitting element column 20L in one repeating unit 000A may be less than two, and the quantity of driving transistors 10 corresponding to one light-emitting element row 20H in one repeating unit 000A may be determined according to the case where the quantity of driving transistors 10 is less than two, as shown in FIG. 28 and FIG. 29. In view of this, the quantity of driving transistors 10 corresponding to one light-emitting element row 20H in one repeating unit 000A may be three, two, one, or zero, which may not be specifically limited by the present disclosure.

Referring to FIG. 30 and FIG. 31, one repeating unit 000A may include 32 light-emitting elements 20 and 4 driving transistors 10. Then the light-emitting panel 000 including a plurality of the repeating units 000A may be shown in FIG. 31, and the ratio of the quantity of light-emitting elements 20 over the quantity of driving transistors 10 may be 8:1. In view of this, in one repeating unit 000A, the quantity of driving transistors 10 corresponding to one light-emitting element column 20L may be two or zero, and the quantity of driving transistors 10 corresponding to one light-emitting element row 20H may be two or zero. In other words, in one repeating unit 000A, the quantity of driving transistors 10 corresponding to one light-emitting element column 20L may be less than two, and the quantity of driving transistors 10 corresponding to one light-emitting element row 20H may be less than two. While satisfying that the quantity of driving transistors 10 adjacent to one light-emitting element 20 is less than two, the driving transistors 10 may be arranged according to a certain rule, which may facilitate to the light absorption uniformity of the driving transistors 10 and may facilitate to improve the light-emitting effect.

In one embodiment, referring to FIGS. 28-31, in one repeating unit 000A, the ratio of the quantity of light-emitting elements 20 over the quantity of driving transistors 10 may be 8:1. In at least one repeating unit 000A, the quantity of driving transistors 10 corresponding to one light-emitting element row 20H and/or one light-emitting element column 20L may be less than or equal to two. In one repeating unit 000A, the quantity of light-emitting elements 20 included in the light-emitting element row 20H is M2, and the quantity of light-emitting elements 20 included in the light-emitting element column 20L is N2, where M2>N2, M2≥8, and N2<8.

The present disclosure may explain that in one repeating unit 000A, when the quantity of light-emitting elements 20 included in the light-emitting element row 20H (M2) is greater than the quantity of light-emitting elements 20 included in the light-emitting element column 20L (N2), and M2≥8, N2<8, in one embodiment, M2=12, N2=6, as shown in FIG. 28; and in another embodiment, M2=8, N2=4, as shown in FIG. 30. Therefore, in one repeating unit 000A, the quantity of driving transistors 10 corresponding to at least one of the light-emitting element row 20H and the light-emitting element column 20L may be less than or equal to two. While satisfying that in one repeating unit 000A, the ratio of the quantity of light-emitting elements 20 over the quantity of driving transistors 10 is 8:1, the quantity of driving transistors 10 adjacent to one light-emitting element 20 may be less than two, which may facilitate to prevent the lamp shadow problem.

It should be understood that in one embodiment, FIGS. 28-31 may merely illustrate two arrangement structures where in one repeating unit 000A, the quantity of light-emitting elements 20 included in the light-emitting element row 20H (M2) is greater than the quantity of light-emitting elements 20 included in the light-emitting element column 20L (N2), and M2≥8, N2<8. In specific implementation, the arrangement structure may include while may not be limited to such structure.

Figure 32:
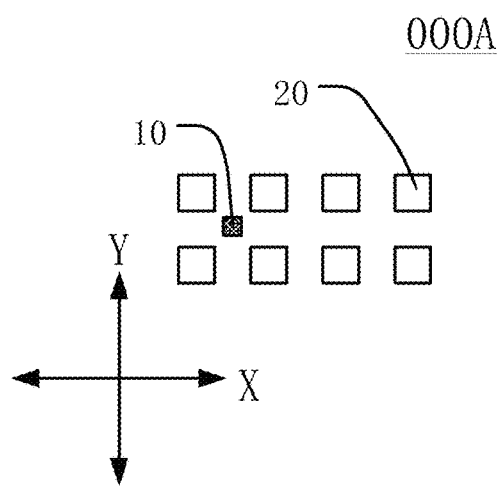
FIG. 32 illustrates a schematic diagram of another arrangement structure of a repeating unit in an exemplary light-emitting panel consistent with disclosed embodiments of the present disclosure.
Figure 33:
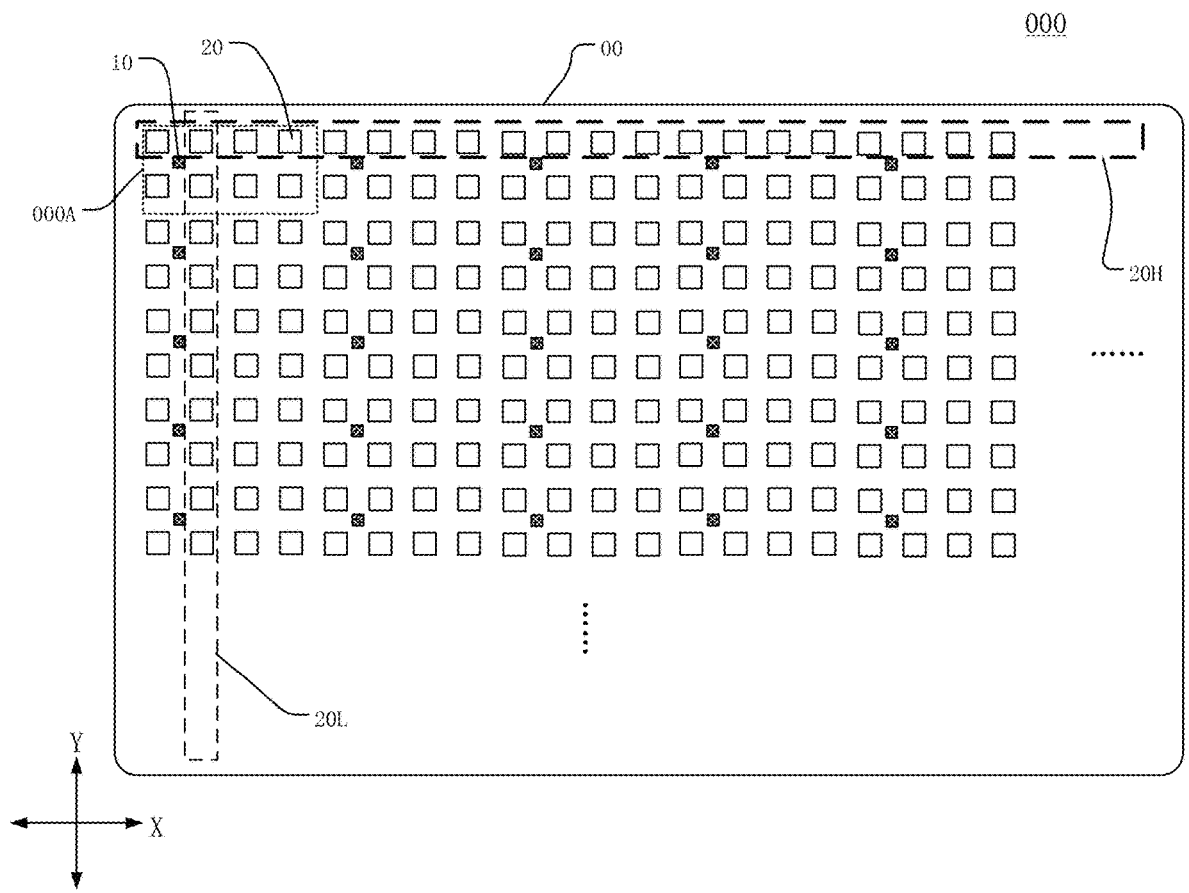
FIG. 33 illustrates a schematic plane view of another exemplary light-emitting panel consistent with disclosed embodiments of the present disclosure.
Figure 34:
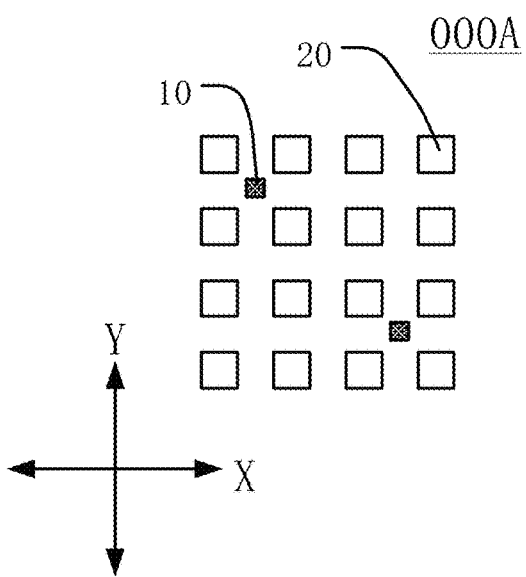
FIG. 34 illustrates a schematic diagram of another arrangement structure of a repeating unit in an exemplary light-emitting panel consistent with disclosed embodiments of the present disclosure.
Figure 35:
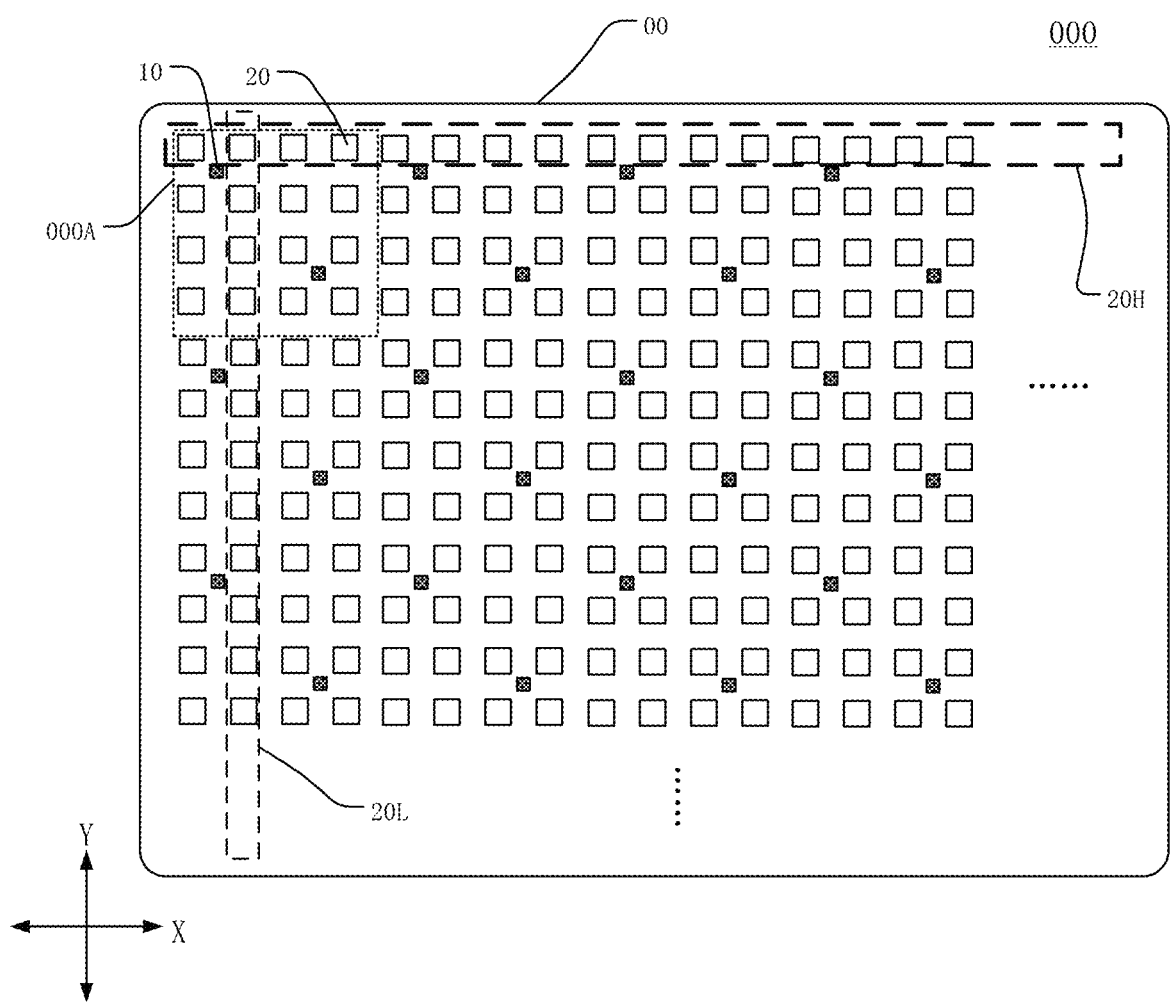
FIG. 35 illustrates a schematic plane view of another exemplary light-emitting panel consistent with disclosed embodiments of the present disclosure.
Figure 36:
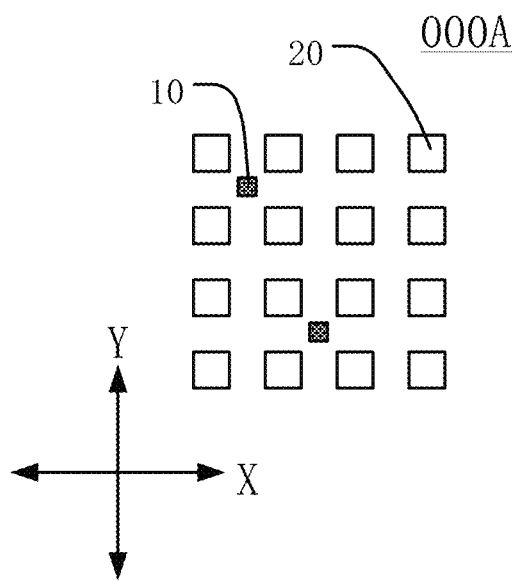
FIG. 36 illustrates a schematic diagram of another arrangement structure of a repeating unit in an exemplary light-emitting panel consistent with disclosed embodiments of the present disclosure.
Figure 37:
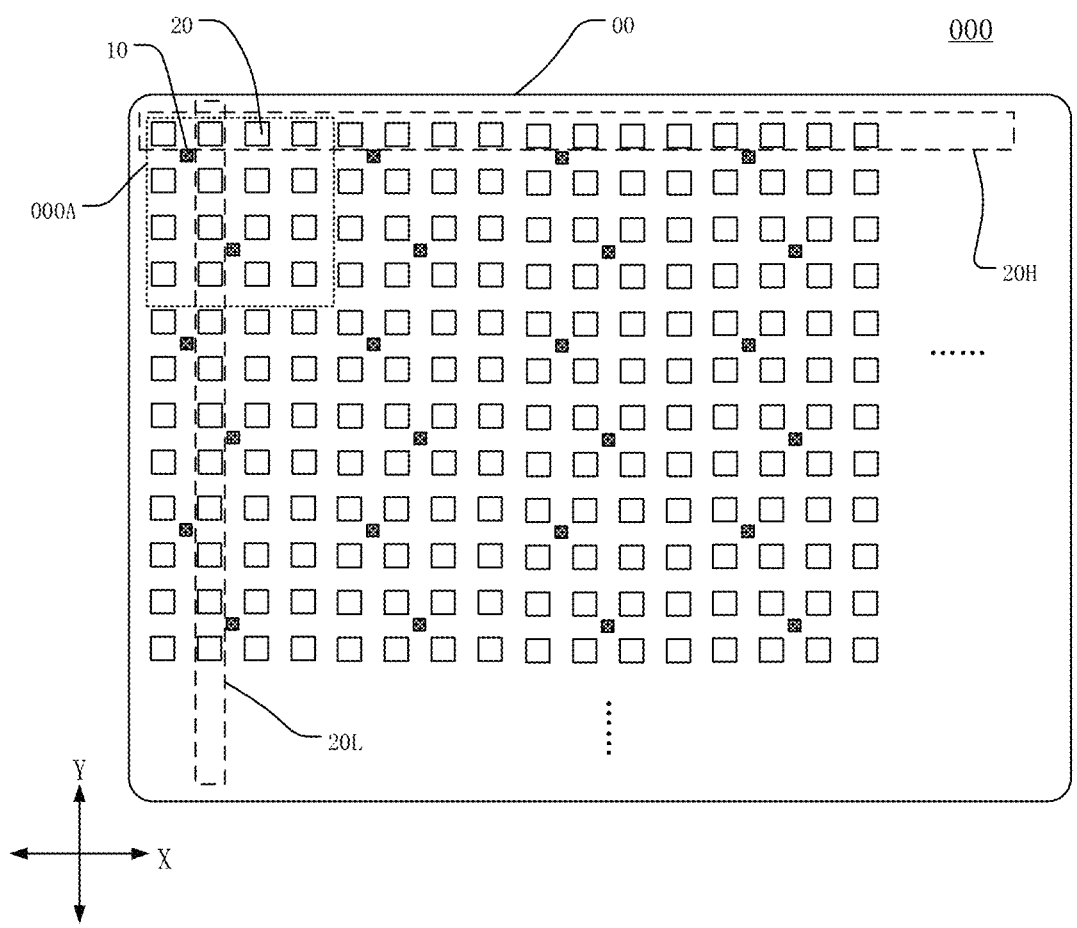
FIG. 37 illustrates a schematic plane view of another exemplary light-emitting panel consistent with disclosed embodiments of the present disclosure.

FIG. 32 illustrates a schematic diagram of another arrangement structure of a repeating unit in a light-emitting panel consistent with disclosed embodiments of the present disclosure; and FIG. 33 illustrates a schematic plane view of the light-emitting panel. FIG. 34 illustrates a schematic diagram of another arrangement structure of a repeating unit in a light-emitting panel consistent with disclosed embodiments of the present disclosure; and FIG. 35 illustrates a schematic plane view of the light-emitting panel. FIG. 36 illustrates a schematic diagram of another arrangement structure of a repeating unit in a light-emitting panel consistent with disclosed embodiments of the present disclosure; and FIG. 37 illustrates a schematic plane view of the light-emitting panel. In certain embodiments, referring to FIGS. 32-37, in one repeating unit 000A, the ratio of the quantity of light-emitting elements 20 over the quantity of driving transistors 10 may be 8:1. In at least one repeating unit 000A, the quantity of driving transistors 10 corresponding to one light-emitting element row 20H and/or one light-emitting element column 20L may be less than or equal to one.

The present disclosure may explain that in the repeating unit 000A shown in FIG. 32, FIG. 34 and FIG. 36, in at least one repeating unit 000A, the quantity of driving transistors 10 corresponding to one light-emitting element row 20H and/or one light-emitting element column 20L may be less than or equal to one. In other words, the quantity of driving transistors 10 corresponding to one light-emitting element row 20H may be less than or equal to one, or the quantity of driving transistors 10 corresponding to one light-emitting element column 20L may be less than or equal to one, or both the quantity of driving transistors 10 corresponding to one light-emitting element row 20H and the quantity of driving transistors 10 corresponding to one light-emitting element column 20L may be less than or equal to one.

Referring to FIG. 32 and FIG. 33, one repeating unit 000A may include 8 light-emitting elements 20 and 1 driving transistors 10, which may form a light-emitting element array with 2 rows and 4 columns. Then the light-emitting panel 000 including a plurality of the repeating units 000A may be shown in FIG. 33, and the ratio of the quantity of light-emitting elements 20 over the quantity of driving transistors 10 may be 8:1. In view of this, in one repeating unit 000A, the quantity of driving transistors 10 corresponding to one light-emitting element column 20L may be one or zero, and the quantity of driving transistors 10 corresponding to one light-emitting element row 20H may be one or zero. In other words, in one repeating unit 000A, the quantity of driving transistors 10 corresponding to one light-emitting element column 20L may be less than or equal to one, and the quantity of driving transistors 10 corresponding to one light-emitting element row 20H may be less than or equal to one.

Referring to FIG. 34 and FIG. 35, one repeating unit 000A may include 16 light-emitting elements 20 and 2 driving transistors 10, which may form a light-emitting element array with 4 rows and 4 columns. Then the light-emitting panel 000 including a plurality of the repeating units 000A may be shown in FIG. 35, and the ratio of the quantity of light-emitting elements 20 over the quantity of driving transistors 10 may be 8:1. In view of this, in one repeating unit 000A, the quantity of driving transistors 10 corresponding to one light-emitting element column 20L may be one or zero, and the quantity of driving transistors 10 corresponding to one light-emitting element row 20H may be one or zero. In other words, in one repeating unit 000A, the quantity of driving transistors 10 corresponding to one light-emitting element column 20L may be less than or equal to one, and the quantity of driving transistors 10 corresponding to one light-emitting element row 20H may be less than or equal to one.

Referring to FIG. 36 and FIG. 37, one repeating unit 000A may include 16 light-emitting elements 20 and 2 driving transistors 10 (the positions of the two driving transistors 10 in FIG. 36 may be different from the positions of the two driving transistors 10 in FIG. 34), which may form a light-emitting element array with 4 rows and 4 columns. Then the light-emitting panel 000 including a plurality of the repeating units 000A may be shown in FIG. 37, and the ratio of the quantity of light-emitting elements 20 over the quantity of driving transistors 10 may be 8:1. In view of this, in one repeating unit 000A, the quantity of driving transistors 10 corresponding to one light-emitting element column 20L may be one or zero, and the quantity of driving transistors 10 corresponding to one light-emitting element row 20H may be one or zero. In other words, in one repeating unit 000A, the quantity of driving transistors 10 corresponding to one light-emitting element column 20L may be less than or equal to one, and the quantity of driving transistors 10 corresponding to one light-emitting element row 20H may be less than or equal to one.

In the present disclosure, in one repeating unit 000A, the ratio of the quantity of light-emitting elements 20 over the quantity of driving transistors 10 may be 8:1, and the quantity of driving transistors 10 corresponding to one light-emitting element row 20H and/or one light-emitting element column 20L may be less than or equal to one. When the repeating unit 000A with such arrangement structure is applied to the light-emitting panel 000, the quantity of driving transistors 10 adjacent to one light-emitting element 20 may be less than two. According to the overall layout of the light-emitting panels 000 in FIG. 33, FIG. 35 and FIG. 37, the driving transistors 10 may be arranged according to a certain rule, which may facilitate to the light absorption uniformity of the driving transistors 10, may enable a substantially desired brightness uniformity, and may facilitate to improve the light-emitting effect.

In one embodiment, referring to FIGS. 32-37, in one repeating unit 000A, the ratio of the quantity of light-emitting elements 20 over the quantity of driving transistors 10 may be 8:1, and in at least one repeating unit 000A, the quantity of driving transistors 10 corresponding to one light-emitting element row 20H and/or one light-emitting element column 20L may be less than or equal to one. Then in one repeating unit 000A, the quantity of light-emitting elements 20 included in the light-emitting element row 20H is M1, and the quantity of light-emitting elements 20 included in the light-emitting element column 20L is N1, where M1≥4, and N1≥2.

The present disclosure may explain that in one repeating unit 000A, when the quantity of light-emitting elements 20 included in the light-emitting element row 20H (M1) is greater than or equal to four, and the quantity of light-emitting elements 20 included in the light-emitting element column 20L (N1) is greater than or equal to two, in one embodiment, M1=4, N1=2, as shown in FIG. 32; in another embodiment, M1=4, N1=4, as shown in FIG. 34, and in certain embodiments, M1=4, N1=4, as shown in FIG. 36. Therefore, in one repeating unit 000A, the quantity of driving transistors 10 corresponding to at least one of the light-emitting element row 20H and the light-emitting element column 20L may be less than or equal to one. While satisfying that in one repeating unit 000A, the ratio of the quantity of light-emitting elements 20 over the quantity of driving transistors 10 is 8:1, the quantity of driving transistors 10 adjacent to one light-emitting element 20 may be less than two, which may facilitate to prevent the lamp shadow problem.

It should be understood that in one embodiment, FIGS. 32-37 may merely illustrate three arrangement structures where in one repeating unit 000A, the quantity of light-emitting elements 20 included in the light-emitting element row 20H (M1) is greater than or equal to four, and the quantity of light-emitting elements 20 included in the light-emitting element column 20L (N1) is greater than or equal to two. In specific implementation, the arrangement structure may include while may not be limited to such structure.

Figure 38:
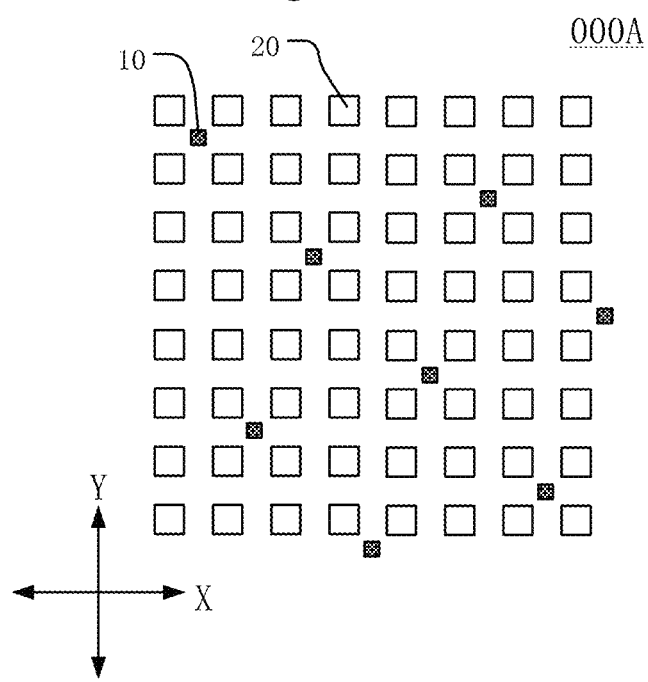
FIG. 38 illustrates a schematic diagram of another arrangement structure of a repeating unit in an exemplary light-emitting panel consistent with disclosed embodiments of the present disclosure.
Figure 39:
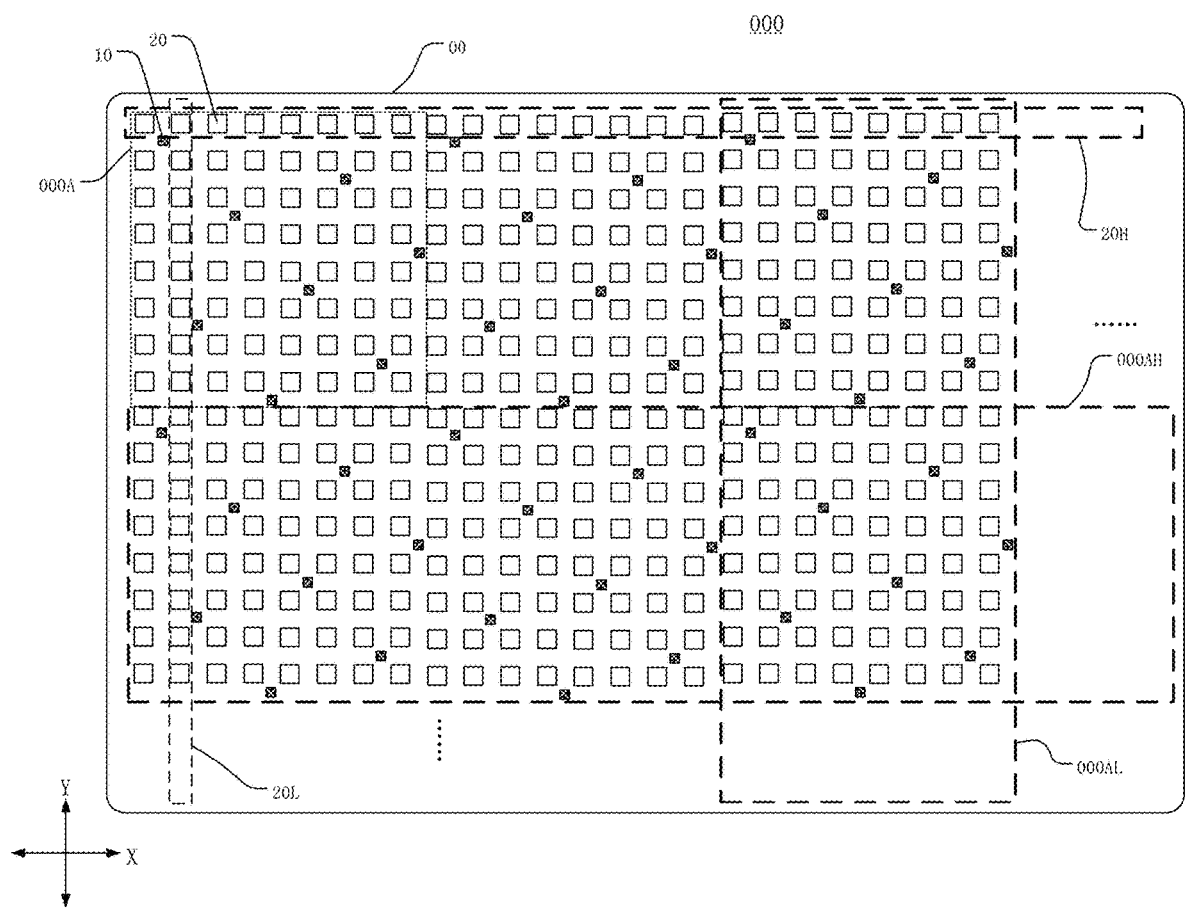
FIG. 39 illustrates a schematic plane view of another exemplary light-emitting panel consistent with disclosed embodiments of the present disclosure.
Figure 40:
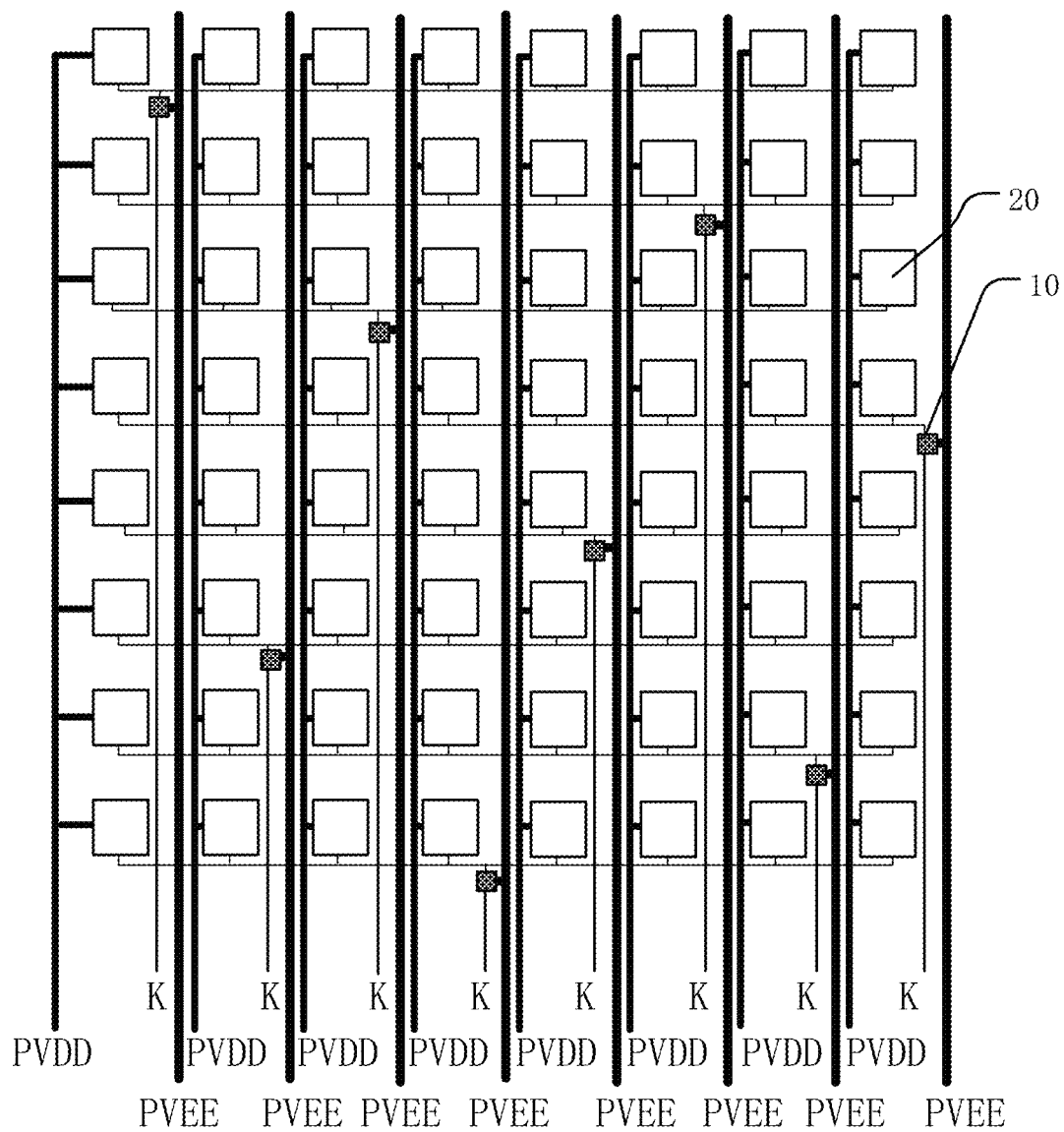
FIG. 40 illustrates a schematic diagram of an electrical connection between light-emitting elements and driving transistors in a local region of an exemplary light-emitting panel in FIG. 39 consistent with disclosed embodiments of the present disclosure.
Figure 41:
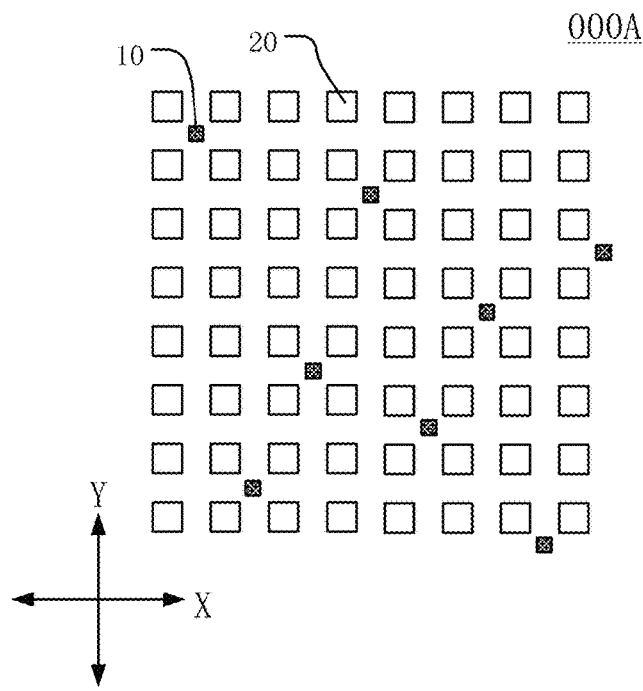
FIG. 41 illustrates a schematic diagram of another arrangement structure of a repeating unit in an exemplary light-emitting panel consistent with disclosed embodiments of the present disclosure.
Figure 42:
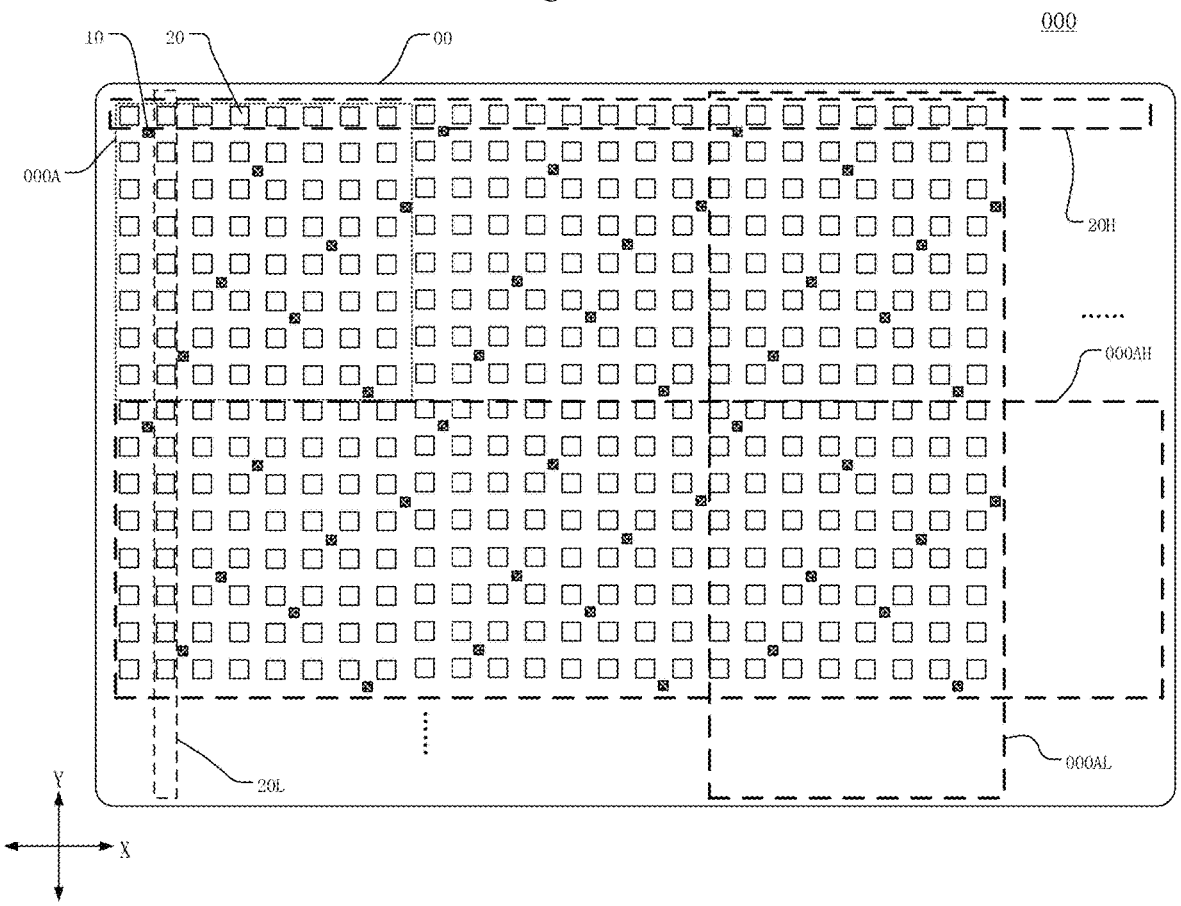
FIG. 42 illustrates a schematic plane view of another exemplary light-emitting panel consistent with disclosed embodiments of the present disclosure.
Figure 43:
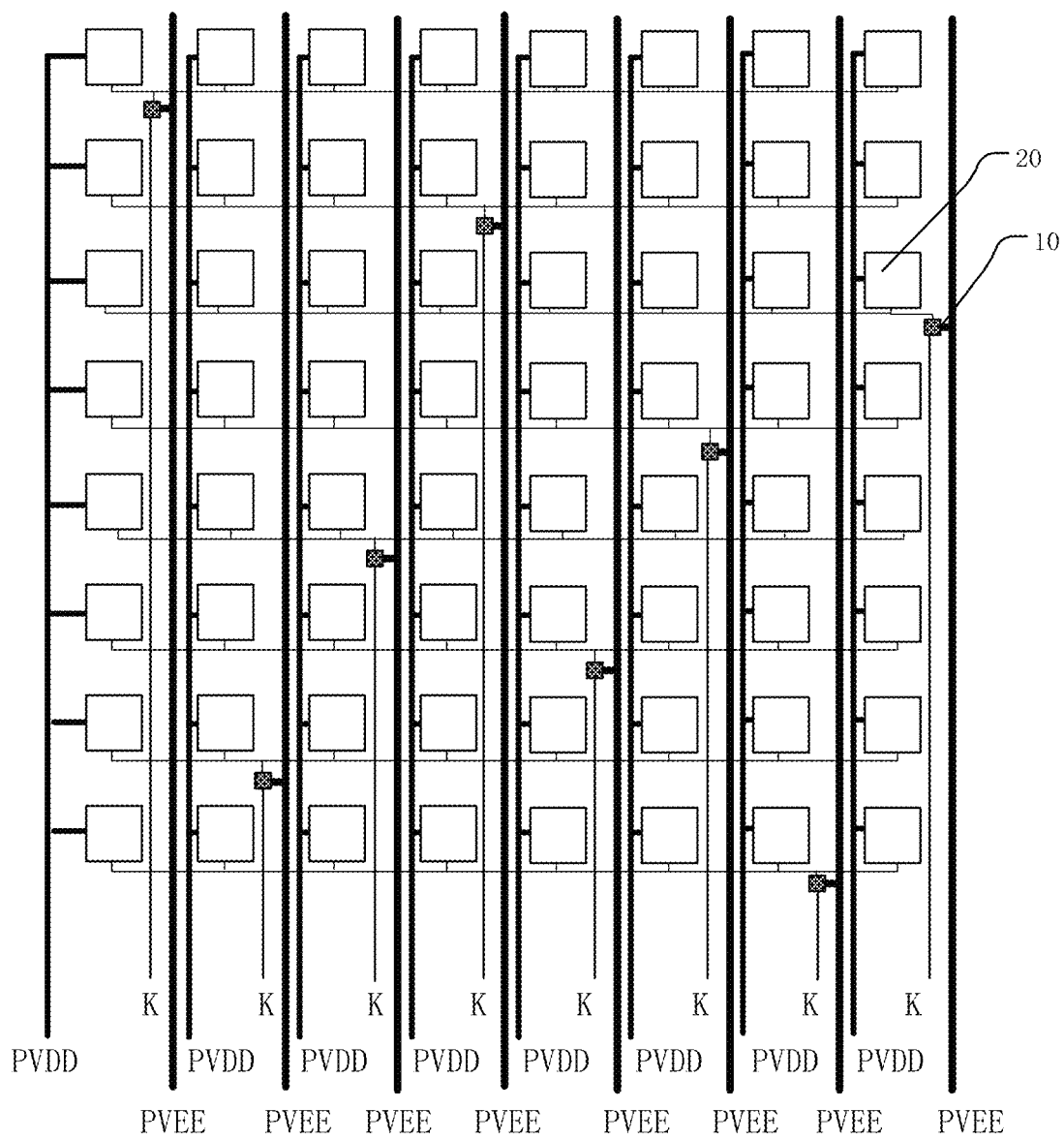
FIG. 43 illustrates a schematic diagram of an electrical connection between light-emitting elements and driving transistors in a local region of an exemplary light-emitting panel in FIG. 42 consistent with disclosed embodiments of the present disclosure.

FIG. 38 illustrates a schematic diagram of another arrangement structure of a repeating unit in a light-emitting panel consistent with disclosed embodiments of the present disclosure; and FIG. 39 illustrates a schematic plane view of the light-emitting panel. FIG. 40 illustrates a schematic diagram of an electrical connection between light-emitting elements and driving transistors in a local region of the light-emitting panel in FIG. 39. FIG. 41 illustrates a schematic diagram of another arrangement structure of a repeating unit in a light-emitting panel consistent with disclosed embodiments of the present disclosure; and FIG. 42 illustrates a schematic plane view of the light-emitting panel. FIG. 43 illustrates a schematic diagram of an electrical connection between light-emitting elements and driving transistors in a local region of the light-emitting panel in FIG. 42.

In certain embodiments, referring to FIGS. 38-40 and FIGS. 41-43, in one repeating unit 000A, the ratio of the quantity of light-emitting elements 20 over the quantity of driving transistors 10 may be 8:1. In one repeating unit 000A, the quantity of light-emitting elements 20 included in the light-emitting element row 20H is M1, and the quantity of light-emitting elements 20 included in the light-emitting element column 20L is N1, where M1=N1=8. Then, the quantity of driving transistors 10 corresponding to one light-emitting element row 20H and/or one light-emitting element column 20L may be equal to one.

The present disclosure may explain that in the repeating unit 000A, the quantity of driving transistors 10 corresponding to one light-emitting element row 20H and/or one light-emitting element column 20L may be equal to one. In other words, the quantity of driving transistors 10 corresponding to one light-emitting element row 20H may be equal to one (not illustrated in the drawings), or the quantity of driving transistors 10 corresponding to one light-emitting element column 20L may be equal to one (not illustrated in the drawings), or both the quantity of driving transistors 10 corresponding to one light-emitting element row 20H and the quantity of driving transistors 10 corresponding to one light-emitting element column 20L may be equal to one (as shown in FIG. 38 and FIG. 41).

In view of this, in one repeating unit 000A, the ratio of the quantity of light-emitting elements 20 over the quantity of driving transistors 10 may be 8:1. In one repeating unit 000A, the quantity of light-emitting elements 20 included in the light-emitting element row 20H is M1, and the quantity of light-emitting elements 20 included in the light-emitting element column 20L is N1, where M1=N1=8. In other words, one repeating unit 000A may include 64 light-emitting elements 20 and 8 driving transistors 10, which may form a light-emitting element array with 8 rows and 8 columns. Then the light-emitting panel 000 including a plurality of the repeating units 000A may be shown in FIG. 39 and FIG. 42, and the ratio of the quantity of light-emitting elements 20 over the quantity of driving transistors 10 may be 8:1. In view of this, in one repeating unit 000A, the quantity of driving transistors 10 corresponding to one light-emitting element column 20L may be one, and the quantity of driving transistors 10 corresponding to one light-emitting element row 20H may be one. In other words, in one repeating unit 000A, both the quantity of driving transistors 10 corresponding to one light-emitting element column 20L and the quantity of driving transistors 10 corresponding to one light-emitting element row 20H may be equal to one. Therefore, the 8 driving transistors may be evenly arranged in the light-emitting element array with 8 rows and 8 columns.

In one repeating unit 000A, one light-emitting element column 20L may correspond to one driving transistor 10, and one light-emitting element row 20H may correspond to one driving transistor 10. Therefore, the quantity of driving transistors 10 that absorb light in each light-emitting element row 20H and each light-emitting element column 20L in one repeating unit 000A may be the same, which may enable desired brightness uniformity, and may facilitate to further improve the distribution uniformity of the driving transistors 10. In the light-emitting panel 000 formed by using the repeating unit 000A, the light-absorbing effect of the driving transistors 10 may be substantially uniform, which may further improve the overall light-emitting uniformity of the light-emitting panel.

Referring to FIG. 40 and FIG. 43, in one embodiment, in one repeating unit 000A, both the quantity of driving transistors 10 corresponding to one light-emitting element row 20H and the quantity of driving transistors 10 corresponding to one light-emitting element column 20L may be equal to one. Therefore, one light-emitting element column 20L may merely correspond to one driving transistor 10. In other words, one light-emitting element column 20L in one repeating unit 000A may merely need to lead out one driving signal line K, which may facilitate to reduce the quantity of the driving signal lines K between adjacent two light-emitting element columns 20L in one repeating unit 000A, may facilitate to the arrangement of the signal lines on the panel, and may avoid the occurrence of a short circuit caused by an excessive number of signal lines between adjacent two light-emitting element columns 20L, thereby improving the product yield.

Figure 44:
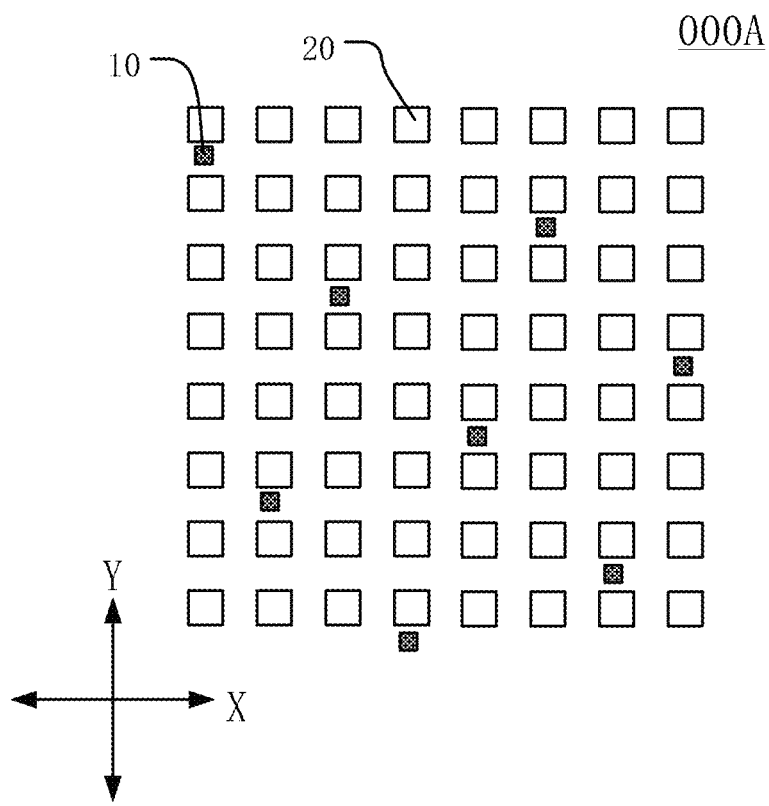
FIG. 44 illustrates a schematic diagram of another arrangement structure of a repeating unit in an exemplary light-emitting panel consistent with disclosed embodiments of the present disclosure.
Figure 45:
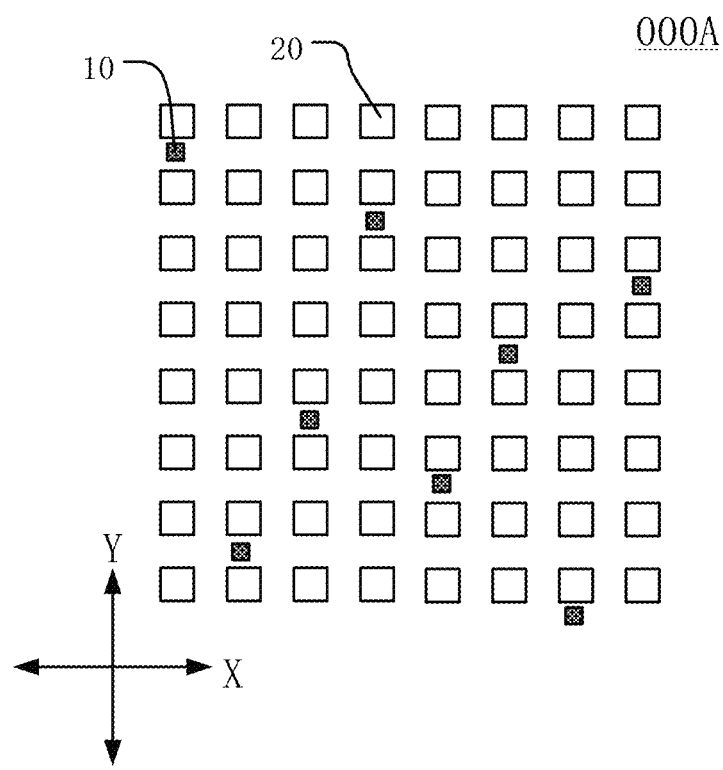
FIG. 45 illustrates a schematic diagram of another arrangement structure of a repeating unit in an exemplary light-emitting panel consistent with disclosed embodiments of the present disclosure.

It should be understood that in one embodiment, in the repeating unit 000A in each of FIG. 38 and FIG. 41, the corresponding one driving transistor 10 may not be in a same light-emitting element row 20H, or may not be in the connection line between multiple light-emitting elements 20 in the same light-emitting element column 20L. FIG. 44 illustrates a schematic diagram of another arrangement structure of a repeating unit in a light-emitting panel consistent with disclosed embodiments of the present disclosure; and FIG. 45 illustrates a schematic diagram of another arrangement structure of a repeating unit in a light-emitting panel consistent with disclosed embodiments of the present disclosure. Referring to FIG. 44 and FIG. 45, the corresponding one driving transistor 10 may be in a same light-emitting element row 20H, or may be in the connection line between multiple light-emitting elements 20 in the same light-emitting element column 20L. In other words, one driving transistor 10 may be located in the same light-emitting element row 20H, or may be located between adjacent two light-emitting elements 20 in the same light-emitting element column 20L. The details may refer to the descriptions of the embodiments associated with FIG. 10, FIG. 13 and FIG. 14 for understanding, which may not be repeated herein.

It should be understood that the present disclosure may merely illustrate two arrangement structures where in one repeating unit 000A, the quantity of light-emitting elements 20 included in the light-emitting element row 20H is M1, and the quantity of light-emitting elements 20 included in the light-emitting element column 20L is N1, where M1=N1=8, and both the quantity of driving transistors corresponding to one light-emitting element row 20H and the quantity of driving transistors corresponding to one light-emitting element column 20L may be one. In specific implementation, the arrangement structure may include while may not be limited to such structure.

In certain embodiments, referring to FIG. 23 and FIG. 27, in one repeating unit 000A, the ratio of the quantity of light-emitting elements 20 over the quantity of driving transistors 10 may be equal to 4:1. Then in the entire light-emitting panel 000 including the plurality of repeating units 000A, the ratio of the quantity of light-emitting elements 20 over the quantity of driving transistors 10 may be equal to 4:1. Referring to FIG. 25, the repeating unit 000A may include 4 light-emitting elements 20, and 1 driving transistors 10, which may form a light-emitting element array with 2 rows and 2 columns, and the light-emitting panel 000 including the plurality of repeating units 000A may be shown in FIG. 23. Referring to FIG. 26, the repeating unit 000A may include 8 light-emitting elements 20, and 2 driving transistors 10, which may form a light-emitting element array with 4 rows and 2 columns, and the light-emitting panel 000 including the plurality of repeating units 000A may be shown in FIG. 27. Therefore, the quantity of driving transistors 10 in the entire light-emitting panel 000 may be further reduced, such that more panel space may be used to dispose the driving transistors 10, which may effectively prevent the lamp shadow problem.

It should be understood that FIG. 24 and FIG. 25 may merely illustrate that in one repeating unit 000A, the quantity of light-emitting elements 20 may be 4, and the quantity of driving transistors may be 1, and FIG. 26 may merely illustrate that in one repeating unit 000A, the quantity of light-emitting elements 20 may be 8, the quantity of driving transistors may be 2, such that the ratio of the quantity of light-emitting elements 20 over the quantity of driving transistors 10 may be 4:1 as an example. In specific implementation, the quantity of light-emitting elements 20 and the quantity of driving transistors 10 included in one repeating unit 000A may not be limited to such values, and may also include other values. For example, in one repeating unit 000A, the quantity of light-emitting elements 20 may be 64, and the quantity of driving transistors 10 may be 16. Alternatively, in one repeating unit 000A, the quantity of light-emitting elements 20 may be 16, and the quantity of driving transistors 10 may be 4. The present disclosure may not specifically limit the quantities of the light-emitting elements and the driving transistors, as long as the light-emitting panel includes the plurality of repeating units 000A, and the ratio of the quantity of light-emitting elements 20 over the quantity of driving transistors 10 in one repeating unit 000A is 4:1.

Figure 46:
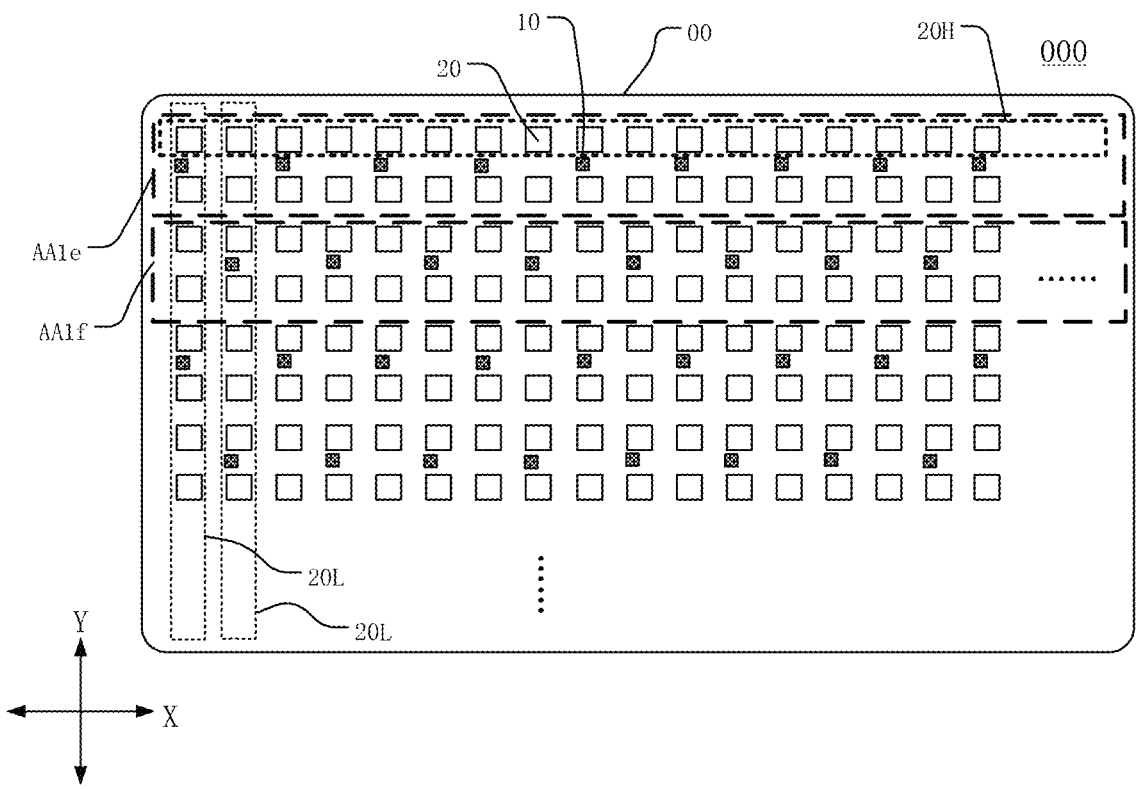
FIG. 46 illustrates a schematic plane view of another exemplary light-emitting panel consistent with disclosed embodiments of the present disclosure.
Figure 47:
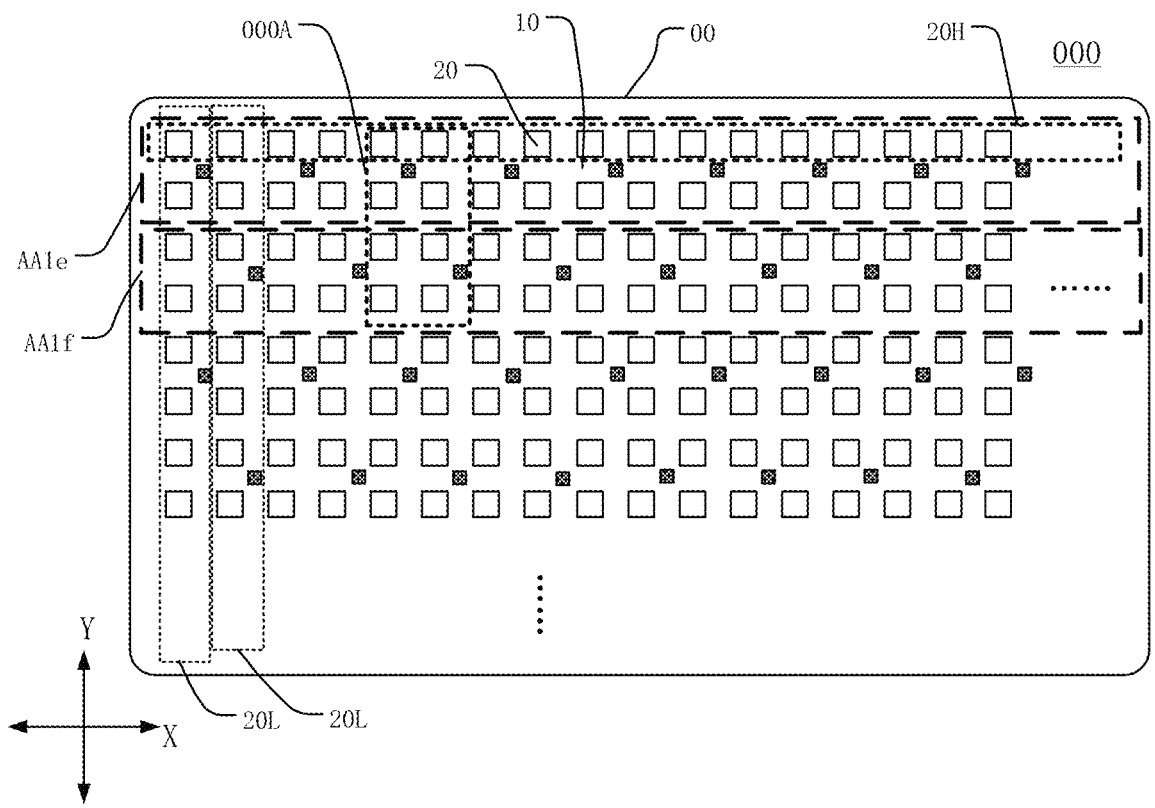
FIG. 47 illustrates a schematic plane view of another exemplary light-emitting panel consistent with disclosed embodiments of the present disclosure.

FIG. 46 illustrates a schematic plane view of another light-emitting panel consistent with disclosed embodiments of the present disclosure; and FIG. 47 illustrates a schematic plane view of another light-emitting panel consistent with disclosed embodiments of the present disclosure. In certain embodiments, referring to FIG. 46 and FIG. 47, the light-emitting panel 000 may include a fifth partition AA1e and a sixth partition AA1f. The fifth partition AA1e may include at least one light-emitting element row 20H, and the sixth partition AA1f may include at least one light-emitting element row 20H. In one embodiment, the fifth partition AA1e may further include a plurality of driving transistors 10, and the sixth partition AA1f may further include a plurality of driving transistors 10. Referring to FIG. 46 and FIG. 47, when one light-emitting element row 20H is regarded as the fifth partition AA1e or the sixth partition AA1f, the fifth partition AA1e or the sixth partition AA1f may include the driving transistor 10.

The fifth partition AA1e and the sixth partition AA1f may be arranged in sequence along the second direction Y. In the fifth partition AA1e, the driving transistor 10 may be located in the odd-numbered light-emitting element column 20L. In the sixth partition AA1f, the driving transistor 10 may be located in the even-numbered light-emitting element column 20L.

It should be understood that in one embodiment, referring to FIG. 46, when one driving transistor 10 is located between adjacent two light-emitting elements 20 and the driving transistor 10 is located on the connection line of multiple light-emitting elements 20 in the same light-emitting element column 20L, in the fifth partition AA1e, the driving transistor 10 being located in the odd-numbered light-emitting element column 20L may refer to that the driving transistor 10 may be located in the position range where the odd-numbered light-emitting element column 20L is located. In another embodiment, referring to FIG. 47, when one driving transistor 10 is located between adjacent two light-emitting elements 20 and the driving transistor 10 is not located on the connection line of multiple light-emitting elements 20 in the same light-emitting element column 20L, the position range of one light-emitting element column 20L may include the region where the light-emitting element column 20L is located and the region between the light-emitting element column 20L and an adjacent light-emitting element column 20L. Therefore, in the fifth partition AA1e, the driving transistor 10 being located in the odd-numbered light-emitting element column 20L may refer to that in the fifth partition AA1e, the driving transistor 10 may be located in the range of the odd-numbered light-emitting element column 20L.

It should be noted that to satisfy that the quantity of driving transistors 10 adjacent to one light-emitting element 20 in the direction parallel to the plane of the base substrate 00 is less than two, when one light-emitting element row 20H forms the fifth partition AA1e and one light-emitting element row 20H forms the sixth partition AA1f, at least one any other light-emitting element row 20H may be located between the fifth partition AA1e formed by one light-emitting element row 20H and the sixth partition AA1f formed by one light-emitting element row 20H. In one embodiment, in the Figures of the present disclosure, two light-emitting element rows 20H may form the fifth partition AA1e, two light-emitting element rows 20H may form the sixth partition AA1f, and both one fifth partition AA1e and one sixth partition AA1f may include multiple driving transistors.

The present disclosure may explain that in one repeating unit 000A of the light-emitting panel 000, the ratio of the quantity of light-emitting elements 20 over the quantity of driving transistors 10 may be 4:1. Then the overall light-emitting elements 20 and driving transistors 10 in the light-emitting panel may have an arrangement structure as shown in FIG. 46 and FIG. 47. In one embodiment, the light-emitting panel 000 may include the fifth partition AA1e and the sixth partition AA1f. The fifth partition AA1e may include at least one light-emitting element row 20H, and the sixth partition AA1f may include at least one light-emitting element row 20H. In one embodiment, both FIG. 46 and FIG. 47 may illustrate that the fifth partition AA1e may include two light-emitting element rows 20H, and the sixth partition AA1f may include two light-emitting element rows 20H as an example. The fifth partition AA1e and the sixth partition AA1f may be arranged in sequence along the second direction Y. In one embodiment, the first and second light-emitting element rows 20H of the light-emitting panel 000 may form the fifth partition AA1e, or the first and second light-emitting element rows 20H of the light-emitting panel 000 may form the sixth partition AA1f, which may not be specifically limited by the present disclosure, as long as the fifth partition AA1e and the sixth partition AA1f are arranged in sequence along the second direction Y.

In view of this, the disposure position of the driving transistor 10 may include that in the fifth partition AA1e, the driving transistor 10 may be located in the odd-numbered light-emitting element column 20L, and in the sixth partition AA1f, the driving transistor 10 may be located in the even-numbered light-emitting element column 20L. In other words, in the two different partitions arranged along the second direction Y, the driving transistors 10 may be located in different light-emitting element columns 20. Therefore, the driving transistors 10 may be staggered in the first direction X, such that the driving transistors 10 may be distributed uniformly as much as possible in the entire light-emitting panel 000. Even if the driving transistors are capable of blocking and absorbing light emitted from the light-emitting elements 20, the driving transistors may absorb and block light as uniformly as possible, which may facilitate to improve the light-emitting uniformity.

Figure 48:
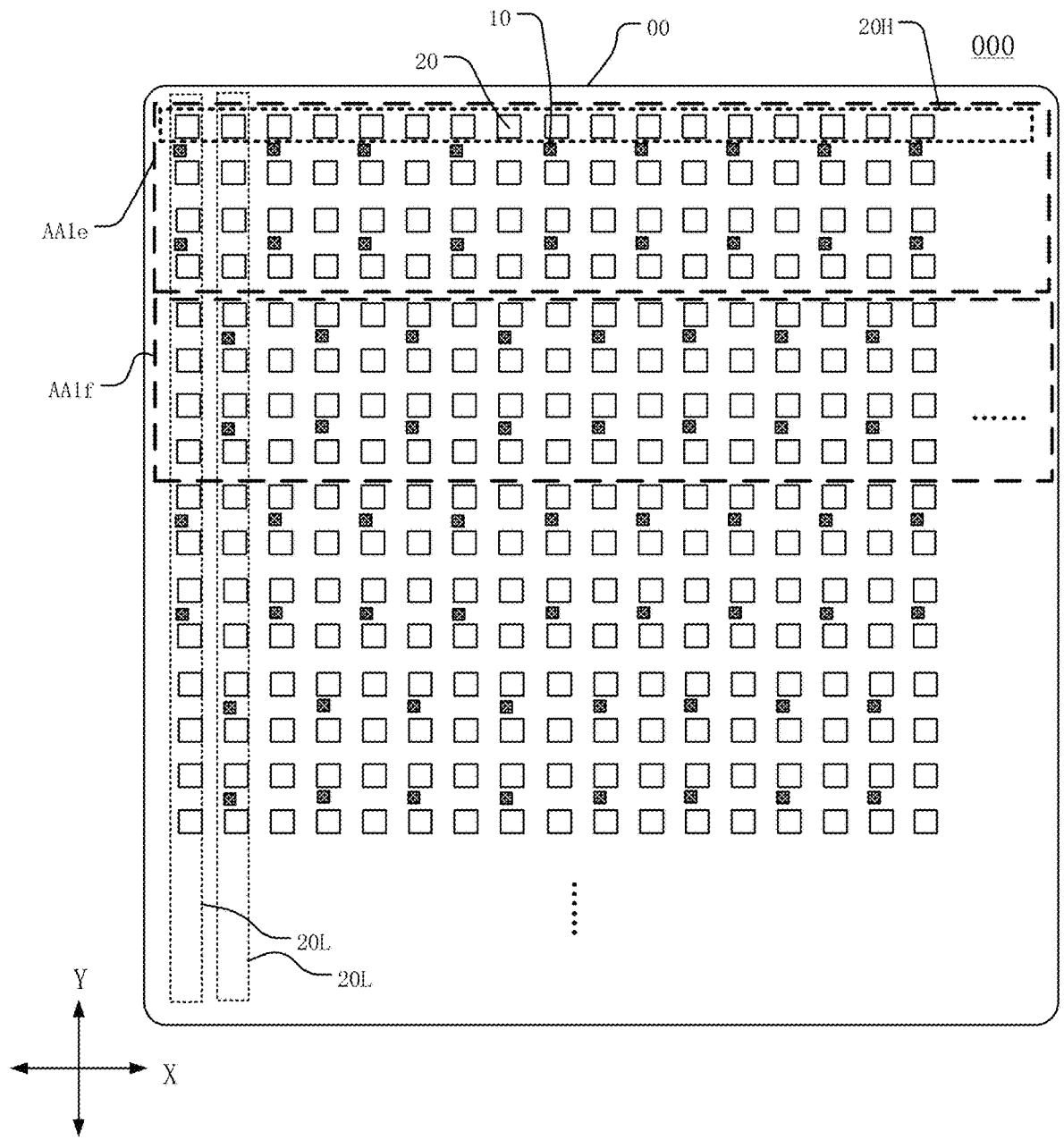
FIG. 48 illustrates a schematic plane view of another exemplary light-emitting panel consistent with disclosed embodiments of the present disclosure.
Figure 49:
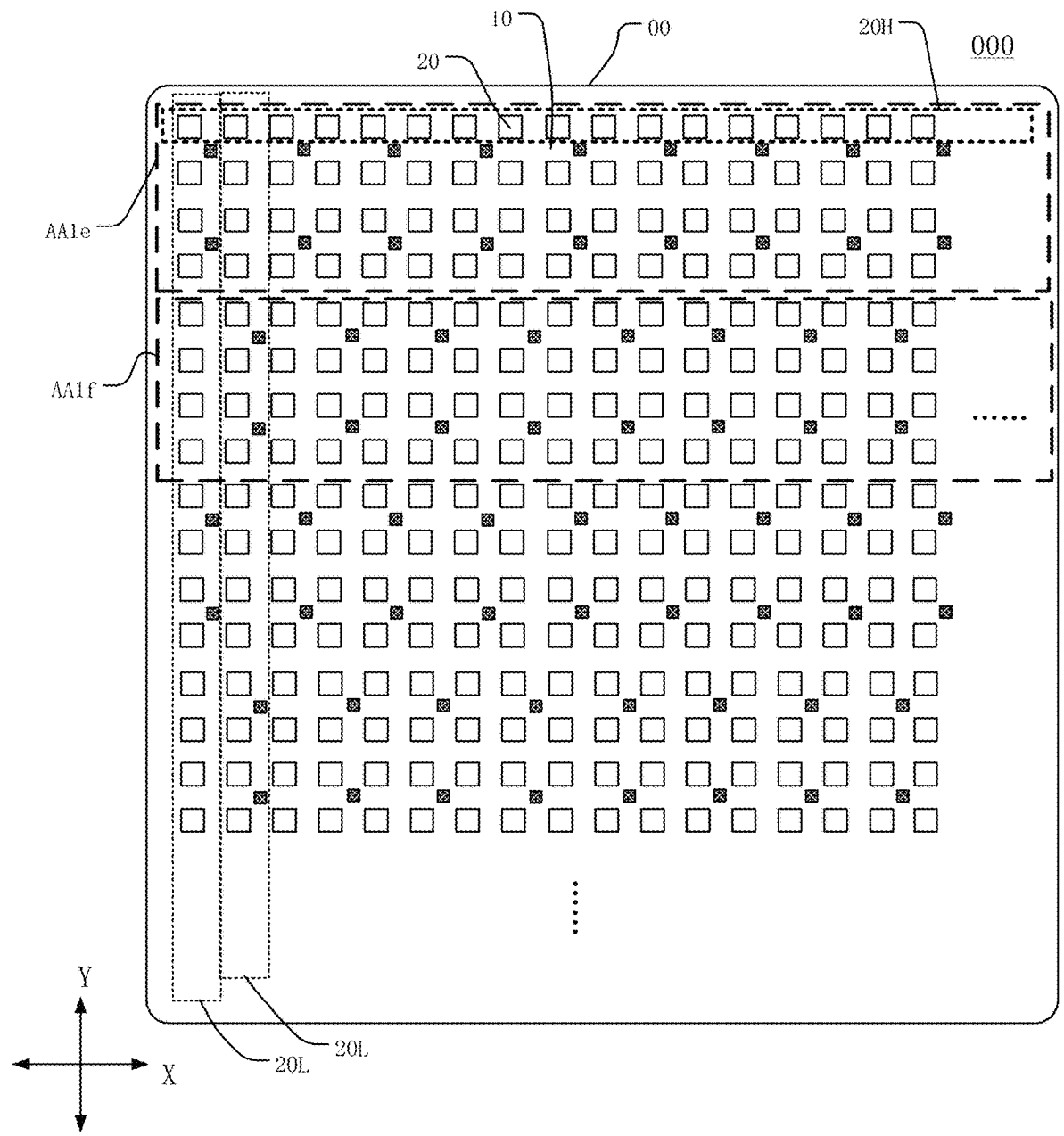
FIG. 49 illustrates a schematic plane view of another exemplary light-emitting panel consistent with disclosed embodiments of the present disclosure.
Figure 50:
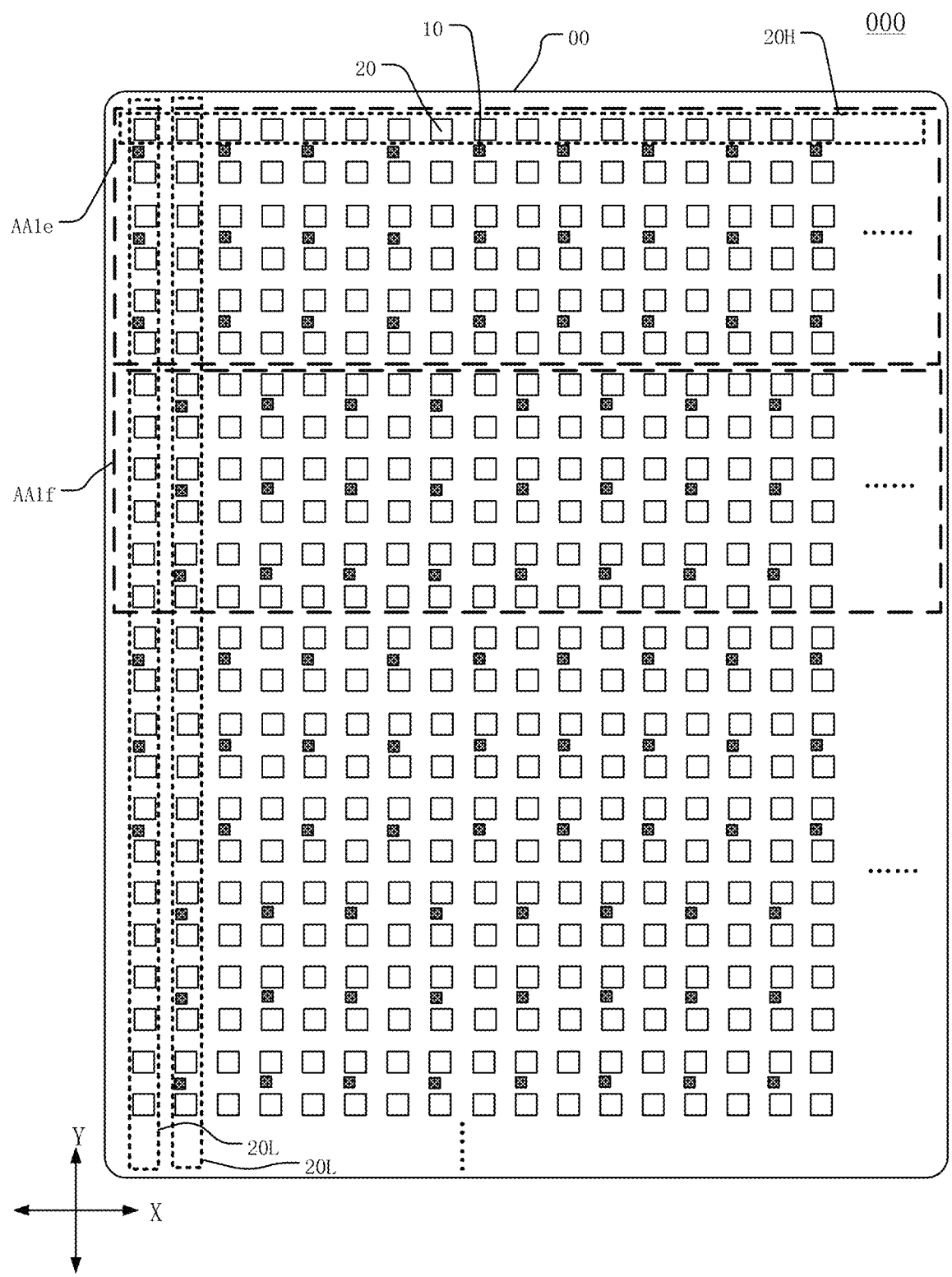
FIG. 50 illustrates a schematic plane view of another exemplary light-emitting panel consistent with disclosed embodiments of the present disclosure.
Figure 51:
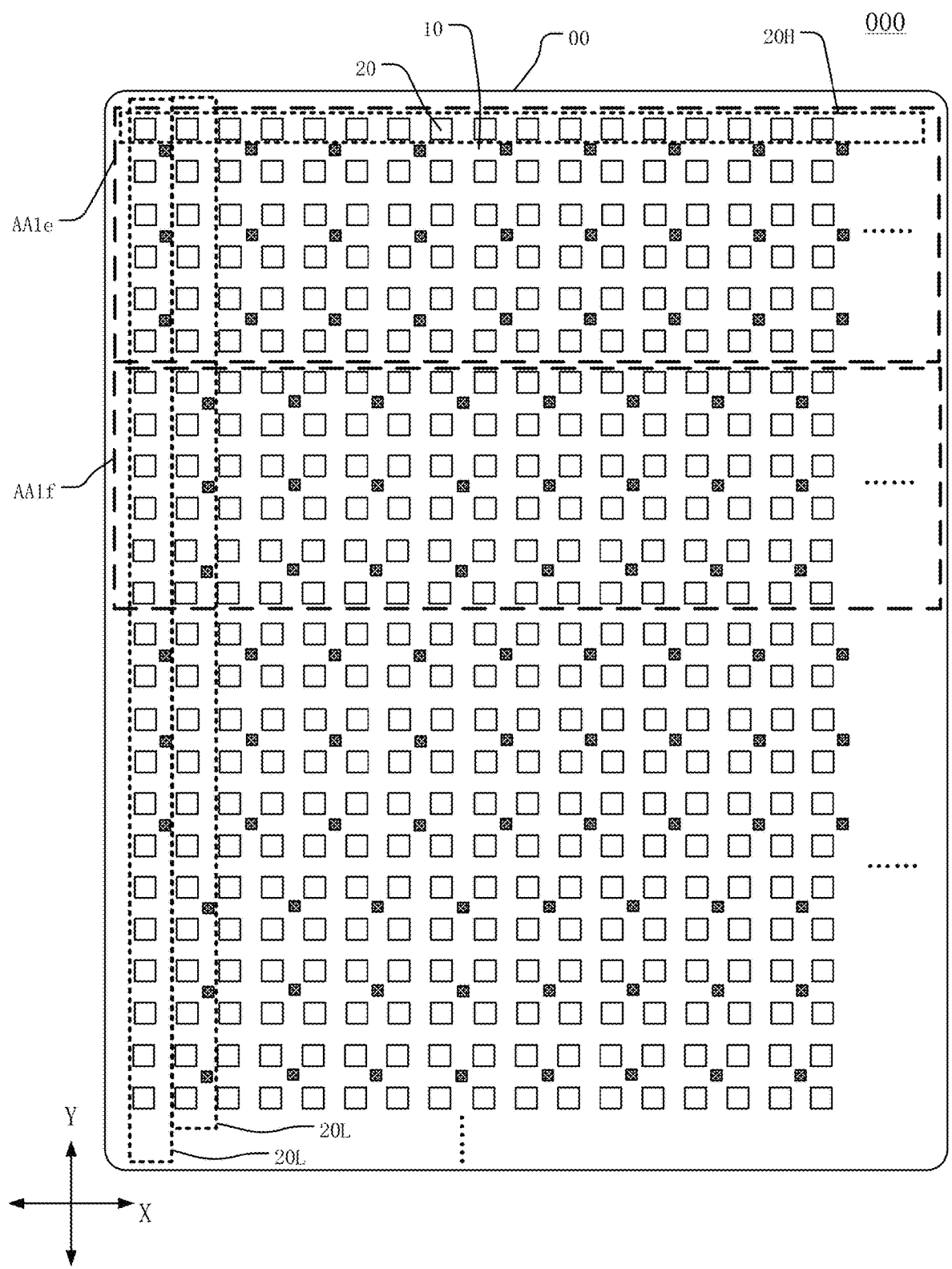
FIG. 51 illustrates a schematic plane view of another exemplary light-emitting panel consistent with disclosed embodiments of the present disclosure.

FIG. 48 illustrates a schematic plane view of another light-emitting panel consistent with disclosed embodiments of the present disclosure; FIG. 49 illustrates a schematic plane view of another light-emitting panel consistent with disclosed embodiments of the present disclosure; FIG. 50 illustrates a schematic plane view of another light-emitting panel consistent with disclosed embodiments of the present disclosure; and FIG. 51 illustrates a schematic plane view of another light-emitting panel consistent with disclosed embodiments of the present disclosure. In one embodiment, referring to FIG. 48 and FIG. 49, the fifth partition AA1e may include four light-emitting element rows 20H, and the sixth partition AA1f may include four light-emitting element rows 20H. In another embodiment, referring to FIG. 50 and FIG. 51, the fifth partition AA1e may include six light-emitting element rows 20H, and the sixth partition AA1f may include six light-emitting element rows 20H. In certain embodiments, both the fifth partition AA1e and the sixth partition AA1f may further include a greater number of light-emitting element rows 20H, which may not be described in detail herein.

It should be understood that FIGS. 46-51 may illustrate that the quantity of light-emitting element rows 20H included in each of the fifth partition AA1e and the sixth partition AA1f may be the same as an example. In specific implementation, the quantity of light-emitting element rows 20H included in each of the fifth partition AA1e and the six-partition AA1f may be different, as long as the quantity of driving transistors 10 adjacent to one light-emitting element 20 in the direction parallel to the plane of the base substrate 00 is less than two, and is capable of preventing the lamp shadow problem.

Figure 52:
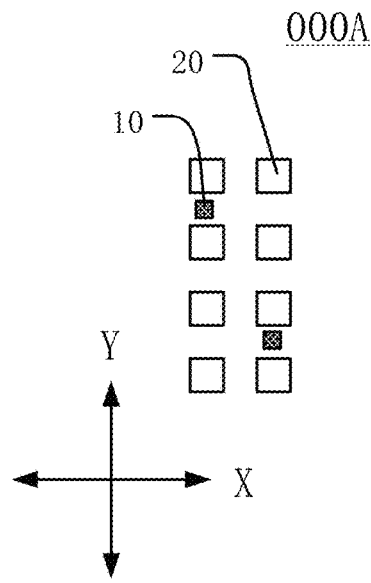
FIG. 52 illustrates a schematic diagram of a repeating unit in an exemplary light-emitting panel in FIG. 46 consistent with disclosed embodiments of the present disclosure.

FIG. 52 illustrates a schematic diagram of a repeating unit in the light-emitting panel in FIG. 46. In certain embodiments, referring to FIG. 46 and FIG. 52, in one repeating unit 000A, the quantity of light-emitting elements 20 included in the light-emitting element row 20H is M3, and the quantity of light-emitting elements 20 included in the light-emitting element column 20L is N3, where M3=2 and N3=4.

The quantity of corresponding driving transistors 10 in the odd-numbered light-emitting element row 20H may be equal to 1, and the quantity of corresponding driving transistors 10 in the even-numbered light-emitting element row 20H may be equal to 0. The quantity of driving transistors 10 corresponding to one light-emitting element column 20L may be equal to 1.

It should be understood that in one embodiment, the quantity of light-emitting elements 20 in one light-emitting element row 20H in one repeating unit 000A may refer to the quantity of light-emitting elements 20 arranged along the first direction X in one repeating unit 000A, and may not refer to the quantity of the light-emitting elements 20 arranged along the first direction X in the entire light-emitting panel 000. The quantity of light-emitting elements 20 in one light-emitting element column 20L in one repeating unit 000A may refer to the quantity of light-emitting elements 20 arranged along the second direction Y in one repeating unit 000A, and may not refer to the quantity of light-emitting elements 20 arranged along the second direction Y in the entire light-emitting panel 000.

The present disclosure may explain that in one repeating unit 000A, when the ratio of the quantity of light-emitting elements 20 over the quantity of driving transistors 10 is 4:1, one repeating unit 000A may include 8 light-emitting elements 20 and 2 driving transistors 10, which may form a light-emitting element array with 4 rows and 2 columns. In other words, in one repeating unit 000A, the quantity (M3) of light-emitting elements 20 included in the light-emitting element row 20H may be two, and the quantity (N3) of the light-emitting elements 20 included in the light-emitting element column 20L may be four. In view of this, the quantity of driving transistors 10 may be two. To satisfy that the quantity of driving transistors 10 adjacent to one light-emitting element 20 in the direction parallel to the plane of the base substrate 00 is less than two, in one repeating unit 000A, one driving transistor 10 may merely be disposed on the corresponding odd-numbered light-emitting element row 20H and the quantity of the driving transistors may be equal to 1, the driving transistor 10 may not be disposed on the even-numbered light-emitting element row 20H, and each of the two light-emitting element columns 20L may correspond to one driving transistor 10. While satisfying that in one repeating unit 000A, the ratio of the quantity of light-emitting elements 20 over the quantity of driving transistors 10 is 4:1, in the light-emitting panel 000 (as shown in FIG. 46) arranged according to the repeating unit 000A in FIG. 52, the quantity of driving transistors 10 adjacent to one light-emitting element 20 may be less than 2, which may facilitate to make the light absorption of the driving transistor 10 more uniform and may further prevent the lamp shadow problem.

Figure 53:
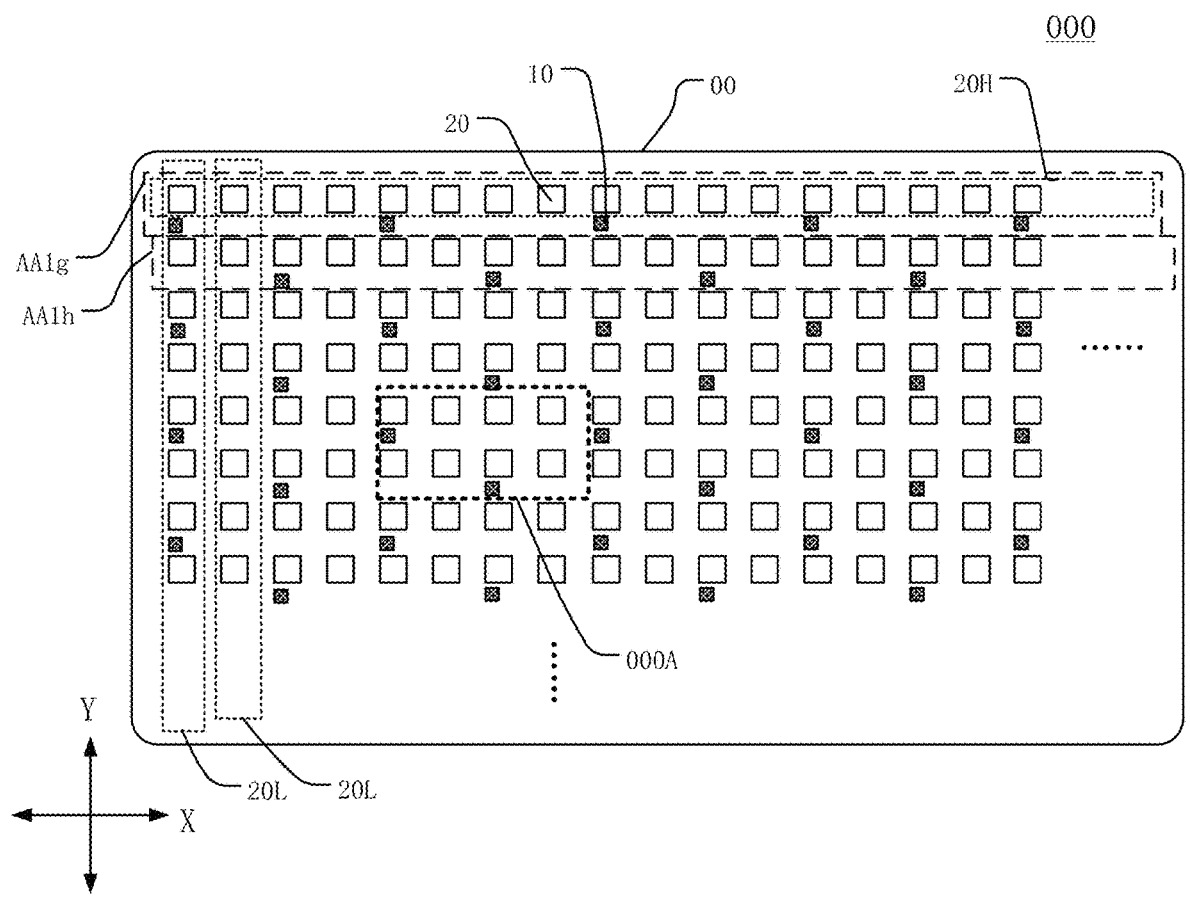
FIG. 53 illustrates a schematic plane view of another exemplary light-emitting panel consistent with disclosed embodiments of the present disclosure.
Figure 54:
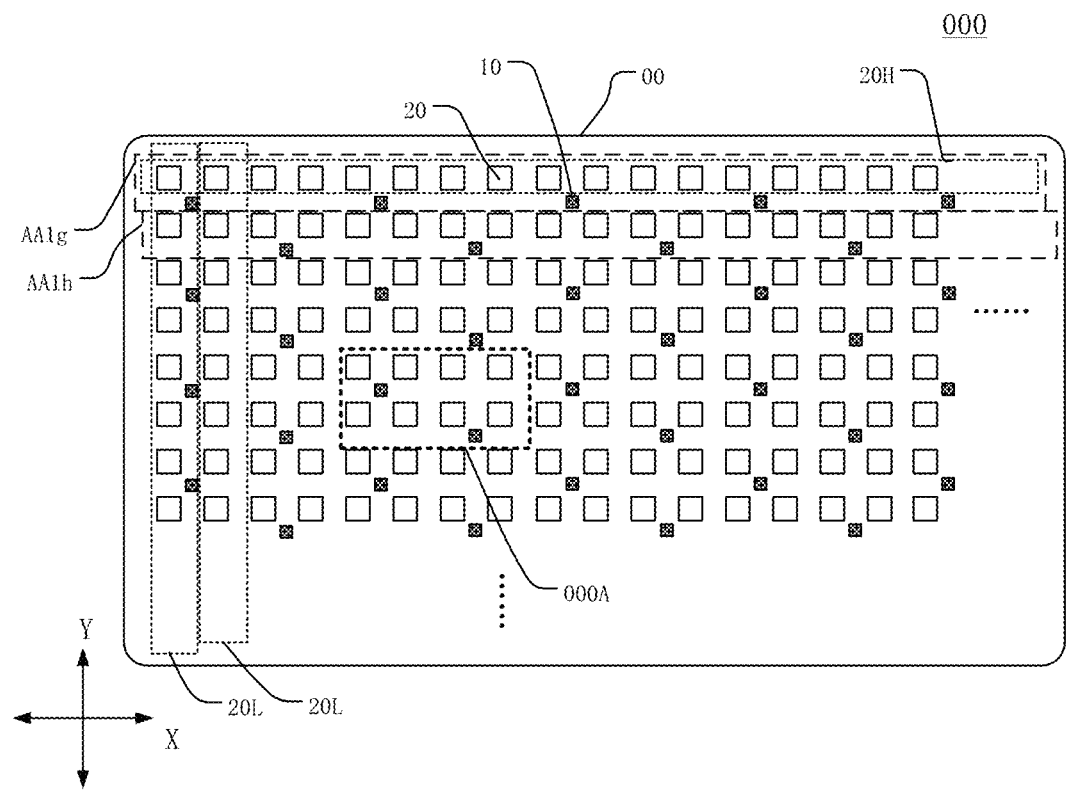
FIG. 54 illustrates a schematic plane view of another exemplary light-emitting panel consistent with disclosed embodiments of the present disclosure.
Figure 55:
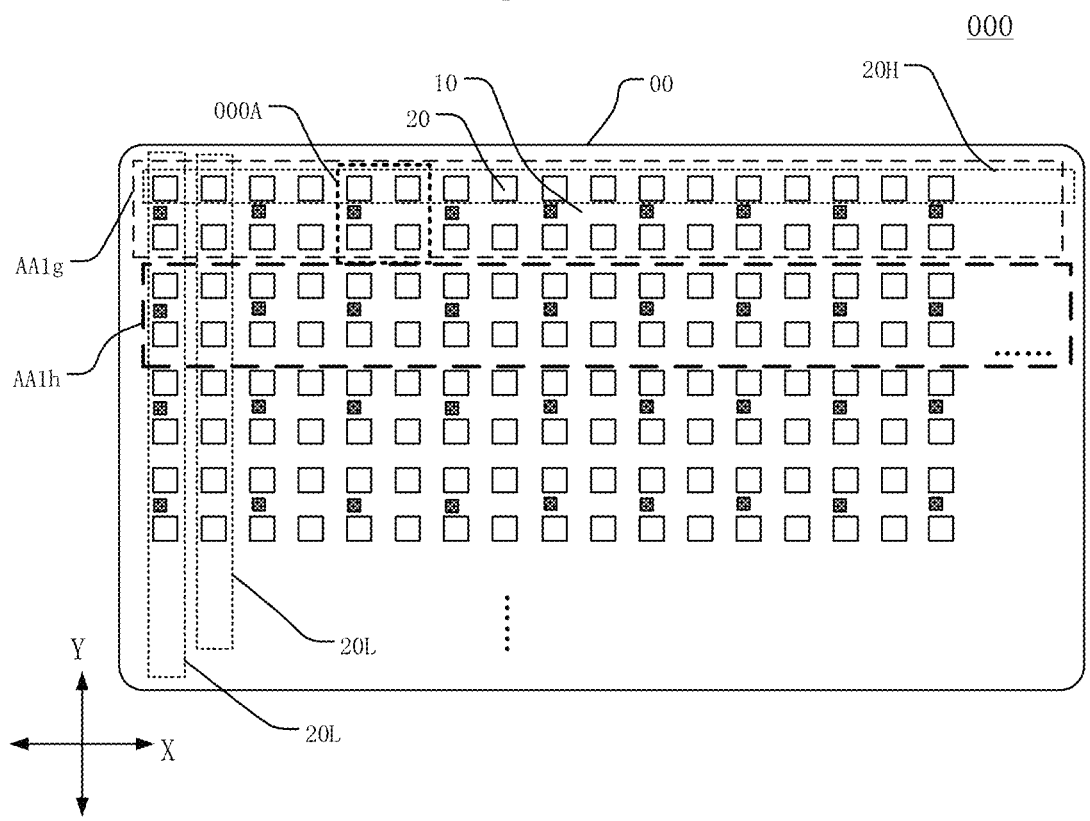
FIG. 55 illustrates a schematic plane view of another exemplary light-emitting panel consistent with disclosed embodiments of the present disclosure.
Figure 56:
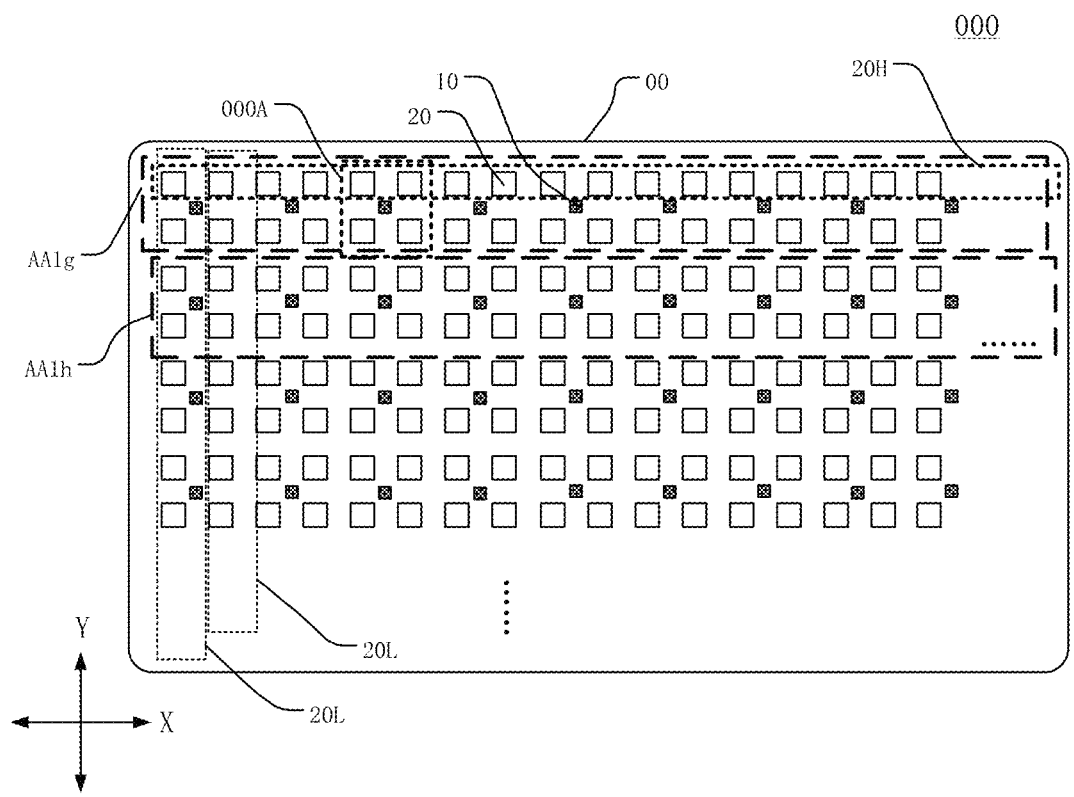
FIG. 56 illustrates a schematic plane view of another exemplary light-emitting panel consistent with disclosed embodiments of the present disclosure.

FIG. 53 illustrates a schematic plane view of another light-emitting panel consistent with disclosed embodiments of the present disclosure; FIG. 54 illustrates a schematic plane view of another light-emitting panel consistent with disclosed embodiments of the present disclosure; FIG. 55 illustrates a schematic plane view of another light-emitting panel consistent with disclosed embodiments of the present disclosure; and FIG. 56 illustrates a schematic plane view of another light-emitting panel consistent with disclosed embodiments of the present disclosure. In one embodiment, referring to FIGS. 53-56, the light-emitting panel 000 may include a seventh partition AA1g and an eighth partition AA1h. The seventh partition AA1g may include at least one light-emitting element row 20H, and the eighth partition AA1h may include at least one light-emitting element row 20H. In one embodiment, the seventh partition AA1g may include multiple driving transistors 10, and the eighth partition AA1h may include multiple driving transistors 10. Referring to FIG. 53 and FIG. 54, when one light-emitting element row 20H is regarded as one seventh partition AA1g or one eighth partition AA1h, the seven partition AA1g or the eighth partition AA1h may include the driving transistor 10.

The seventh partition AA1g and the eighth partition AA1h may be arranged in sequence along the second direction Y. In one embodiment, in the seventh partition AA1g, the driving transistor 10 may be located in the odd-numbered light-emitting element column 20L, and the even-numbered light-emitting element column 20L may not include the driving transistor 10. In another embodiment, in the seventh partition AA1g and the eighth partition AA1h, the driving transistor 10 may be located in the even-numbered light-emitting element column 20L, and the odd-numbered light-emitting element column 20L may not include the driving transistor 10. In other words, in the seventh partition AA1g and the eighth partition AA1h, the driving transistors may not be simultaneously disposed in the adjacent two light-emitting element columns 20L in the seventh partition AA1g and the eighth partition AA1h.

It should be understood that in one embodiment, referring to FIG. 53, when one driving transistor 10 is located between adjacent two light-emitting elements 20 and the driving transistor 10 is located on the connection line of multiple light-emitting elements 20 in the same light-emitting element column 20L, in the seventh partition AA1g and the eighth partition AA1h, the driving transistor 10 being located in the odd-numbered light-emitting element column 20L may refer to that the driving transistor 10 may be located in the position range where the odd-numbered light-emitting element column 20L is located. In another embodiment, referring to FIG. 54, when one driving transistor 10 is located between adjacent two light-emitting elements 20 and the driving transistor 10 is not located on the connection line of multiple light-emitting elements 20 in the same light-emitting element column 20L, the position range of one light-emitting element column 20L may include the region where the light-emitting element column 20L is located and the region between the light-emitting element column 20L and an adjacent light-emitting element column 20L. Therefore, in the seventh partition AA1g and the eighth partition AA1h, the driving transistor 10 being located in the odd-numbered light-emitting element column 20L may refer to that in the seventh partition AA1g and the eighth partition AA1h, the driving transistor 10 may be located in the range of the odd-numbered light-emitting element column 20L.

In one embodiment, referring to FIG. 55 and FIG. 56, two light-emitting element rows 20H may form the seventh partition AA1g, two light-emitting element rows 20H may form the eighth partition AA1h, and both one seventh partition AA1g and one eighth partition AA1h may include multiple driving transistors.

The present disclosure may explain that in one repeating unit 000A of the light-emitting panel 000, the ratio of the quantity of light-emitting elements 20 over the quantity of driving transistors 10 may be 4:1. Then the overall light-emitting elements 20 and driving transistors 10 in the light-emitting panel may have an arrangement structure as shown in FIGS. 53-56. In one embodiment, the light-emitting panel 000 may include the seventh partition AA1g and the eighth partition AA1h. The seventh partition AA1g may include at least one light-emitting element row 20H, and the eighth partition AA1h may include at least one light-emitting element row 20H. In one embodiment, both FIG. 53 and FIG. 54 may illustrate that the seventh partition AA1g may include one light-emitting element rows 20H, and the eighth partition AA1h may include two light-emitting element rows 20H as an example. The seventh partition AA1g and the eighth partition AA1h may be arranged in sequence along the second direction Y. In one embodiment, the first light-emitting element row 20H of the light-emitting panel 000 may form the seventh partition AA1g, or the first light-emitting element row 20H of the light-emitting panel 000 may form the eighth partition AA1h, which may not be specifically limited by the present disclosure, as long as the seventh partition AA1g and the eighth partition AA1h are arranged in sequence along the second direction Y.

In view of this, the disposure position of the driving transistor 10 may include that in the seventh partition AA1g and the eighth partition AA1h, the driving transistor 10 may be located in the odd-numbered light-emitting element column 20L, and may not be disposed in the even-numbered light-emitting element column 20L, as shown in FIGS. 53-56.

Figure 57:
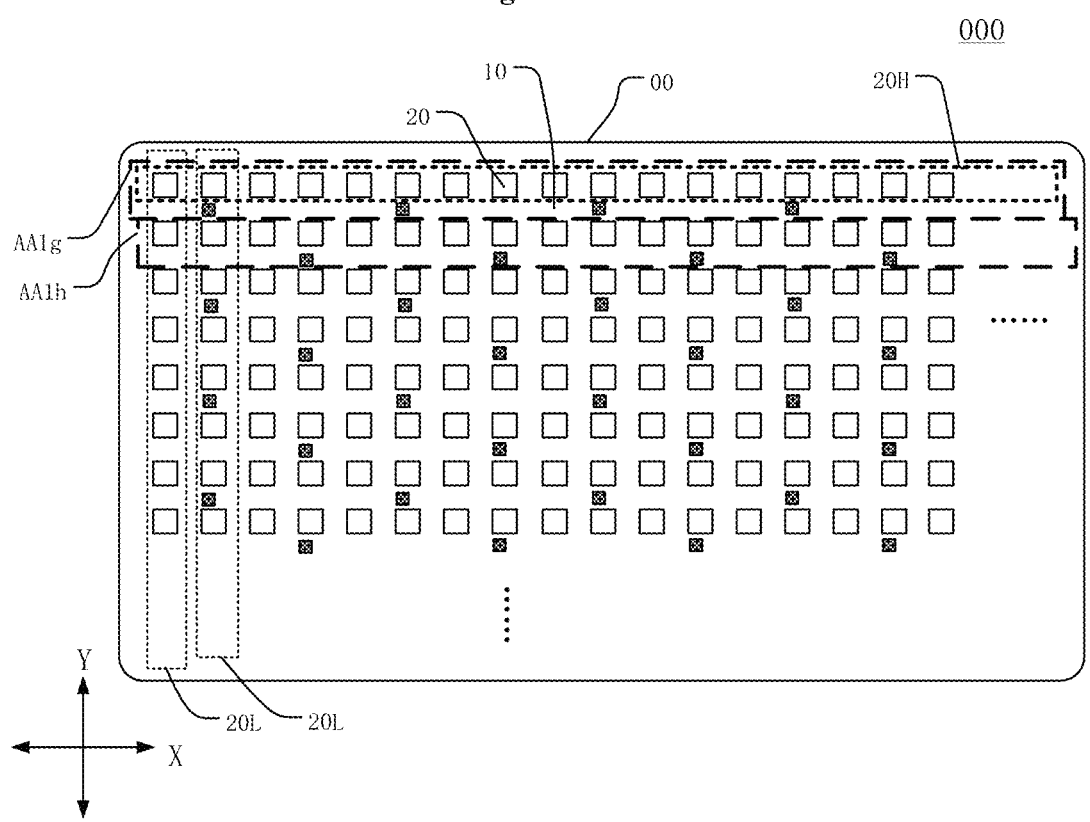
FIG. 57 illustrates a schematic plane view of another exemplary light-emitting panel consistent with disclosed embodiments of the present disclosure.
Figure 58:
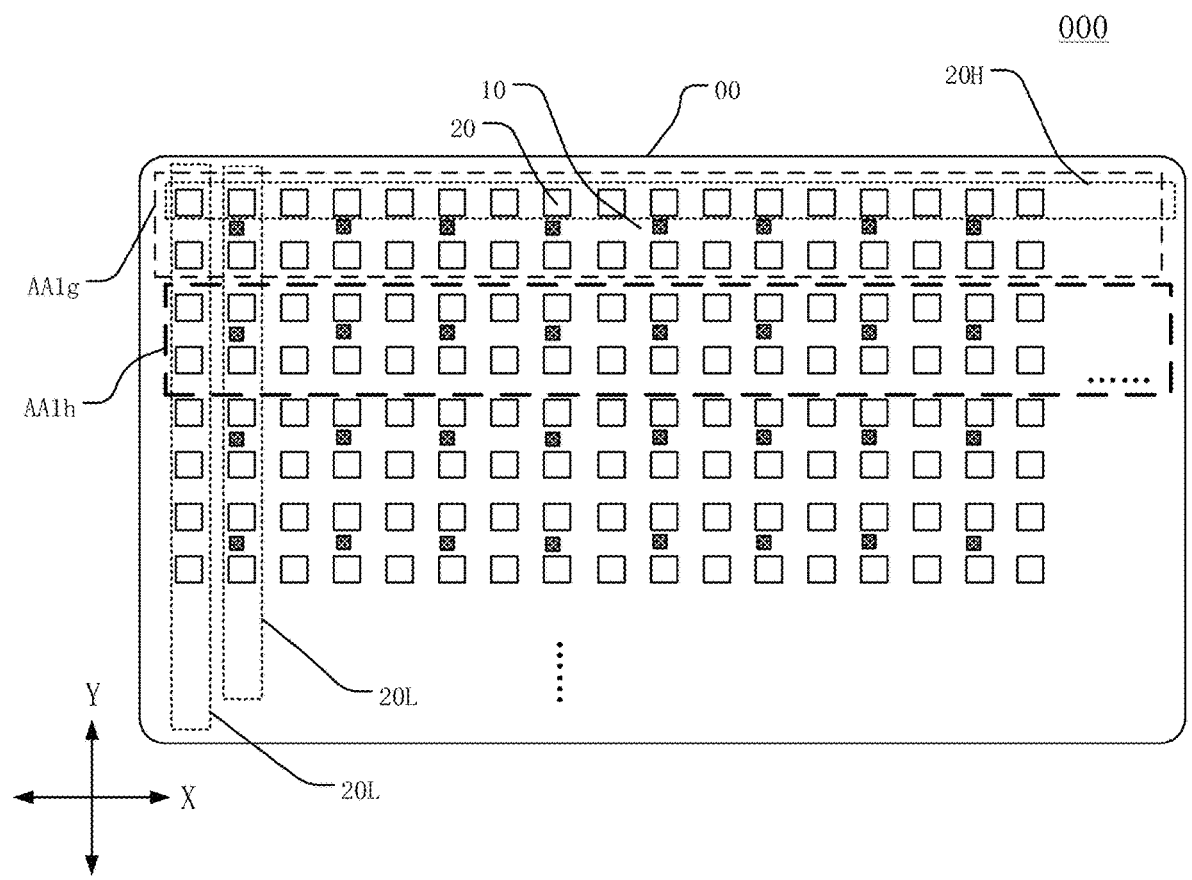
FIG. 58 illustrates a schematic plane view of another exemplary light-emitting panel consistent with disclosed embodiments of the present disclosure.

FIG. 57 illustrates a schematic plane view of another light-emitting panel consistent with disclosed embodiments of the present disclosure; and FIG. 58 illustrates a schematic plane view of another light-emitting panel consistent with disclosed embodiments of the present disclosure. In another embodiment, referring to FIG. 57 and FIG. 58, in the seventh partition AA1g and the eighth partition AA1h, the driving transistor 10 may be located in the even-numbered light-emitting element column 20L, and may not be disposed in the odd-numbered light-emitting element column 20L. Therefore, in the seventh partition AA1g and the eighth partition AA1h, the driving transistors may not be simultaneously disposed in the adjacent two light-emitting element columns 20L in the seventh partition AA1g and the eighth partition AA1h. Thus, the driving transistors 10 may be arranged in sequence in the first direction X, and the quantity of driving transistors 10 in the second direction Y may be as equal as possible, such that the driving transistors 10 may be distributed uniformly as much as possible in the entire light-emitting panel 000. Even if the driving transistors are capable of blocking and absorbing light emitted from the light-emitting elements 20, the driving transistors may absorb and block light as uniformly as possible, which may facilitate to improve the light-emitting uniformity.

It should be understood that FIGS. 53-56 may illustrate that the quantity of light-emitting element rows 20H included in each of the seventh partition AA1g and the eighth partition AA1h may be the same as an example. In specific implementation, the quantity of light-emitting element rows 20H included in each of the seventh partition AA1g and the eighth-partition AA1h may be different, as long as the quantity of driving transistors 10 adjacent to one light-emitting element 20 in the direction parallel to the plane of the base substrate 00 is less than two, which may prevent the lamp shadow problem.

In certain embodiments, referring to FIGS. 24-25 and FIGS. 54-56, in one repeating unit 000A, the quantity of light-emitting elements 20 included in the light-emitting element row 20H is M4, and the quantity of light-emitting elements 20 included in the light-emitting element column 20L is N4, where M4=2 and N4=2.

The quantity of corresponding driving transistors 10 in the one light-emitting element row 20H may be equal to 1, and the quantity of corresponding driving transistors 10 in another adjacent light-emitting element row 20H may be equal to 0. The quantity of driving transistors 10 in one light-emitting element column 20L may be equal to 1, and the quantity of driving transistors 10 in an adjacent light-emitting element column 20L may be equal to 0.

It should be understood that in one embodiment, the quantity of light-emitting elements 20 in one light-emitting element row 20H in one repeating unit 000A may refer to the quantity of light-emitting elements 20 arranged along the first direction X in one repeating unit 000A, and may not refer to the quantity of the light-emitting elements 20 arranged along the first direction X in the entire light-emitting panel 000. The quantity of light-emitting elements 20 in one light-emitting element column 20L in one repeating unit 000A may refer to the quantity of light-emitting elements 20 arranged along the second direction Y in one repeating unit 000A, and may not refer to the quantity of light-emitting elements 20 arranged along the second direction Y in the entire light-emitting panel 000.

The present disclosure may explain that in one repeating unit 000A, when the ratio of the quantity of light-emitting elements 20 over the quantity of driving transistors 10 is 4:1, one repeating unit 000A may include 4 light-emitting elements 20 and 1 driving transistor 10, which may form a light-emitting element array with 2 rows and 2 columns. In other words, in one repeating unit 000A, the quantity (M4) of light-emitting elements 20 included in the light-emitting element row 20H may be two, and the quantity (N4) of the light-emitting elements 20 included in the light-emitting element column 20L may be two. In view of this, the quantity of driving transistors 10 may be one. To satisfy that the quantity of driving transistors 10 adjacent to one light-emitting element 20 in the direction parallel to the plane of the base substrate 00 is less than two, in one repeating unit 000A, one driving transistor 10 may merely be disposed on one light-emitting element row 20H, and the driving transistor 10 may not be disposed on another one light-emitting element row 20H. Further, one driving transistor 10 may merely be disposed on one light-emitting element column 20L, and the driving transistor 10 may not be disposed on another one light-emitting element column 20L.

While satisfying that in one repeating unit 000A, the ratio of the quantity of light-emitting elements 20 over the quantity of driving transistors 10 is 4:1, in the light-emitting panel 000 (as shown in FIG. 54 and FIG. 56) arranged according to the repeating unit 000A in FIG. 24 and FIG. 25, the quantity of driving transistors 10 adjacent to one light-emitting element 20 may be less than two, which may facilitate to make the light absorption of the driving transistor 10 more uniform and may further prevent the lamp shadow problem.

Figure 59:
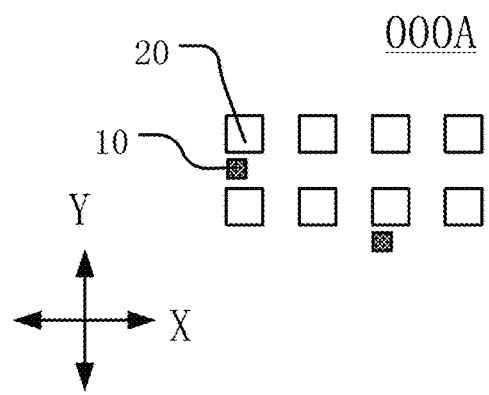
FIG. 59 illustrates a schematic diagram of a repeating unit in an exemplary light-emitting panel in FIG. 53 consistent with disclosed embodiments of the present disclosure.
Figure 60:
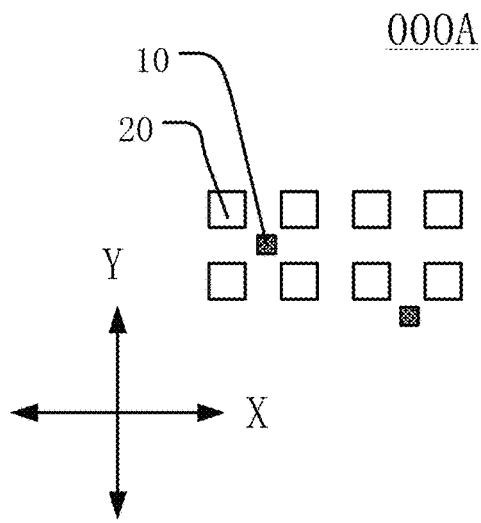
FIG. 60 illustrates a schematic diagram of a repeating unit in an exemplary light-emitting panel in FIG. 54 consistent with disclosed embodiments of the present disclosure.

FIG. 59 illustrates a schematic diagram of a repeating unit in the light-emitting panel in FIG. 53; and FIG. 60 illustrates a schematic diagram of a repeating unit in the light-emitting panel in FIG. 54. In certain embodiments, referring to FIGS. 53-54 and FIGS. 59-60, in one repeating unit 000A, the quantity of light-emitting elements 20 included in the light-emitting element row 20H is M5, and the quantity of light-emitting elements 20 included in the light-emitting element column 20L is N5, where M5=4 and N5=2.

The quantity of corresponding driving transistors 10 in the even-numbered light-emitting element column 20L may be equal to 1, and the quantity of corresponding driving transistors 10 in even-numbered light-emitting element column 20L may be equal to 0. The quantity of driving transistors 10 in each light-emitting element row 20H may be equal to 1.

It should be understood that in one embodiment, the quantity of light-emitting elements 20 in one light-emitting element row 20H in one repeating unit 000A may refer to the quantity of light-emitting elements 20 arranged along the first direction X in one repeating unit 000A, and may not refer to the quantity of the light-emitting elements 20 arranged along the first direction X in the entire light-emitting panel 000. The quantity of light-emitting elements 20 in one light-emitting element column 20L in one repeating unit 000A may refer to the quantity of light-emitting elements 20 arranged along the second direction Y in one repeating unit 000A, and may not refer to the quantity of light-emitting elements 20 arranged along the second direction Y in the entire light-emitting panel 000.

The present disclosure may explain that in one repeating unit 000A, when the ratio of the quantity of light-emitting elements 20 over the quantity of driving transistors 10 is 4:1, one repeating unit 000A may include 8 light-emitting elements 20 and 2 driving transistors 10, which may form a light-emitting element array with 2 rows and 4 columns. In other words, in one repeating unit 000A, the quantity (M5) of light-emitting elements 20 included in the light-emitting element row 20H may be four, and the quantity (N5) of the light-emitting elements 20 included in the light-emitting element column 20L may be two. In view of this, the quantity of driving transistors 10 may be two. To satisfy that the quantity of driving transistors 10 adjacent to one light-emitting element 20 in the direction parallel to the plane of the base substrate 00 is less than two, in one repeating unit 000A, in the light-emitting element array with 2 rows and 4 columns, one driving transistor 10 may merely be disposed on the odd-numbered light-emitting element column 20L, and the driving transistor 10 may not be disposed on the even-numbered light-emitting element column 20L (as shown in FIG. 59 and FIG. 60). In another embodiment, one driving transistor 10 may merely be disposed on the even-numbered light-emitting element column 20L, and the driving transistor 10 may not be disposed on the odd-numbered light-emitting element column 20L (not shown in the drawings). Further, one driving transistor 10 may be disposed on each light-emitting element row 20H.

While satisfying that in one repeating unit 000A, the ratio of the quantity of light-emitting elements 20 over the quantity of driving transistors 10 is 4:1, in the light-emitting panel 000 (as shown in FIG. 53 and FIG. 54) arranged according to the repeating unit 000A in FIG. 59 and FIG. 60, the quantity of driving transistors 10 adjacent to one light-emitting element 20 may be less than two, which may facilitate to make the light absorption of the driving transistor 10 more uniform and may further prevent the lamp shadow problem.

In certain embodiments, referring to FIGS. 38-39 and FIGS. 41-42, the plurality of repeating units 000A included in the light-emitting panel 000 may be arranged to form one or more repeating unit rows 000AH along the first direction X, and to form one or more repeating unit columns 000AL along the second direction Y. In other words, the arrangement of the driving transistors 10 in each repeating unit 000A included in the light-emitting panel 000 may be the same, such that the display may be substantially uniform.

Figure 61:
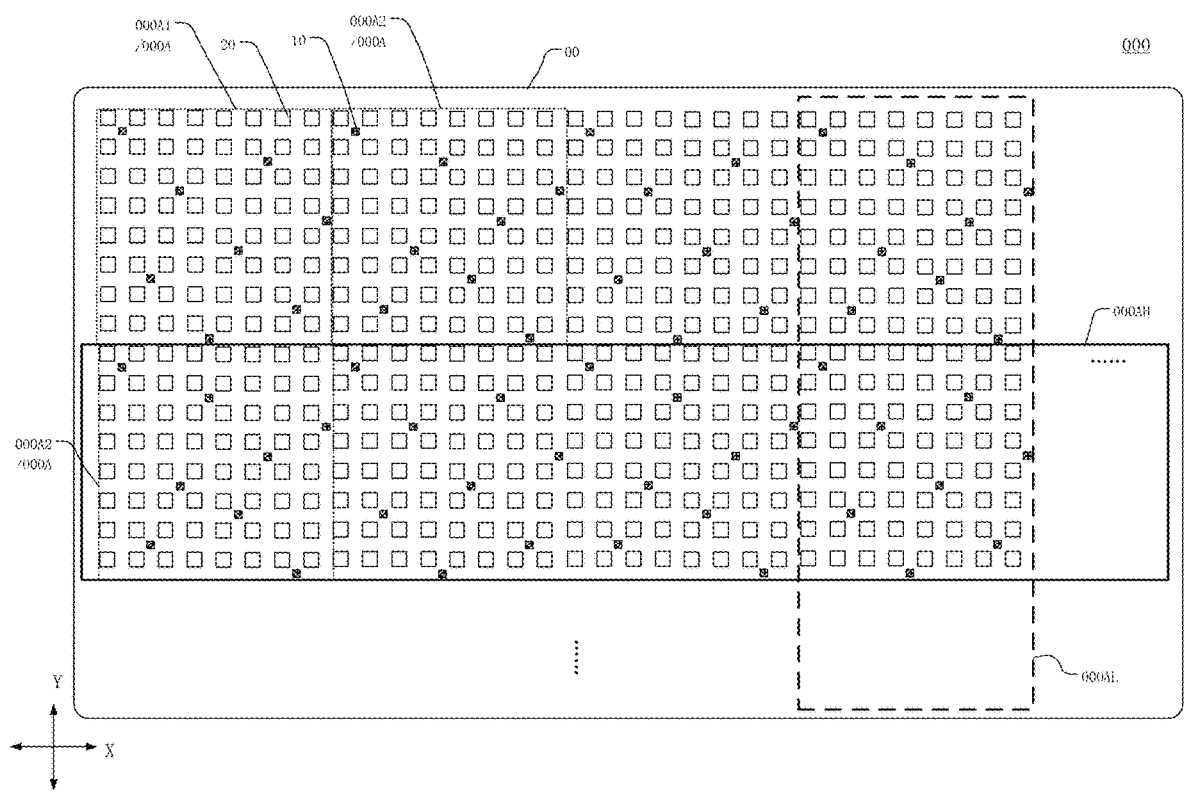
FIG. 61 illustrates a schematic plane view of another exemplary light-emitting panel consistent with disclosed embodiments of the present disclosure.

FIG. 61 illustrates a schematic plane view of another light-emitting panel consistent with disclosed embodiments of the present disclosure. The arrangement structure of the repeating units shown in FIG. 61 may be understood as the structure of staggered arrangement of multiple repeating units described in the embodiments associated with FIGS. 21-27. In certain embodiments, referring to FIGS. 38-39 and FIG. 61, the arrangement of the driving transistors 10 in at least two repeating units 000A of the plurality of repeating units 000A included in the light-emitting panel 000 may be different. Referring to FIG. 61, one repeating unit row 000AH may include at least two repeating units 000A (the repeating unit 000A1 and repeating unit 000A2) having the structures of the repeating units 000A shown in FIG. 38 and FIG. 41, respectively. In another embodiment, one repeating unit column 000AL may include at least two repeating units 000A (repeating unit 000A1 and repeating unit 000A2) having the structures of repeating units 000A shown in FIG. 38 and FIG. 41, respectively. In certain embodiments, one repeating unit row 000AH may include at least two repeating units 000A having the structures of the repeating units 000A shown in FIG. 38 and FIG. 41, respectively; and one repeating unit column 000AL may include at least two repeating units 000A having the structure of repeating units 000A shown in FIG. 38 and FIG. 41, respectively. In other words, although the light-emitting panel 000 is formed by arranging different repeating units 000A, the arrangement structure of the driving transistors 10 in the plurality of repeating units 000A may be different, which may facilitate to further make the driving transistors 10 be dispersed to prevent the lamp shadow problem.

In one embodiment, referring to FIG. 3, in the direction parallel to the plane of the base substrate 00, a distance D between the adjacent driving transistor 10 and light-emitting element 20 may be greater than or equal to 1 mm. It should be understood that, in the direction parallel to the plane of the base substrate 00, the distance between the adjacent driving transistor 10 and the light-emitting element 20 may be understood as a distance between an edge of the orthographic projection pattern of the driving transistor 10 to the base substrate 00 and an edge of the orthographic projection pattern of the light-emitting element 20 closest to the driving transistor 10 to the base substrate 00.

The present disclosure may explain that the quantity of driving transistors 10 adjacent to one light-emitting element 20 in the direction parallel to the plane of the base substrate 00 may be less than 2. By improving the relative position of the driving transistor 10 and the light-emitting element 20, the driving transistors 10 may be prevented from being clustered in a local region. While avoiding the existence of multiple driving transistors 10 around one light-emitting element 20 to block light, in the direction parallel to the plane of the base substrate 00, when there is one driving transistor 10 around the light-emitting element 20, the distance D between the adjacent driving transistor 10 and light-emitting element 20 may be greater than or equal to 1 mm. Therefore, the distance between the driving transistor 10 and the light-emitting element 20 may be as far as possible, which may facilitate to effectively reduce the influence of the driving transistor 10 on the light path of the light-emitting element 20, thereby preventing the lamp shadow problem caused by too low brightness in local region of the light-emitting panel 000, and improving the light-emitting quality of the light-emitting panel.

In certain embodiments, in a direction parallel to the plane of the base substrate 00, the distance D between the adjacent driving transistor 10 and the light-emitting element 20 may be less than 1 mm. It should be understood that in the direction parallel to the plane of the base substrate 00, the distance between the adjacent driving transistor 10 and the light-emitting element 20 may be understood as a distance between an edge of the orthographic projection pattern of the driving transistor 10 to the base substrate 00 and an edge of the orthographic projection pattern of the light-emitting element 20 closest to the driving transistor 10 to the base substrate 00. Because the dimensions of the light-emitting element 20 and the driving transistor 10 vary, the distance D between the adjacent driving transistor 10 and the light-emitting element 20 may be further reduced to less than 1 mm, as long as the lamp shadow problem caused by too low brightness in local region of the light-emitting panel 000 may be prevented, and the light-emitting quality of the light-emitting panel may be improved.

In certain embodiments, referring to FIG. 3, in the direction parallel to the plane of the base substrate 00, the distance between adjacent two driving transistors 10 may be D1, and the distance between adjacent two light-emitting elements 20 may be D2, where D1≥D2. It should be understood that when the shape of the orthographic projection of each of the driving transistor 10 and the light-emitting element 20 to the base substrate 00 is a regular pattern, in the direction parallel to the plane of the base substrate 00, the distance between adjacent two driving transistors 10 may be understood as the distance between the geometric centers of the orthographic projections of adjacent two driving transistors 10 to the base substrate 00, and the distance between adjacent two light-emitting elements 20 may be understood as the distance between geometric centers of the orthographic projections of the adjacent two light-emitting elements 20 to the base substrate 00.

The present disclosure may explain that the quantity of the driving transistors 10 adjacent to one light-emitting element 20 in the direction parallel to the plane of the base substrate 00 may be less than 2. By improving the relative position of the driving transistor 10 and the light-emitting element 20, the driving transistors 10 may be prevented from being clustered in a local region. While avoiding the existence of multiple driving transistors 10 around one light-emitting element 20 to block light, in the direction parallel to the plane of the base substrate 00, the distance between adjacent two driving transistors 10 may be D1, and the distance between adjacent two light-emitting elements 20 may be D2, where D1≥D2. Therefore, the distance between the adjacent two driving transistors 10 may be as large as possible. Thus, the driving transistors 10 may be prevented from being clustered in a local region, the quantity of driving transistors 10 around the light-emitting element 20 in a certain region may be prevented from being substantially large, and the phenomenon of serious light absorption in the certain region when the panel is lit may be prevented, which may facilitate to improve the light-emitting uniformity of the light-emitting panel and to improve the light-emitting quality.

Figure 62:
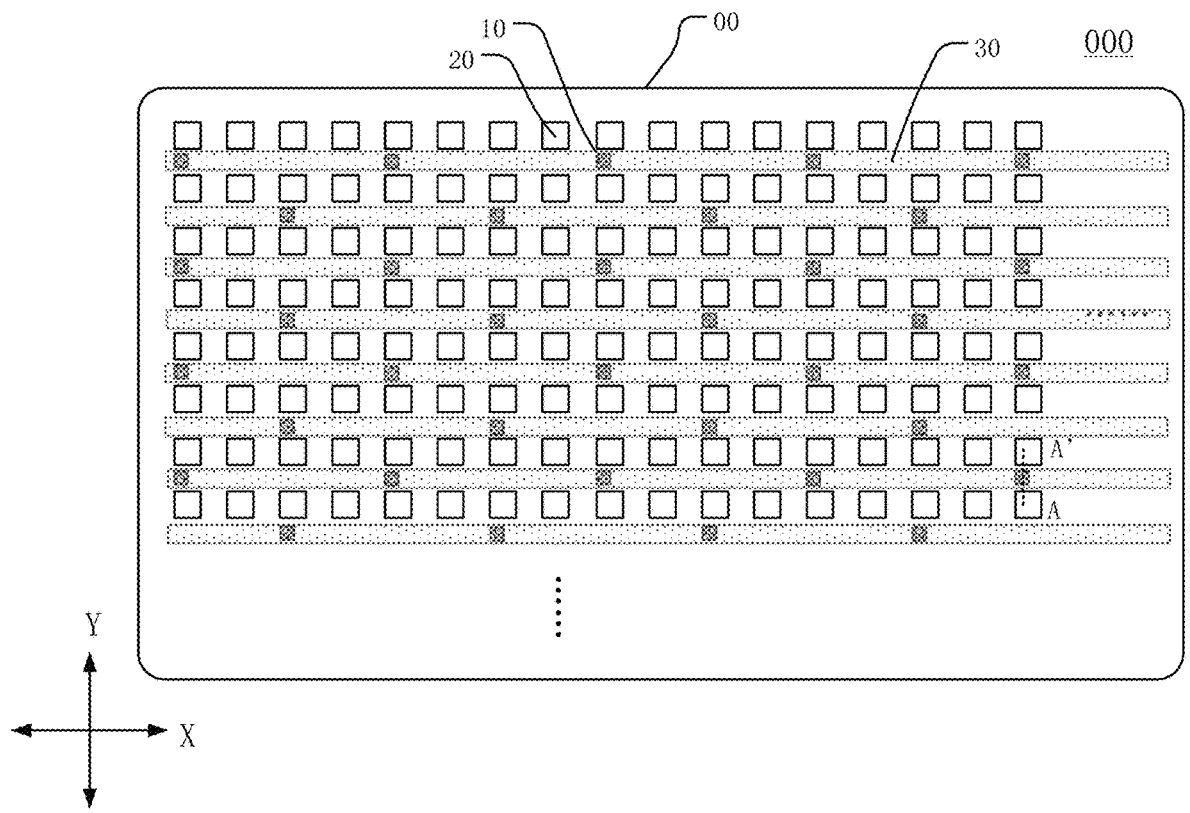
FIG. 62 illustrates a schematic plane view of another exemplary light-emitting panel consistent with disclosed embodiments of the present disclosure.
Figure 63:
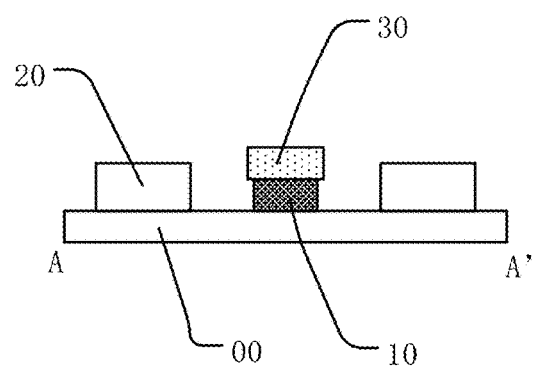
FIG. 63 illustrates an A-A' sectional view of an exemplary light-emitting panel in FIG. 62 consistent with disclosed embodiments of the present disclosure.

FIG. 62 illustrates a schematic plane view of another light-emitting panel consistent with disclosed embodiments of the present disclosure; and FIG. 63 illustrates an A-A' sectional view of the light-emitting panel in FIG. 62. It should be understood that to clearly illustrate the structure of the present disclosure, FIG. 62 may perform transparency filling. In one embodiment, referring to FIG. 62 and FIG. 63, the light-emitting panel 000 may further include a shielding adhesive 30 over the base substrate 00. In the direction Z perpendicular to the plane of the base substrate 00, the shielding adhesive 30 may overlap the driving transistor 10.

The present disclosure may explain that the light-emitting panel 000 may further include a shielding adhesive 30 over the base substrate 00, and the shielding adhesive 30 may be located on the side of the driving transistor 10 away from the base substrate 00. In the direction Z perpendicular to the plane of the base substrate 00, the shielding adhesive 30 may overlap the driving transistor 10. The shielding adhesive 30 may be a white adhesive with a reflective function, which may protect the surface of the driving transistor 10 and may reflect back the light on the transmission light path of the light-emitting element 20 while reducing the light crosstalk between adjacent light-emitting elements 20. The driving transistor 10 on the light path of the light-emitting element 20 may be prevented from blocking the light or absorbing the light, and the driving transistor 10 may be prevented from the serious light absorption phenomenon in local region when the panel is lit, which may facilitate to improve the light-emitting uniformity of the light-emitting panel.

Figure 64:
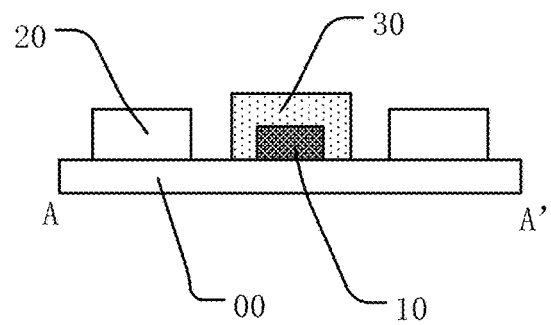
FIG. 64 illustrates another A-A' sectional view of an exemplary light-emitting panel in FIG. 62 consistent with disclosed embodiments of the present disclosure.

FIG. 62 illustrates a schematic plane view of another light-emitting panel consistent with disclosed embodiments of the present disclosure; and FIG. 64 illustrates an A-A' sectional view of the light-emitting panel in FIG. 62. In one embodiment, referring to FIG. 62 and FIG. 64, in the light-emitting panel 000, the base substrate 00 may further include the shielding adhesive 30. In the direction Z perpendicular to the plane of the base substrate 00, the shielding adhesive 30 may cover the driving transistor 10. In other words, in one embodiment, the shielding adhesive 30 may fully cover the driving transistor 10, and the shielding adhesive 30 may be a white adhesive with a reflective function, which may effectively protect the top and sidewall surfaces of the driving transistor 10. While reducing the light crosstalk between adjacent light-emitting elements 20, the light incident on the upper surface and side surface of the driving transistor 10 on the light path of the light-emitting element 20 may be effectively reflected back through the reflection effect of the upper surface and the side surface of the shielding adhesive 30, which may further improve the light-emitting uniformity of the light-emitting panel.

It should be understood that in one embodiment, one driving transistor 10 may correspond to a portion of the structure of the shielding adhesive 30. In another embodiment, when the driving transistors 10 are arranged in a row or a column, as shown in FIG. 62, the shielding adhesive 30 may also form a grid-like structure, such that the shielding adhesive 30 may form an integral structure on the light-emitting panel 000, which may facilitate to improve the process efficiency.

Figure 65:
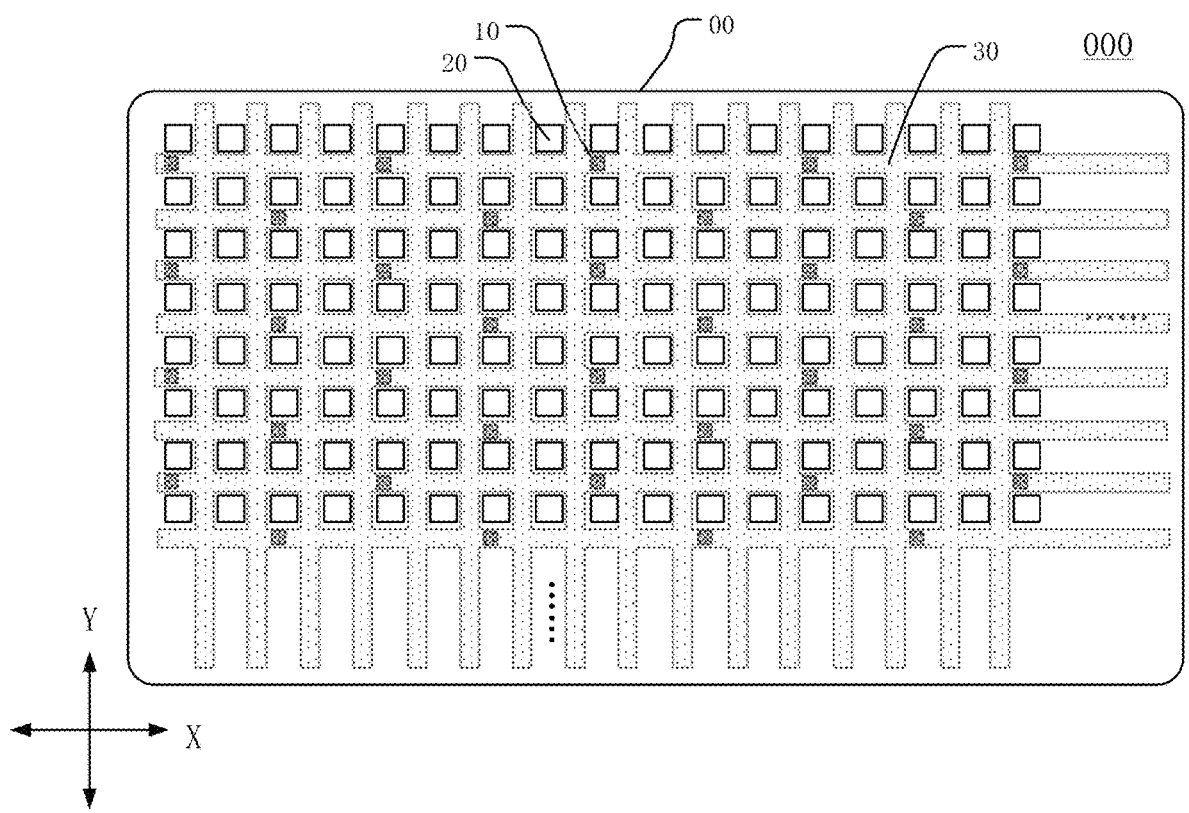
FIG. 65 illustrates a schematic plane view of another exemplary light-emitting panel consistent with disclosed embodiments of the present disclosure.

FIG. 65 illustrates a schematic plane view of another light-emitting panel consistent with disclosed embodiments of the present disclosure. It should be understood that to clearly illustrate the structure of the present disclosure, FIG. 65 may perform transparency filling. In one embodiment, referring to FIG. 65, the shielding adhesive 30 may be disposed between the adjacent two light-emitting element rows 20H and the adjacent two light-emitting element columns 20L in the light-emitting panel 000. In other words, the shielding adhesive 30 may form a grid-like structure on the light-emitting panel 000. The shielding adhesive 30 may cover the driving transistor 10 at the position where the driving transistor 10 is located, and at the same time, the shielding adhesive 30 may be used as a reflective strip between adjacent two light-emitting elements 20 to effectively reduce the light crosstalk between the adjacent light-emitting elements 20, which may facilitate to further improve the light-emitting quality.

Figure 66:
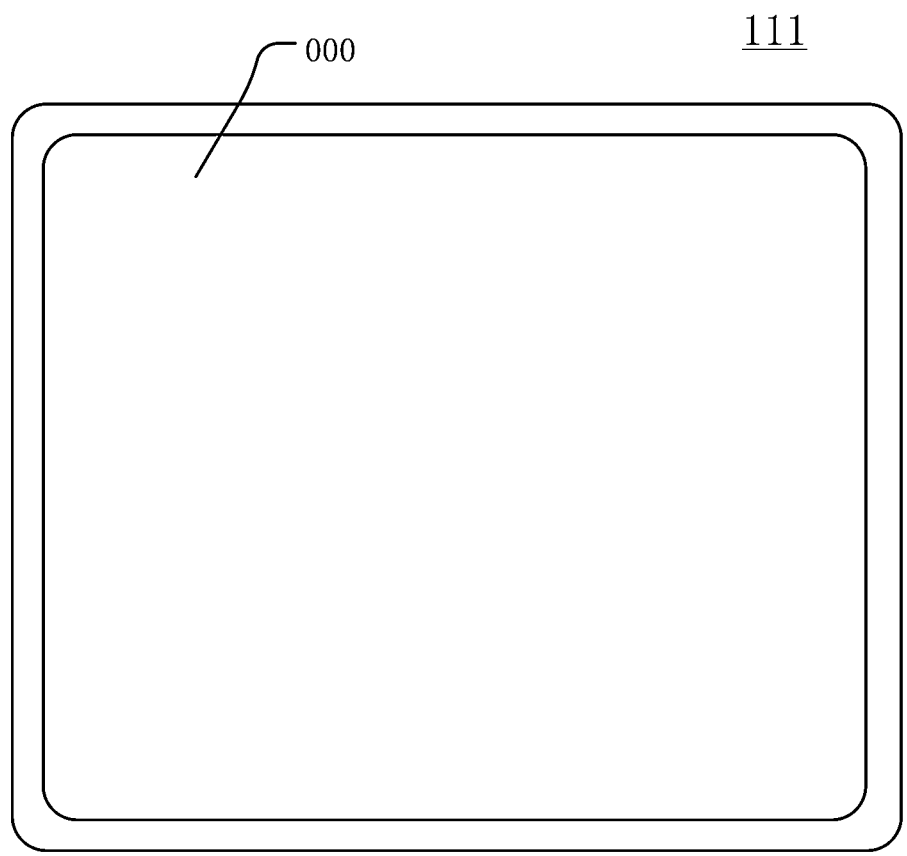
FIG. 66 illustrates a schematic diagram of an exemplary display device consistent with disclosed embodiments of the present disclosure.

FIG. 66 illustrates a schematic diagram of a display device consistent with disclosed embodiments of the present disclosure. In one embodiment, referring to FIG. 66, a display device 111 may include the light-emitting panel 000 in any one of the above-disclosed embodiments. In one embodiment, the display device 111 may be the light-emitting panel 000 in any one of the above-disclosed embodiments, and may directly perform display. In another embodiment, the display device 111 may be a liquid crystal display device. In view of this, the light-emitting panel 000 may be used as a direct-type backlight. The type of the display device 111 may not be limited by the present disclosure, and may be set according to practical applications.

In one embodiment, FIG. 66 may merely use a mobile phone as an example to describe the display device 111. The display device 111 in the present disclosure may be a computer, a TV, a vehicle-mounted display device, and any other display device 111 with a display function, which may not be specifically limited by the present disclosure. The display device 111 may have the beneficial effects of the light-emitting panel 000 in any one of the disclosed embodiments, and the details may refer to the descriptions of the light-emitting panel 000 in the above-disclosed embodiments, which may not be repeated herein.

The present disclosure provides the light-emitting panel and the display device, which may have the following beneficial effects. In the light-emitting panel of the present disclosure, the quantity of driving transistors adjacent to one light-emitting element in the direction parallel to the plane of the base substrate may be less than two, and the driving transistors may be scattered on the base substrate of the light-emitting panel. By improving the relative position of the driving transistor and the light-emitting element, the driving transistors may be prevented from being clustered in a local region. While avoiding the existence of multiple driving transistors around one light-emitting element to block light, the driving transistor on the base substrate may absorb light substantially uniformly, which may reduce the influence of the driving transistor on the light path of the light-emitting element. Further, the quantity of driving transistors around the light-emitting element in a certain region may be prevented from being substantially large, and the phenomenon of serious light absorption in the certain region when the panel is lit may be prevented, which may prevent the lamp shadow problem caused by the low brightness in a local region of the light-emitting panel, and may facilitate to improve the light-emitting uniformity of the light-emitting panel and to improve the light-emitting quality.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A light-emitting panel, comprising:
   a base substrate;
   a plurality of driving transistors and a plurality of light-emitting elements disposed over the base substrate, wherein:
   one driving transistor of the plurality of driving transistors is electrically connected to at least one light-emitting element of the plurality of light-emitting elements,
   the plurality of light-emitting elements are arranged in an array over the base substrate,
   the plurality of light-emitting elements are arranged to form one or more light-emitting element rows along a first direction and to form one or more light-emitting element columns along a second direction, wherein in a direction parallel to a plane of the base substrate, the first direction intersects the second direction, and
   in the direction parallel to the plane of the base substrate, a quantity of driving transistors adjacent to one light-emitting element is A, wherein A<2 and A is an integer; and
   a shielding adhesive over the base substrate, and in a direction perpendicular to the plane of the base substrate, the shielding adhesive overlaps a driving transistor of the plurality of driving transistors, wherein:
   the shielding adhesive is disposed between adjacent two light-emitting element rows and/or adjacent two light-emitting element columns, to form a line-like structure on the light-emitting panel.

2. The light-emitting panel according to claim 1, wherein:
   in the direction parallel to the plane of the base substrate, a driving transistor of the plurality of driving transistors is located between adjacent two light-emitting elements of the plurality of light-emitting elements.

3. The light-emitting panel according to claim 2, wherein:
   in the direction parallel to the plane of the base substrate, the driving transistor is located between adjacent two light-emitting elements in a light-emitting element row of the one or more light-emitting element rows, or the driving transistor is located between adjacent two light-emitting elements in a light-emitting element column of the one or more light-emitting element columns.

4. The light-emitting panel according to claim 2, wherein:
   along a third direction, the driving transistor is located between adjacent two light-emitting elements, wherein in the direction parallel to the plane of the base substrate, an angle between the third direction and the first direction is an acute angle, and an angle between the third direction and the second direction is an acute angle.

5. The light-emitting panel according to claim 1, wherein:
   the light-emitting panel includes at least one partition, wherein:
   in one partition of the at least one partition, one or more light-emitting elements are arranged along a fourth direction to form a first sub-partition, and one or more light-emitting elements are arranged along a fifth direction to form a second sub-partition, wherein:

the fourth direction is same as the first direction, and
the fifth direction is same as the second direction, or
the fourth direction is same as the second direction, and
the fifth direction is same as the first direction, and
in the one partition, a quantity of light-emitting elements is greater than or equal to 3B, and a quantity of driving transistors is two, wherein 1≤B≤4.

6. The light-emitting panel according to claim 5, wherein:
the one partition includes a first partition, and the first partition includes three light-emitting elements and two driving transistors, wherein:
the three light-emitting elements are arranged along the fourth direction to form the first sub-partition, and along the fifth direction, one light-emitting element forms the second sub-partition,
along the fifth direction, the two driving transistors are located in a same one first sub-partition, and
along the fourth direction, the two driving transistors are located in two non-adjacent second sub-partitions, respectively.

7. The light-emitting panel according to claim 5, wherein:
the one partition includes a second partition, and the second partition includes six light-emitting elements and two driving transistors, wherein:
three light-emitting elements are arranged along the fourth direction to form the first sub-partition, and two light-emitting elements are arranged along the fifth direction to form the second sub-partition,
along the fifth direction, the two driving transistors are located in two adjacent first sub-partitions, respectively, and
along the fourth direction, the two driving transistors are located in two non-adjacent second sub-partitions, respectively.

8. The light-emitting panel according to claim 5, wherein:
the one partition includes a third partition, and the third partition includes nine light-emitting elements and two driving transistors, wherein:
three light-emitting elements are arranged along the fourth direction to form the first sub-partition, and three light-emitting elements are arranged along the fifth direction to form the second sub-partition,
along the fifth direction, the two driving transistors are located in two non-adjacent first sub-partitions, respectively, and
along the fourth direction, the two driving transistors are located in two non-adjacent second sub-partitions, respectively.

9. The light-emitting panel according to claim 5, wherein:
the one partition includes a fourth partition, and the fourth partition includes twelve light-emitting elements and two driving transistors, wherein:
three light-emitting elements are arranged along the fourth direction to form the first sub-partition, and four light-emitting elements are arranged along the fifth direction to form the second sub-partition,
along the fifth direction, the two driving transistors are spaced apart by two first sub-partitions, and
along the fourth direction, the two driving transistors are located in two non-adjacent second sub-partitions, respectively.

10. The light-emitting panel according to claim 1, wherein:
the light-emitting panel includes a plurality of repeating units, and a repeating unit of the plurality of repeating units includes multiple light-emitting elements arranged in an array, and multiple driving transistors,
wherein in the repeating unit, a ratio of a quantity of light-emitting elements over a quantity of driving transistors is greater than or equal to 4:1.

11. The light-emitting panel according to claim 10, wherein:
in the repeating unit, the ratio of the quantity of light-emitting elements over the quantity of driving transistors is equal to 8:1.

12. The light-emitting panel according to claim 11, wherein:
in at least one repeating unit of the plurality of repeating units, a quantity of driving transistors corresponding to one light-emitting element row and/or one light-emitting element column is less than or equal to 1.

13. The light-emitting panel according to claim 12, wherein:
in the repeating unit, a quantity of light-emitting elements included in a light-emitting element row of the one or more light-emitting element rows is M1, and a quantity of light-emitting elements included in a light-emitting element column of the one or more light-emitting element columns is N1, wherein M1≥4 and N1>2.

14. The light-emitting panel according to claim 13, wherein:
M1=N1=8, and
the quantity of driving transistors corresponding to one light-emitting element row and/or one light-emitting element column is less than or equal to 1.

15. The light-emitting panel according to claim 11, wherein:
in at least one repeating unit of the plurality of repeating units, a quantity of driving transistors corresponding to one light-emitting element row and/or one light-emitting element column is less than or equal to 2.

16. The light-emitting panel according to claim 15, wherein:
in the repeating unit, a quantity of light-emitting elements included in the light-emitting element row of the one or more light-emitting element rows is M2, and a quantity of light-emitting elements included in the light-emitting element column of the one or more light-emitting element columns is N2, wherein M2>N2, M2≥8 and N2<8.

17. The light-emitting panel according to claim 10, wherein:
in the repeating unit, the ratio of the quantity of light-emitting elements over the quantity of driving transistors is equal to 4:1, and
the light-emitting panel includes a fifth partition and a sixth partition, wherein:
the fifth partition includes at least one light-emitting element row, and the sixth partition includes at least one light-emitting element row,
the fifth partition and the sixth partition are arranged in sequence along the second direction,
in the fifth partition, a driving transistor of the plurality of driving transistors is located in an odd-numbered light-emitting element column, and
in the sixth partition, the driving transistor is located in an even-numbered light-emitting element column.

18. The light-emitting panel according to claim 17, wherein:
in the repeating unit, a quantity of light-emitting elements included in the light-emitting element row of the one or more light-emitting element rows is M3, and a quantity of light-emitting elements included in the light-emitting element column of the one or more light-emitting element columns is N3, wherein M3=2 and N3=4,
a quantity of driving transistors corresponding to the odd-numbered light-emitting element row is equal to one, and a quantity of driving transistors corresponding to the even-numbered light-emitting element row is equal to zero, and
a quantity of driving transistors corresponding to one light-emitting element column is equal to one.

19. The light-emitting panel according to claim 17, wherein:
the light-emitting panel includes a seventh partition and an eighth partition, wherein:
the seventh partition includes at least one light-emitting element row, and the eighth partition includes at least one light-emitting element row,
the seventh partition and the eighth partition are arranged in sequence along the second direction, and
in the seventh partition and the eighth partition, each driving transistor is located in an odd-numbered light-emitting element column, and is not located in an even-numbered light-emitting element column, or
in the seventh partition and the eighth partition, each driving transistor is located in the even-numbered light-emitting element column, and is not located in the odd-numbered light-emitting element column.

20. The light-emitting panel according to claim 19, wherein:
in the repeating unit, a quantity of light-emitting elements included in the light-emitting element row of the one or more light-emitting element rows is M4, and a quantity of light-emitting elements included in the light-emitting element column of the one or more light-emitting element columns is N4, wherein M4=2 and N4=2,
a quantity of driving transistors corresponding to one light-emitting element row is equal to one, and a quantity of driving transistors corresponding to another one light-emitting element row is equal to zero, and
a quantity of driving transistors corresponding to one light-emitting element column is equal to one, and a quantity of driving transistors corresponding to another one light-emitting element column is equal to zero.

21. The light-emitting panel according to claim 19, wherein:
in the repeating unit, a quantity of light-emitting elements included in the light-emitting element row of the one or more light-emitting element rows is M5, and a quantity of light-emitting elements included in the light-emitting element column of the one or more light-emitting element columns is N5, wherein M5=4 and N5=2,
a quantity of driving transistors corresponding to the odd-numbered light-emitting element column is equal to one, and a quantity of driving transistors corresponding to the even-numbered light-emitting element column is equal to zero, and
a quantity of driving transistors corresponding to one light-emitting element row is equal to one.

22. The light-emitting panel according to claim 10, wherein:
the plurality of repeating units are arranged to form one or more repeating unit rows along the first direction, and to form one or more repeating unit columns along the second direction, and
in a repeating unit row of the one or more repeating unit rows and/or a repeating unit column of the one or more repeating unit columns, the driving transistors in at least two repeating units of the plurality of repeating units have different arrangement structures.

23. The light-emitting panel according to claim 1, wherein:
in the direction parallel to the plane of the base substrate, a distance between a driving transistor of the plurality of driving transistors and an adjacent light-emitting element of the plurality of light-emitting elements is greater than or equal to 1 mm.

24. The light-emitting panel according to claim 1, wherein:
in the direction parallel to the plane of the base substrate, a distance between adjacent two driving transistors of the plurality of driving transistors is D1, and a distance between adjacent two light-emitting elements of the plurality of light-emitting elements is D2, wherein D1≥2D2.

25. The light-emitting panel according to claim 1, wherein:
the light-emitting element includes one of micro light-emitting diode and sub-millimeter light-emitting diode.

26. A display device, comprising:
a light-emitting panel, the light-emitting panel including:
a base substrate;
a plurality of driving transistors and a plurality of light-emitting elements disposed over the base substrate, wherein:
one driving transistor of the plurality of driving transistors is electrically connected to at least one light-emitting element of the plurality of light-emitting elements,
the plurality of light-emitting elements are arranged in an array over the base substrate,
the plurality of light-emitting elements are arranged to form one or more light-emitting element rows along a first direction and to form one or more light-emitting element columns along a second direction, wherein in a direction parallel to a plane of the base substrate, the first direction intersects the second direction, and
in the direction parallel to the plane of the base substrate, a quantity of driving transistors adjacent to one light-emitting element is A, wherein A<2 and A is an integer; and
a shielding adhesive over the base substrate, and in a direction perpendicular to the plane of the base substrate, the shielding adhesive overlaps a driving transistor of the plurality of driving transistors, wherein:
the shielding adhesive is disposed between adjacent two light-emitting element rows and/or adjacent two light-emitting element columns, to form a line-like structure on the light-emitting panel.

* * * * *